(12) United States Patent
Kubota et al.

(10) Patent No.: US 7,460,099 B2
(45) Date of Patent: *Dec. 2, 2008

(54) LATCH CIRCUIT, SHIFT REGISTER CIRCUIT, LOGICAL CIRCUIT AND IMAGE DISPLAY DEVICE OPERATED WITH A LOW CONSUMPTION OF POWER

(75) Inventors: Yasushi Kubota, Sakurai (JP); Hajime Washio, Tenri (JP); Ichiro Shiraki, Tenri (JP); Kazuhiro Maeda, Tenri (JP); Yasuyoshi Kaise, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 319 days.

This patent is subject to a terminal disclaimer.

(21) Appl. No.: 10/949,990

(22) Filed: Sep. 23, 2004

(65) Prior Publication Data

US 2005/0057556 A1   Mar. 17, 2005

Related U.S. Application Data

(60) Division of application No. 09/506,033, filed on Feb. 16, 2000, now Pat. No. 7,196,699, which is a continuation-in-part of application No. 09/300,178, filed on Apr. 27, 1999, now Pat. No. 6,580,411.

(30) Foreign Application Priority Data

Apr. 28, 1998  (JP)  ............................ 10-117955
Dec. 22, 1998  (JP)  ............................ 10-364774
Feb. 16, 1999  (JP)  ............................ 11-36778
Apr. 13, 1999  (JP)  ............................ 11-105236
May 11, 1999  (JP)  ............................ 11-129533

(51) Int. Cl.
*G09G 3/36*  (2006.01)
*G09G 5/00*  (2006.01)

(52) U.S. Cl. ........................... 345/98; 345/99; 345/100; 345/211

(58) Field of Classification Search .................. 345/90, 345/92, 96, 98–100, 208, 209, 211–213, 345/104; 326/63, 93, 112, 119, 121; 327/72, 327/77

See application file for complete search history.

(56) References Cited

U.S. PATENT DOCUMENTS 5,276,648 A   1/1994  Yanagisawa et al.

(Continued)

FOREIGN PATENT DOCUMENTS

JP   60-213992   10/1985

(Continued)

*Primary Examiner*—Henry N Tran
(74) *Attorney, Agent, or Firm*—David G. Conlin; Steven M. Jensen; Edwards Angell Palmer & Dodge LLP

(57) ABSTRACT

A CMOS logical circuit comprises two electric current paths each of which has circuits consisting of n-type and p-type transistors. In a circuit consisting of n-type or p-type transistors, one electric current path is provided with a circuit having the same construction as that of a circuit having an n-type transistor of a CMOS logical circuit outputting a logical operation result similar to that of this logical circuit, and the other electric current path is provided with a circuit having the same construction as that of a circuit having a p-type transistor of the CMOS logical circuit outputting a logical operation result similar to that of this logical circuit. In another circuit consisting of the other channel type, a gate electrode of the transistor provided on the one electric current path and that of the transistor provided on the other electric current path are connected to drain electrodes of the counterparts. According to the construction, the amplitude of an input signal can be made smaller than a supply voltage of the logical circuit.

16 Claims, 77 Drawing Sheets

U.S. PATENT DOCUMENTS

| | | |
|---|---|---|
| 5,589,847 A | 12/1996 | Lewis |
| 5,646,642 A | 7/1997 | Maekawa et al. |
| 5,894,296 A | 4/1999 | Maekawa |
| 5,949,397 A | 9/1999 | Koyama et al. |
| 5,990,857 A | 11/1999 | Kubota et al. |
| 5,995,073 A | 11/1999 | Isami et al. |
| 6,054,976 A | 4/2000 | Kubota et al. |
| 6,081,131 A | 6/2000 | Ishii |
| 6,087,276 A | 7/2000 | Yeh et al. |
| 6,166,725 A | 12/2000 | Isami et al. |
| 6,302,504 B1 | 10/2001 | Imanaka et al. |
| 6,335,778 B1 | 1/2002 | Kubota et al. |
| 6,437,768 B1 | 8/2002 | Kubota et al. |
| 6,580,411 B1 | 6/2003 | Kubota et al. |

FOREIGN PATENT DOCUMENTS

| | | |
|---|---|---|
| JP | 03147598 | 6/1991 |
| JP | 4048820 | 2/1992 |
| JP | 5-189990 | 7/1993 |
| JP | 06164365 | 6/1994 |
| JP | 06216753 | 8/1994 |
| JP | 6-318055 | 11/1994 |
| JP | 9-270701 | 10/1997 |
| JP | 10-90650 | 4/1998 |
| JP | 10-163843 | 6/1998 |
| JP | 11-103240 | 4/1999 |

Fig.23
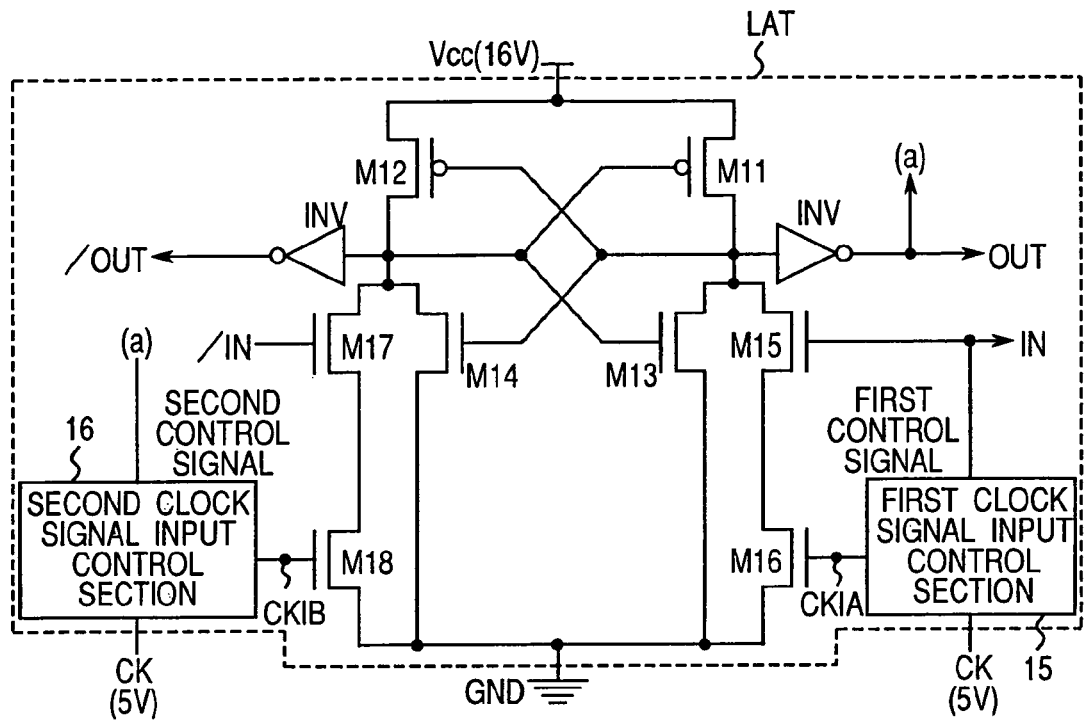
Fig.24A
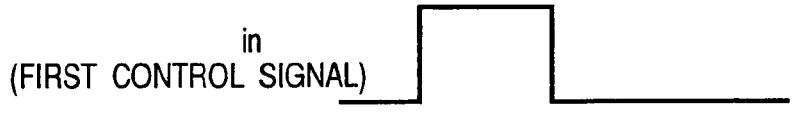
Fig.24B (FIRST CONTROL SIGNAL)
Fig.24C /in
Fig.24D ckia
Fig.24E ckib
Fig.24F (SECOND CONTROL SIGNAL)
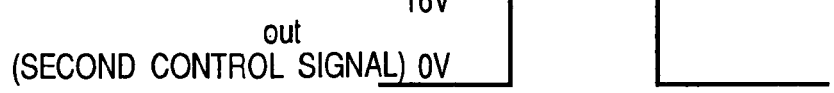
Fig.24G /out

Fig.29A  cks 
Fig.29B  /cks 
Fig.29C  n1 
Fig.29D  /n1 
Fig.29E  n2 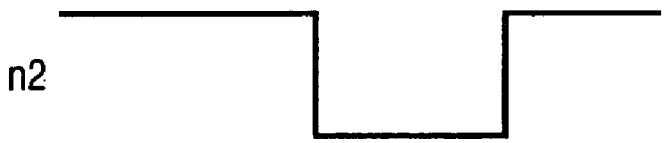
Fig.29F  /n2 
Fig.29G  n3 
Fig.29H  /n3 
Fig.29I  s1 
Fig.29J  s2 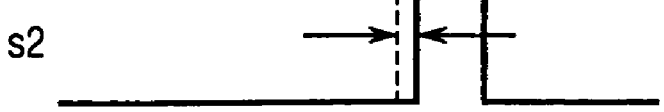

*Fig.32A* ckg 
*Fig.32B* /ckg 
*Fig.32C* n1 
*Fig.32D* /n1 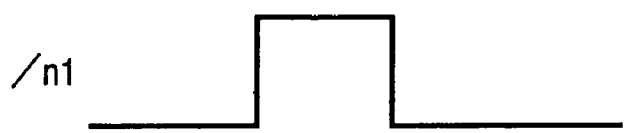
*Fig.32E* n2 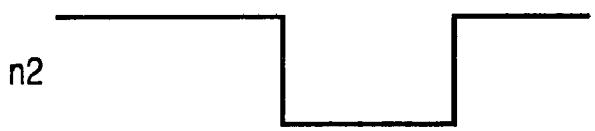
*Fig.32F* /n2 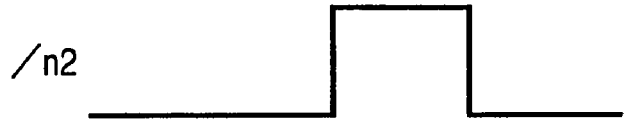
*Fig.32G* n3 
*Fig.32H* /n3 
*Fig.32I* gl1 
*Fig.32J* gl2 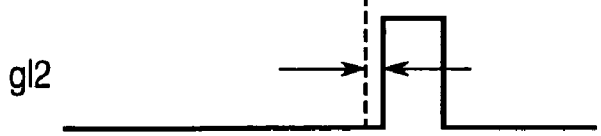

Fig.40A  cks 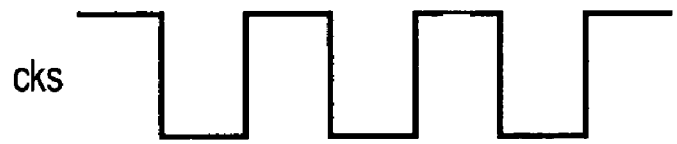
Fig.40B  /cks 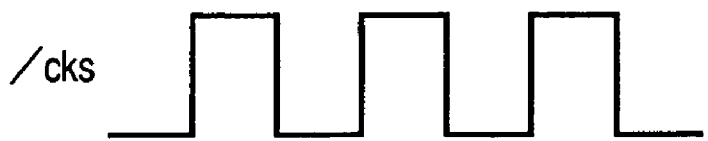
Fig.40C  n1 
Fig.40D  n2 
Fig.40E  n3 
Fig.40F  s1 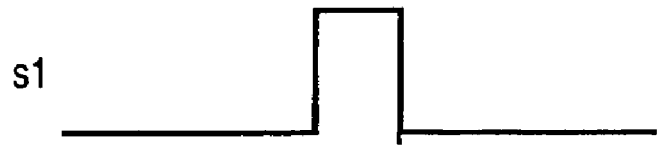
Fig.40G  s2 

Fig.42A ckg 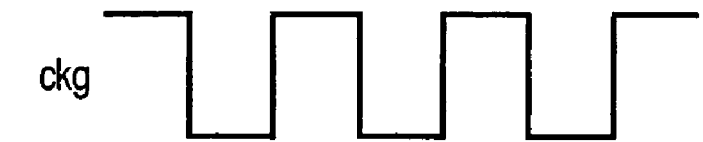
Fig.42B /ckg 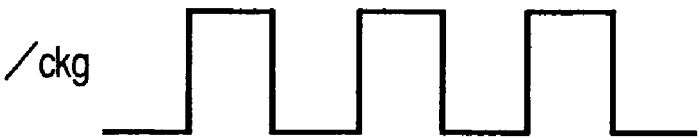
Fig.42C n1 
Fig.42D n2 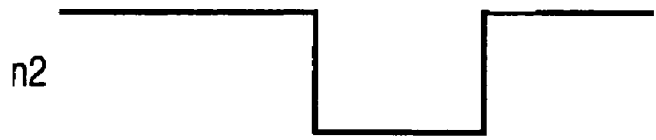
Fig.42E n3 
Fig.42F gps 
Fig.42G gl1 
Fig.42H gl2 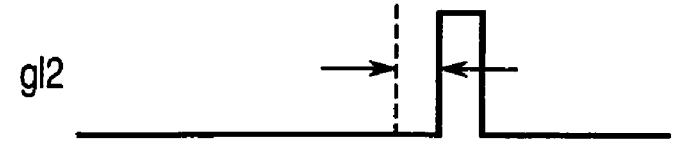

LATCH CIRCUIT, SHIFT REGISTER CIRCUIT, LOGICAL CIRCUIT AND IMAGE DISPLAY DEVICE OPERATED WITH A LOW CONSUMPTION OF POWER

CROSS-REFERENCE TO RELATED APPLICATION(S)

This application is a divisional of copending application U.S. Ser. No. 09/506,033, filed on Feb. 16, 2000, now U.S. Pat. No. 7,196,699, which is a continuation-in-part of copending application U.S. Ser. No. 09/300,178, filed on Apr. 27, 1999, now U.S. Pat. No. 6,580,411.

BACKGROUND OF THE INVENTION

The present invention relates to a latch circuit for transmitting a pulse signal, a shift register circuit having this latch circuit and an image display device employing this shift register circuit, as well as a logical circuit for performing a logical operation of an input signal capable of performing a normal logical operation of an input signal having a smaller amplitude than a supply voltage of the logical circuit.

Herein is provided a description for a conventional liquid crystal display device and a shift register circuit that constitutes the data signal line drive circuit and scanning signal line drive circuit of the device, which are taken as examples of an image display device and a shift register circuit having the conventional latch circuit. It is to be noted that the shift register and the image display device of the present invention are limited neither to the above liquid crystal display device nor to the shift register for the liquid crystal display device and is able to be applied to an image display device and a shift register for the image display device of another type.

Conventionally, as the above liquid crystal display device, there has been known a liquid crystal display device of an active matrix driving system. As shown in FIG. 37, this liquid crystal display device is constructed of a pixel array ARY, a scanning signal line drive circuit GD and a data signal line drive circuit SD. In the above pixel array ARY, pixels PIX are arranged in the vicinity of intersections of a number of scanning signal lines GL and a number of data signal lines SL that intersect each other and connected to the adjacent scanning signal line GL and data signal line SL so as to be arranged in a matrix form.

The data signal line drive circuit SD samples an input video signal dat in synchronization with a timing signal such as a clock signal cks and writes the resulting data into the data signal lines SL while amplifying the signal as the occasion demands. The scanning signal line drive circuit GD successively selects the scanning signal lines GL in synchronization with a timing signal such as a clock signal ckg, writes the video signal (data) dat written in the data signal lines SL into the corresponding pixels PIX by controlling the opening and closing of switching elements existing in the pixels PIX and holds the data written in the pixels PIX.

As shown in FIG. 38, each pixel PIX is constructed of a field-effect transistor SW that serves as the aforementioned switching element and a pixel capacity comprised of a liquid crystal capacity CL and an auxiliary capacity (added as the occasion demands) CS. Then, the data signal line SL and one electrode of the pixel capacity are connected to each other via the drain and source of the transistor SW, while the gate of the transistor SW is connected to the scanning signal line GL. Further, the other electrode of the pixel capacity is connected to a common electrode (not shown) common to all the pixels. In the above construction, the transmittance or reflectance of the liquid crystals is modulated by a voltage applied to the liquid crystal capacity CL, thereby driving the pixel for display.

A method for writing the aforementioned video signal dat into the data signal lines SL will be described next. As a system for driving the data signal lines SL, there are existing a dot sequence driving system and a line sequence driving system, and reference is herein made to the dot sequence driving system. FIG. 39 shows a detailed circuit diagram of the data signal line drive circuit SD. The video signal dat inputted to a video signal line DAT is written into the data signal line SL by opening and closing a sampling circuit AS by means of an output pulse of each stage of a shift register circuit 1 synchronized with this video signal dat.

Describing the above more concretely, a signal of a sequence of output signals n of adjacent latch circuits SR constituting the shift register circuit 1 is amplified by a buffer circuit constructed of a plurality of inverter circuits, and an inversion signal is generated as the occasion demands to output a sampling signal s and its inverted signal /s to the sampling circuit (analog switch) AS. Then, the sampling circuit AS executes switching based on the sampling signals s and /s to supply the video data from the video signal line DAT to the data signal line SL. The clock signals cks and /cks to the latch circuits SR, output signals n1 through n3 of the latch circuits SR and sampling signals s1 and s2 in the above case are shown in FIGS. 40A through 40G.

FIG. 41 shows a detailed circuit construction of the scanning signal line drive circuit GD. In this scanning signal line drive circuit GD, the signal of the sequence of the output signals n of adjacent latch circuits SR that constitutes a shift register circuit 2 is obtained by NAND circuits, and by further taking an overlap with an external pulse width control signal gps, the desired pulse width is obtained. The clock signals ckg and /ckg to the latch circuits SR, the output signals n1 through n3 of the latch circuits SR, the pulse width control signal gps and scanning signals gl1 and gl2 to the scanning signal lines GL in the above case are shown in FIGS. 42A through 42H.

In this case, each latch circuit SR that constitutes the shift register circuits 1 and 2 in the data signal line drive circuit SD and the scanning signal line drive circuit GD has a construction as shown in FIG. 43. It is to be noted that FIG. 43 is an example of the latch circuit SR for constituting the shift register circuits 1 and 2 that can execute scanning only in one direction. In this case, a concrete construction example of a clocked inverter circuit 3 employed in the latch circuit SR is shown in FIG. 44. By contrast, when constituting a shift register circuit that can execute bidirectional scanning, a latch circuit SR as shown in FIG. 45 is employed. Either of these latch circuits SR is a half latch circuit, which latches the input signal with either one of the leading edge or the trailing edge of the clocks ck and /ck, outputs the output signal n of a pulse width of one cycle of the clocks ck and /ck.

In order to achieve the compacting, higher resolution, reduction in mounting cost and so on of liquid crystal display devices, a technique for integrally forming the pixel array ARY and the signal line drive circuits SD and GD, which manage the display, on an identical substrate is attracting a great deal of attention. In such a drive circuit integrated type liquid crystal display device, a transparent substrate must be employed as a substrate when constituting a transmission type liquid crystal display devices that are currently widely used. In the above case, it is often the case where a polysilicon thin-film transistor that can be formed on a quartz substrate or a glass substrate as an active element such as a transistor constituting the transistor SW of the pixel PIX or the clocked inverter circuit 3.

However, the aforementioned conventional liquid crystal display device has the problems as follows. That is, as shown in FIG. 39, the data signal line drive circuit SD obtains the sampling signals s and /s on the basis of the signal of the sequence of the output signals n of adjacent two latch circuits SR. Therefore, as shown in FIGS. 40A through 40G, the trailing edge of the sampling signal s1 corresponding to the adjacent data signal line SL1 and the leading edge of the sampling signal s2 corresponding to the adjacent data signal line SL2 roughly coincide with each other.

Therefore, if the waveforms of the sampling signals s and /s become dull or a slight deviation occurs in terms of timing between output signals n from adjacent two latch circuits SR as a consequence of a characteristic change of the transistors that constitutes, for example, the data signal line drive circuit SD, then there is the possibility of the occurrence of overlap between the sampling signals s1 and s2 corresponding to the adjacent data signal lines SL1 and SL2. In such a case, a noise is imposed on the data signal line SL, leading to a concern about the occurrence of troubles such as blur, ghost and crosstalk of the display image.

In the aforementioned conventional liquid crystal display device, the clock signals cks and ckg and start signals sps and spg and so on inputted to the shift register circuits 1 and 2 are externally directly inputted as signals of the same-amplitudes as those of the power voltages of the drive circuits SD and GD, as exemplified by the clock signals cks and ckg shown in FIGS. 40A through 40G and FIGS. 42A through 42H. By contrast, in the drive circuit integrated type liquid crystal display device employing the polysilicon thin-film transistors, the transistor characteristics are inferior to those of the monocrystal silicon transistor, and in particular, the threshold voltage has a high absolute value of 1 V to 6 V. Therefore, the drive power voltage cannot help being increased up to 15 to 20 V. Therefore, in the case of the drive circuit integrated type liquid crystal display device, the clock signals cks and ckg and the start signals sps and spg and so on, which are externally directly inputted, are required to have an increased amplitude.

However, if the clock signals cks and ckg have an increased amplitude, then there occurs the problem that the consumption of power increases in the external circuits such as a control circuit (not shown) for generating the clock signal and the like. Furthermore, unwanted emission from the signal lines becomes a serious problem.

In order to solve the problem due to the increase in amplitude of the clock signals cks and ckg and so on as described above, it is proposed to mount a level shifter circuit (signal boost circuit) on the signal line drive circuits SD and GD side of the liquid crystal display device, thereby reducing the voltages of the input/output interfaces.

FIG. 46 shows the data signal line drive circuit SD mounted with the above level shifter circuit. In the data signal line drive circuit SD shown in FIG. 46, a level shifter circuit LS is arranged immediately before the shift register circuit 5. Then, the inputted clock signal cks and start signal sps are supplied to the shift register circuit 5 with their amplitude (5 V) boosted to 15 V. Thus, the operating voltage of 15 V is obtained with the input voltage of 5 V. However, when the polysilicon thin-film transistor is employed in this construction, the duty ratio of the boosted signal largely varies to cause a variation in terms of timing and amplitude of the output pulse n of the data signal line drive circuit SD due to its characteristic variation, and this may incur a reduction in image quality as a consequence of the superimposition of noises on the data signal line SL. Furthermore, since the driving capability of the level shifter circuit LS itself is low, there is necessitated a buffer for driving the subsequent signal lines, also causing the problem that the consumption of power increases.

FIG. 47 shows the scanning signal line drive circuit GD mounted with the aforementioned level shifter circuit. In the scanning signal line drive circuit GD shown in FIG. 47, the level shifter circuit LS is arranged immediately before the shift register circuit 6 and on a pulse width control signal line GPS. Then, the inputted clock signal ckg, start signal spg and pulse width control signal gps are supplied to the shift register circuit 6 or a NOR circuit with their amplitude (5 V) boosted to 15 V. Also in this case, there are the concern about a reduction in image quality and the problem of an increase in consumption of power, similar to the case of the data signal line drive circuit SD mounted with the level shifter circuit LS.

FIG. 48 and FIG. 49 are concrete circuit diagrams of the aforementioned level shifter circuit LS. In the figures, the reference numerals M1 and M2 denote p-type transistors, while the reference numerals M3 through M6 denote n-type transistors. FIG. 50 shows the waveforms of input signals in and /in and output signals out and /out of the level shifter circuit LS shown in FIG. 48 or FIG. 49.

As a method for removing the concern about the reduction in image quality and the problem of the increase in consumption of power, there is a method for providing each of the shift register circuits that constitute the signal line drive circuits SD and GD with a boosting function. According to this method, by virtue of the provision of the boosting function in the latch circuit of each stage that constitutes the shift register circuit, there is no need for a signal line driving use buffer for driving the signal lines between individual latch circuits. Furthermore, since the outputs of the individual latch circuits are directly boosted instead of boosting the control signals such as the clock signal and the start signal which are inputted to the latch circuits, there can be obtained output pulse signals such as the sampling signals s and /s that are stable with respect to the characteristic variation of the transistors.

Note that, in the aforementioned level shifter circuit LS, the transistors into which the clock signals in and /in are inputted are required to have a high driving power because of the structures shown in FIG. 48 and FIG. 49. This causes another problem that the transistors have an increased gate area and the consequent increase in load and consumption of power of the clock signal line.

SUMMARY OF THE INVENTION

Accordingly, the object of the present invention is to provide a shift register circuit of which the load of the clock signal line and the consumption of power are reduced to concurrently achieve a low-voltage interface and a low consumption of power with a boosting function incorporated in the latch circuit as well as an image display device that employs this shift register circuit and concurrently has a low consumption of power and a high display quality.

In order to achieve the aforementioned object, there is provided a latch circuit which receives a pulse signal and a clock signal as inputs and transmits the pulse signal in synchronization with the clock signal, the clock signal or the pulse signal having amplitude smaller than amplitude of the pulse signal outputted from the latch circuit.

According to the above construction, the amplitude of the clock signal can be reduced when there is a need for increasing the amplitude of the output of the latch circuit or the shift register circuit that employs a plurality of latch circuits or when the latch circuit or the shift register circuit does not correctly operate unless the drive voltage is increased to a certain degree or higher. Therefore, the load of the external circuit for generating the clock signal is reduced, thereby allowing the consumption of power to be reduced.

In an embodiment of the present invention, the latch circuit further comprises a first circuit having a voltage holding function and a second circuit having a level shifting function, the first and second circuits being constructed so as to own some common elements.

According to the above construction, there is a smaller number of elements and the circuit size is reduced, and this allows the reduction in consumption of power, the improvement of the operating frequency and the reduction in manufacturing cost.

In an embodiment of the present invention, the latch circuit is supplied with a power potential, and an element for controlling the voltage holding function or the level shifting function of the input signal is provided between the power potential and the second circuit.

According to the above construction, the circuit operation can be controlled by controlling the power supply to the second circuit by means of the above element, and this allows the remarkable simplification of the circuit construction for the control and the suppression of consumption of power in the circuit that is not operating.

In an embodiment of the present invention, the latch circuit comprises:

a first p-type transistor and a second p-type transistor, having source electrodes connected to the power potential and gate electrodes connected to drain electrodes of the counterparts;

a first n-type transistor having a source electrode connected to the drain electrode of the first p-type transistor, a drain electrode connected to a ground potential and a gate electrode connected to the drain electrode of the second p-type transistor;

a second n-type transistor having a source electrode connected to the drain electrode of the second p-type transistor, a drain electrode connected to the ground potential and a gate electrode connected to the drain electrode of the first p-type transistor;

a third n-type transistor having a source electrode connected to the drain electrode of the first p-type transistor and a gate electrode that receives the pulse signal as an input;

a fourth n-type transistor having a source electrode connected to the drain electrode of the third n-type transistor, a drain electrode connected to the ground potential and a gate electrode that receives the clock signal as an input;

a fifth n-type transistor having a source electrode connected to the drain electrode of the second p-type transistor and a gate electrode that receives an inverted signal of the pulse signal as an input; and a sixth n-type transistor having a source electrode connected to the drain electrode of the fifth n-type transistor, a drain electrode connected to the ground potential and a gate electrode that receives the clock signal as an input, whereby the pulse signal is outputted from the drain electrode of the second p-type transistor, and the inverted signal of the pulse signal is outputted from the drain electrode of the first p-type transistor.

According to the above construction, the latch circuit having the above structure also operates as a normal level shifter circuit that has a function for boosting and outputting the input signal when the clock signal is in the active state and operates as a hold circuit for holding the internal state when the clock signal is in the inactive state. Therefore, this latch circuit operates as a latch circuit having a level shifting function. Accordingly, if the shift register circuit is constructed by combining these circuits, then the amplitude of the clock signal can be made smaller than the amplitude of the pulse signal to be scanned, i.e., the power voltage of the shift register circuit.

Furthermore, the inverted signal of the clock signal is not inputted to this latch circuit, and therefore, the circuit scale is reduced. Furthermore, the load of the clock signal line is reduced to allow the load of the external circuit to be reduced.

Furthermore, also in this latch circuit, a current flows only when the output signal is inverted instead of the consistent flow of the current when the clock signal level changes, and this provides the merit that almost no increase in consumption of power occurs.

Furthermore, there are only eight transistors that constitute this latch circuit, and therefore, the level shifting function and the latch function can be concurrently achieved with the very small number of elements.

Furthermore, this latch circuit operates with a delay of one stage of the logic gate at any timing of operation, also with regard to the internal delay, and therefore, the circuit can be operated at very high speed.

In an embodiment of the present invention, the latch circuit comprises:

a first p-type transistor and a second p-type transistor, having source electrodes connected to the power potential and gate electrodes connected to drain electrodes of the counterparts;

a first n-type transistor having a source electrode connected to the drain electrode of the first p-type transistor and a gate electrode connected to the drain electrode of the second p-type transistor;

a seventh n-type transistor having a source electrode connected to the drain electrode of the first n-type transistor, a drain electrode connected to the ground potential and a gate electrode that receives an inverted signal of the clock signal as an input;

a second n-type transistor having a source electrode connected to the drain electrode of the second p-type transistor and a gate electrode connected to the drain electrode of the first p-type transistor;

an eighth n-type transistor having a source electrode connected to the drain electrode of the second n-type transistor, a drain electrode connected to the ground potential and a gate electrode that receives the inverted signal of the clock signal as an input;

a third n-type transistor having a source electrode connected to the drain electrode of the first p-type transistor and a gate electrode that receives the pulse signal as an input;

a fourth n-type transistor having a source electrode connected to the drain electrode of the third n-type transistor, a drain electrode connected to the ground potential and a gate electrode that receives the clock signal as an input;

a fifth n-type transistor having a source electrode connected to the drain electrode of the second p-type transistor and a gate electrode that receives an inverted signal of the pulse signal as an input; and a sixth n-type transistor having a source electrode connected to the drain electrode of the fifth n-type transistor, a drain electrode connected to the ground potential and a gate electrode that receives the clock signal as an input, whereby the pulse signal is outputted from the drain electrode of the second p-type transistor, and the inverted signal of the pulse signal is outputted from the drain electrode of the first p-type transistor.

According to the above construction, the latch circuit operates as a normal level shifter circuit that has a function for boosting and outputting the input signal when the clock signal is in the active state and operates as a hold circuit for holding the internal state when the clock signal is in the inactive state. Therefore, this latch circuit operates as a latch circuit having a level shifting function. Accordingly, if the shift register circuit is constructed by combining these circuits, then the amplitude of the clock signal can be made smaller than the amplitude of the pulse signal to be scanned, i.e., the power voltage of the shift register circuit.

Furthermore, the clock signal and its inverted signal are inputted to this latch circuit. The signal path of the hold circuit is completely interrupted when the latch circuit operates as a level shifter circuit, and the signal path of the level shifter circuit is completely interrupted when the latch circuit operates as a hold circuit. Therefore, a stable operation is ensured. That is, the operating margin increases to allow the circuit to be able to cope with a lowered voltage of the input signal and an increase in operating speed.

Furthermore, in this latch circuit, a current flows only when the output signal is inverted instead of the consistent flow of the current when the clock signal level changes, and this provides the merit that almost no increase in consumption of power occurs.

Furthermore, there are only ten transistors that constitute this latch circuit, and therefore, the level shifting function and the latch function can be concurrently achieved with the very small number of elements.

Furthermore, in this latch circuit, there is one current path and the circuit operates with a delay of one stage of the logic gate at any timing of operation, also with regard to the internal delay. Therefore, the circuit can be operated at very high speed.

In an embodiment of the present invention, the latch circuit comprises:

a first p-type transistor and a second p-type transistor, having source electrodes connected to the power potential and gate electrodes connected to drain electrodes of the counterparts;

a first n-type transistor having a source electrode connected to the drain electrode of the first p-type transistor and a gate electrode connected to the drain electrode of the second p-type transistor;

a second n-type transistor having a source electrode connected to the drain electrode of the second p-type transistor and a gate electrode connected to the drain electrode of the first p-type transistor;

a third n-type transistor having a source electrode connected to the drain electrode of the first p-type transistor and a gate electrode that receives the pulse signal as an input;

a fifth n-type transistor having a source electrode connected to the drain electrode of the second p-type transistor and a gate electrode that receives an inverted signal of the pulse signal as an input; and a ninth n-type transistor having a source electrode connected to the drain electrodes of the third and fifth n-type transistors, a drain electrode connected to the ground potential and a gate electrode that receives the clock signal as an input; and a tenth n-type transistor having a source electrode connected to the drain electrodes of the first and second n-type transistors, a drain electrode connected to the ground potential and a gate electrode that receives the inverted signal of the clock signal as an input, whereby the pulse signal is outputted from the drain electrode of the second p-type transistor, and the inverted signal of the pulse signal is outputted from the drain electrode of the first p-type transistor.

According to the above construction, in addition to the aforementioned effects, there are eight constituent transistors in the latch circuit, the number being smaller than in the construction of the aforementioned embodiment. Therefore, a shift register circuit having a very small circuit scale can be constructed.

Furthermore, numbers of inputs of the clock signal and its inverted signal are reduced by half, and this also provides the merit that the capacity of the clock signal line is reduced, thereby allowing the load of the external circuit to be reduced.

In an embodiment of the present invention, the latch circuit comprises:

a first p-type transistor and a second p-type transistor, having source electrodes connected to the power potential and gate electrodes connected to drain electrodes of the counterparts;

a first n-type transistor having a source electrode connected to the drain electrode of the first p-type transistor, a drain electrode connected to a ground potential and a gate electrode connected to the drain electrode of the second p-type transistor;

a second n-type transistor having a source electrode connected to the drain electrode of the second p-type transistor, a drain electrode connected to the ground potential and a gate electrode connected to the drain electrode of the first p-type transistor;

a third n-type transistor having a source electrode connected to the drain electrode of the first p-type transistor and a gate electrode that receives the pulse signal as an input;

a fifth n-type transistor having a source electrode connected to the drain electrode of the second p-type transistor and a gate electrode that receives an inverted signal of the pulse signal as an input; and a ninth n-type transistor having a source electrode connected to the drain electrodes of the third and fifth n-type transistors, a drain electrode connected to the ground potential and a gate electrode that receives the clock signal as an input, whereby the pulse signal is outputted from the drain electrode of the second p-type transistor, and the inverted signal of the pulse signal is outputted from the drain electrode of the first p-type transistor.

According to the latch circuit having the above structure, in addition to the aforementioned effects, there are seven constituent transistors, the number being smaller than in the construction of the above embodiment. Therefore, a shift register circuit having a very small circuit scale can be constructed.

Furthermore, numbers of inputs of the clock signal and its inverted signal are reduced by half, and this also provides the merit that the capacity of the clock signal line is reduced, thereby allowing the load of the external circuit to be reduced.

In an embodiment of the present invention, the latch circuit is comprised of first and second logical product and non-disjunction circuits, the logical product circuit section of the first logical product and non-disjunction circuit receiving the clock signal and the pulse signal as inputs, the non-disjunction circuit section of the first logical product and non-disjunction circuit receiving an output signal of the logical product circuit section and an output signal of the second logical product and non-disjunction circuit as inputs, the logical product circuit section of the second logical product and non-disjunction circuit receiving the clock signal and the inverted signal of the pulse signal as inputs, and the non-disjunction circuit section of the second logical product and non-disjunction circuit receiving an output signal of the logical product circuit section and an output signal of the first logical product and non-disjunction circuit.

In the above construction, the input signal is taken in only when the clock signal is in the active state, and the internal state is held when the clock signal is in the inactive state. Therefore, this latch circuit operates as a latch circuit having a level shifting function. If the shift register circuit is constructed by combining these circuits, the amplitude of the clock signal can be made smaller than the amplitude of the pulse signal to be scanned, i.e., the power voltage of the shift register circuit.

The logical product and non-disjunction circuit can be constructed as one logic gate, and this allows the reduction in circuit scale.

In an embodiment of the present invention, the logical product and non-disjunction circuit comprises:

a first p-type transistor and a second p-type transistor having source electrodes connected to the power potential and gate electrodes connected to the drain electrodes of the counterparts;

a first n-type transistor having a source electrode connected to the drain electrode of the first p-type transistor, a drain electrode connected to the ground potential and a gate electrode that receives the output signal of the other logical product and non-disjunction circuit as an input;

an eleventh n-type transistor having a source electrode connected to the drain electrode of the second p-type transistor and a gate electrode that receives the inverted signal of the clock signal;

a third n-type transistor having a source electrode connected to the drain electrode of the first p-type transistor and a gate electrode that receives the pulse signal as an input;

a fourth n-type transistor having a source electrode connected to the drain electrode of the third n-type transistor, a drain electrode connected to the ground potential and a gate electrode that receives the clock signal as an input;

a fifth n-type transistor having a source electrode connected to the drain electrode of the second p-type transistor and a gate electrode that receives the inverted signal of the pulse signal as an input; and a twelfth n-type transistor having a source electrode connected to the drain electrodes of the eleventh and fifth n-type transistors, a drain electrode connected to the ground potential and a gate electrode that receives the inverted signal of the output signal of the other logical product and non-disjunction circuit as an input, whereby the pulse signal is outputted from the drain electrode of the first p-type transistor, and the inverted signal of the pulse signal is outputted from the drain electrode of the second p-type transistor.

According to the above construction, such a logical product and non-disjunction circuit correctly operates even when the input signal is smaller than the power voltage in the case where the logical product and non-disjunction circuit is applied to a logic circuit (logical product and non-disjunction circuit) having, for example, a shift register function. Therefore, if the shift register circuit is constructed by combining these circuits, the amplitude of the clock signal can be made smaller than the amplitude of the pulse signal to be scanned, i.e., the power voltage of the shift register circuit.

Furthermore, in this logical product and non-disjunction circuit, a current flows only when the output signal is inverted independently of the change in level of the input signal, and this provides the merit that almost no increase in consumption of power occurs.

In an embodiment of the present invention, the latch circuit comprises:

a first non-conjunction circuit that receives the clock signal and the pulse signal as inputs;

a second non-conjunction circuit that receives the clock signal and the inverted signal of the pulse signal as inputs;

a third non-conjunction circuit that receives an output signal of the first non-conjunction circuit and an output signal of a fourth non-conjunction circuit as inputs; and the fourth non-conjunction circuit that receives an output signal of the second non-conjunction circuit and an output signal of the third non-conjunction circuit as inputs.

According to the above construction, the input signal is taken into the non-conjunction circuit only when the clock signal is in the active state and is not taken in when the clock signal is in the inactive state, so that the internal state is held. Therefore, this latch circuit operates as a latch circuit having a level shifting function. Accordingly, if the shift register circuit is constructed by combining these circuits, the amplitude of the clock signal can be made smaller than the amplitude of the pulse signal to be scanned, i.e., the power voltage of the shift register circuit.

In an embodiment of the present invention, the first and second non-conjunction circuits comprises:

a first p-type transistor and a second p-type transistor, having source electrodes connected to the power potential and gate electrodes connected to the drain electrodes of the counterparts;

a third n-type transistor having a source electrode connected to the drain electrode of the first p-type transistor and a gate electrode that receives the pulse signal as an input;

a fourth n-type transistor having a source electrode connected to the drain electrode of the third n-type transistor, a drain electrode connected to the ground potential and a gate electrode that receives the clock signal as an input;

a thirteenth n-type transistor having a source electrode connected to the drain electrode of the second p-type transistor, a drain electrode connected to the ground potential and a gate electrode that receives the inverted signal of the pulse signal as an input; and a fourteenth n-type transistor having a source electrode connected to the drain electrode of the second p-type transistor, a drain electrode connected to the ground potential and a gate electrode that receives the inverted signal of the clock signal as an input, whereby the output signal of the first non-conjunction circuit is outputted from the drain electrode of the first p-type transistor, and the inverted signal of the output signal is outputted from the drain electrode of the second p-type transistor.

According to the above construction, if such a non-conjunction circuit is applied to a logic circuit (non-conjunction circuit) having, for example, a level shifting function, then the circuit correctly operates even when the input signal is smaller than the power voltage. Therefore, if the shift register circuit is constructed by combining this with the normal non-conjunction circuit, then the amplitude of the clock signal can be made smaller than the amplitude of the pulse signal to be scanned, i.e., the power voltage of the shift register circuit.

In an embodiment of the present invention, the latch circuit comprises:

first and second p-type transistors having source electrodes connected to the power potential;

third and fourth p-type transistors having source electrodes connected respectively to the drain electrodes of the first and second p-type transistors, and gate electrodes connected to the clock signal;

third and fifth n-type transistors having source electrodes connected respectively to the drain electrodes of the third and fourth p-type transistors, and gate electrodes connected respectively to an input pulse signal and an inverted signal of the input pulse signal;

fourth and sixth n-type transistors having source electrodes connected respectively to the drain electrodes of the third and fifth n-type transistors, gate electrodes connected to the clock signal, and drain electrodes connected to the ground potential; and first and second n-type transistors having source electrodes connected respectively to the drain electrodes of the third and fourth p-type transistors, gate electrodes connected respectively to the drain electrodes of the fourth and third p-type transistors, and drain electrodes connected to the ground potential, whereby the output pulse is outputted from the drain electrode of the fourth p-type transistor, and the inverted signal of the output pulse is outputted from the drain electrode of the third p-type transistor.

According to the above construction, the third and fourth p-type transistors of which the gate electrodes receive the clock signal as the input are incorporated. With this arrangement, the p-type transistors operate so as to limit the current from the power potential side in the operating stage when the output node that outputs the output pulse or its inverted signal comes to have the low level (ground potential), thereby increasing the operating margin.

In an embodiment of the present invention, the latch circuit comprises:

first and second p-type transistors having source electrodes connected to the power potential;

third and fourth p-type transistors having source electrodes connected respectively to the drain electrodes of the first and second p-type transistors, and gate electrodes connected to the clock signal;

third and fifth n-type transistors having source electrodes connected respectively to the drain electrodes of the third and fourth p-type transistors, and gate electrodes connected respectively to an input pulse signal and an inverted signal of the input pulse signal;

fourth and sixth n-type transistors having source electrodes connected respectively to the drain electrodes of the third and fifth n-type transistors, gate electrodes connected to the clock signal, and drain electrodes connected to the ground potential;

first and second n-type transistors having source electrodes connected respectively to the drain electrodes of the third and fourth p-type transistors, gate electrodes connected respectively to the drain electrodes of the fourth and third p-type transistors; and seventh and eighth n-type transistors having source electrodes connected respectively to the drain electrodes of the first and second n-type transistors, gate electrodes connected to the inverted signal of the clock signal, and drain electrodes connected to the ground potential, whereby the output pulse is outputted from the drain electrode of the fourth p-type transistor, and the inverted signal of the output pulse is outputted from the drain electrode of the third p-type transistor.

According to the above construction, the third and fourth p-type transistors of which the gate electrodes receive the clock signal as the input are incorporated. With this arrangement, the p-type transistors operate so as to limit the current from the power potential side in the operating stage when the output node that outputs the output pulse or its inverted signal comes to have the low level (ground potential), thereby increasing the operating margin.

In an embodiment of the present invention, the latch circuit comprises:

first and second p-type transistors having source electrodes connected to the power potential;

third and fourth p-type transistors having source electrodes connected respectively to the drain electrodes of the first and second p-type transistors, and gate electrodes connected to the clock signal;

fifth and sixth p-type transistors having source electrodes connected respectively to the drain electrodes of the first and second p-type transistors, gate electrodes connected respectively to an input pulse signal and an inverted signal of the input pulse signal, and drain electrodes connected respectively to the drain electrodes of the third and fourth p-type transistors;

third and fifth n-type transistors having source electrodes connected respectively to the drain electrodes of the third and fourth p-type transistors, and gate electrodes connected respectively to the input pulse signal and the inverted signal of the input pulse signal;

fourth and sixth n-type transistors having source electrodes connected respectively to the drain electrodes of the third and fifth n-type transistors, gate electrodes connected to the clock signal, and drain electrodes connected to the ground potential; and first and second n-type transistors having source electrodes connected respectively to the drain electrodes of the third and fourth p-type transistors, gate electrodes connected respectively to the drain electrodes of the fourth and third p-type transistors, and drain electrodes connected to the ground potential;

whereby the output pulse is outputted from the drain electrode of the fourth p-type transistor, and the inverted signal of the output pulse is outputted from the drain electrode of the third p-type transistor.

According to the above construction, the third and fourth p-type transistors of which the gate electrodes receive the clock signal as the input as well as the fifth and sixth p-type transistors of which the gate electrodes receive the input pulse signal and its inverted signal as the inputs are incorporated. With this arrangement, the p-type transistors operate so as to limit the current from the power potential side in the operating stage when the output node that outputs the output pulse or its inverted signal comes to have the low level (ground potential), thereby increasing the operating margin.

In an embodiment of the present invention, the latch circuit comprises:

first and second p-type transistors having source electrodes connected to the power potential;

third and fourth p-type transistors having source electrodes connected respectively to the drain electrodes of the first and second p-type transistors, and gate electrodes connected to the clock signal;

fifth and sixth p-type transistors having source electrodes connected respectively to the drain electrodes of the first and second p-type transistors, gate electrodes connected respectively to an input pulse signal and an inverted signal of the input pulse signal, and drain electrodes connected respectively to the drain electrodes of the third and fourth p-type transistors;

third and fifth n-type transistors having source electrodes connected respectively to the drain electrodes of the third and fourth p-type transistors, and gate electrodes connected respectively to the input pulse signal and the inverted signal of the input pulse signal;

fourth and sixth n-type transistors having source electrodes connected respectively to the drain electrodes of the third and fifth n-type transistors, gate electrodes connected to the clock signal, and drain electrodes connected to the ground potential;

first and second n-type transistors having source electrodes connected respectively to the drain electrodes of the third and fourth p-type transistors, and gate electrodes connected respectively to the drain electrodes of the fourth and third p-type transistors; and seventh and eighth n-type transistors having source electrodes connected respectively to the drain electrodes of the first and second n-type transistors, gate electrodes connected to an inverted signal of the clock signal, and drain electrodes connected to the ground potential, whereby the output pulse is outputted from the drain electrode of the fourth p-type transistor, and the inverted signal of the output pulse is outputted from the drain electrode of the third p-type transistor.

According to the above construction, the third and fourth p-type transistors of which the gate electrodes receive the clock signal as the input as well as the fifth and sixth p-type transistors of which the gate electrodes receive the input pulse signal and its inverted signal as the inputs are incorporated. With this arrangement, the p-type transistors operate so as to limit the current from the power potential side in the operating stage when the output node that outputs the output pulse or its inverted signal comes to have the low level (ground potential), thereby increasing the operating margin.

In an embodiment of the present invention, the first, second, third and fifth n-type transistors have a dual-gate structure, and the fourth, sixth, seventh and eighth n-type transistors have a single-gate structure.

According to the above construction, if the transistor located on the ground potential side has the single-gate structure and the transistor located on the output terminal side has the dual-gate structure in the case where the transistor is directly connected between the output terminal of the latch circuit and the ground terminal, then the reduction in the number of elements and the ensuring of the elemental breakdown voltage can be concurrently achieved. In general, with regard to a plurality of transistors connected in series, the higher voltage is applied to the drain side (the higher potential side in the case of the n-type transistor and the lower potential side in the case of the p-type transistor) as compared with the source side (the lower potential side in the case of the n-type transistor and the higher potential side in the case of the p-type transistor). Therefore, it is effective to make the transistor located on the drain side have the dual-gate structure, thereby increasing the elemental breakdown voltage. Since only the relatively low voltage is applied to the source side, the load can be reduced by adopting the single-gate structure, so that the high-speed operation of the shift register circuit and the reduction in the number of elements can be achieved.

In an embodiment of the present invention, the first, second, third and fifth n-type transistors have a channel length longer than the channel length of the fourth, sixth, seventh and eighth n-type transistors.

According to the latch circuit having the above construction, in the case where a plurality of transistors are directly connected between the output terminal of the latch circuit and the ground terminal similar to the above case, the reduction in the number of elements and the ensuring of the elemental breakdown voltage can be concurrently achieved also by making the channel length of the transistor located on the output terminal side longer than the channel length of the transistor located on the ground potential side. As described above, with regard to the plurality of transistors connected in series, the higher voltage is applied to the drain side (the higher potential side in the case of the n-type transistor and the lower potential side in the case of the p-type transistor) as compared with the source side (the lower potential side in the case of the n-type transistor and the higher potential side in the case of the p-type transistor). Therefore, it is effective to make the transistor located on the drain side have the longer channel length, thereby increasing the elemental breakdown voltage. Since only the relatively low voltage is applied to the source side, the load can be reduced by reducing the channel length, so that the high-speed operation of the shift register circuit and the reduction in the number of elements can be achieved.

Also, there is provided a shift register circuit having a plurality of latch circuits for transmitting a pulse signal in synchronization with a clock signal, the latch circuits each internally having a clock signal input control section for executing control to input and stop the supplied clock signal, and the clock signal having amplitude smaller than the amplitude of the pulse signal.

According to the above construction, the amplitude of the clock signal is smaller than the amplitude of the pulse signal, i.e., smaller than the power voltage for transmitting the pulse signal. Therefore, the pulse signal having large amplitude can be transmitted without increasing the consumption of power of the external circuit for generating the clock signal. In the above case, the reduction of the load and the reduction in consumption of power of the clock signal line are achieved by stopping the input of the clock signal supplied to each of the latch circuits constructed of the active elements that are required to have a high driving power by means of the clock signal input control section when the latch circuit is inactive.

In am embodiment of the present invention, the clock signal inputted to the latch circuits is only either one of a clock signal of a specified cycle and an antiphase signal of the clock signal.

According to the above construction, the latch circuit operates in synchronization with only either one of the clock signal and its antiphase signal. Therefore, the load of the clock signal line is reduced by half to reduce the consumption of power as compared with the case where both the signals of the clock signal ck and the inverted clock signal /ck are used as in the conventional latch circuits SR shown in FIG. 43.

In an embodiment of the present invention, an output signal of each of the latch circuits is inputted to the latch circuit of the succeeding stage via a first transfer gate and inputted to the latch circuit of the preceding stage via a second transfer gate, and a scanning direction is controlled by selectively making conductive the first or second transfer gate by means of an external signal.

According to the shift register circuit having the above construction, the output signal of each latch circuit is inputted to the latch circuits of the preceding stage and the succeeding stage via the first and second transfer gates, respectively, and the scanning direction of the shift register is controlled by making one of the first and second transfer gates conductive by the external signal.

In the shift register circuit having the above construction, the direction in which the pulse signal propagates can be set in either direction by the input signal to the transfer gate, and therefore, a shift register circuit that can execute scanning in both the directions can be constructed.

In an embodiment of the present invention, an output signal of each of the latch circuits is inputted to the latch circuit of the succeeding stage via a buffer circuit.

In the shift register circuit having the above construction, if there is provided the construction in which, for example, the output pulse signal of the latch circuit is inputted to the latch circuit of the next stage via the buffer circuit, then the driving power with respect to the next stage can be increased by adding the buffer circuit even in the latch circuit with a level shifting function having a relatively small driving power, so that the stable operation and high-speed operation of the shift register circuit can be achieved.

In an embodiment of the present invention, the clock signal input control section is comprised of a first clock signal input control section and a second clock signal input control section, and the latch circuit comprises:

a first p-type transistor and a second p-type transistor having source electrodes connected to a power potential and gate electrodes connected to drain electrodes of the counterparts;

a first n-type transistor having a source electrode connected to the drain electrode of the first p-type transistor, a drain electrode connected to a ground potential and a gate electrode connected to the drain electrode of the second p-type transistor;

a second n-type transistor having a source electrode connected to the drain electrode of the second p-type transistor, a drain electrode connected to the ground potential and a gate electrode connected to the drain electrode of the first p-type transistor;

a third n-type transistor having a source electrode connected to the drain electrode of the first p-type transistor and a gate electrode connected to a pulse signal input node;

a fourth n-type transistor having a source electrode connected to the drain electrode of the third n-type transistor, a drain electrode connected to the ground potential and a gate electrode connected to the first clock signal input control section;

a fifth n-type transistor having a source electrode connected to the drain electrode of the second p-type transistor and a gate electrode connected to an inverted pulse signal input node; and a sixth n-type transistor having a source electrode connected to the drain electrode of the fifth n-type transistor, a drain electrode connected to the ground potential and a gate electrode connected to the second clock signal input control section, whereby the drain electrode of the second p-type transistor is made to serve as a pulse signal output node and the drain electrode of the first p-type transistor is made to serve as an inverted pulse signal output node.

According to the above construction, the fourth n-type transistor is turned on when the clock signal inputted from the first clock signal input control section becomes active and the third n-type transistor is turned on when the level of the input pulse signal becomes "H", so that the inverted pulse signal output node comes to have the ground potential. Then, the second p-type transistor is turned on, so that the pulse signal output node comes to have the power potential after a delay behind the trailing edge of the output signal of the inverted pulse signal output node. Therefore, the first p-type transistor is turned off to fix the potential of the inverted pulse signal output node at the ground potential. The fifth n-type transistor is turned off since the input inverted pulse signal is "L", and the second n-type transistor is turned off since the inverted pulse signal output node has the ground potential. Thus, the potential of the pulse signal output node is fixed to the power potential. That is, the above latch circuit operates as a level shifter circuit as a consequence of the output of the pulse signal having the amplitude of the power voltage even though the amplitude of the clock signal is small in the case where the input pulse signal and the output pulse signal have the level "H" and the clock signal is active, and the latch circuit operates as a level hold circuit in any other case. Therefore, according to the shift register circuit constructed by serially connecting a plurality of the latch circuits, a pulse signal having greater amplitude is transmitted in synchronization with the clock signal having small amplitude.

Furthermore, the above latch circuit necessitates the clock signal only when this latch circuit is in the active state. Therefore, when the latch circuit is in the inactive state, the reduction of load and the reduction in consumption of power of the clock signal line are achieved by stopping the input of the clock signal by the first and second clock signal input control sections.

Furthermore, the pulse signal from the pulse signal output node rises after a delay behind the trailing edge of the pulse signal from the inverted pulse signal output node. Therefore, the pulse width of the output pulse signal of the pulse signal output node is consistently narrower than the pulse width of the output pulse signal of the inverted pulse signal output node. By using the output pulse signal of the pulse signal output node of each latch circuit, the occurrence of time overlap of the output signals from adjacent latch circuits is eliminated.

In an embodiment of the present invention, the latch circuit comprises:

a first inverter having an input terminal connected to the inverted pulse signal output node; and a second inverter having an input terminal connected to the pulse signal output node, whereby the output terminal of the first inverter is made to serve as a new pulse signal output node and the output terminal of the second inverter is made to serve as a new inverted pulse signal output node.

According to the above construction, the pulse signal from the inverted pulse signal output node falls after a delay behind the leading edge of the pulse signal from the pulse signal output node. Therefore, the pulse width of the output pulse signal of the inverted pulse signal output node is consistently narrower than the pulse width of the output pulse signal of the pulse signal output node. By using the output pulse signal of the inverted pulse signal output node of each latch circuit, the occurrence of time overlap of the output signals from adjacent latch circuits is eliminated.

Furthermore, the dull edges of the output pulse signal and the output inverted pulse signal due to the operating delay of the transistors constituting the latch circuits are compensated by the buffering operation (amplifying operation) of the inverter. Particularly, in the present shift register circuit constructed of the multi-stage latch circuits, the signal compensation is effected immediately behind or immediately before the latch circuit of each stage, and therefore, the occurrence of summation of the signal delays of the latch circuits can be prevented. Therefore, a stable operation can be achieved even with the series of multi-stage latch circuits.

In an embodiment of the present invention, the first clock signal input control section is comprised of a switching means for electrically disconnecting the gate electrode of the fourth n-type transistor from the clock signal input node when the latch circuit becomes inactive and a potential fixing means for fixing the potential of the gate electrode of the fourth n-type transistor that is electrically disconnected from the clock signal input node at a specified potential, and the second clock signal input control section is comprised of a switching means for electrically disconnecting the gate electrode of the sixth n-type transistor from the clock signal input node when the latch circuit becomes inactive and a potential fixing means for fixing the potential of the gate electrode of the sixth n-type transistor that is electrically disconnected from the clock signal input node at a specified potential.

According to the above construction, if there is effected electrical disconnection between the gate electrodes of the fourth and sixth n-type transistors and the clock signal input node by the switching means of the first and second clock signal input control sections, the potentials of the gate electrodes of the fourth and sixth n-type transistors are fixed to a specified value by the potential fixing means. Thus, the erroneous operation that may occur during the period of transition from the active state into the inactive state of the latch circuit is prevented.

In an embodiment of the present invention, the switching means of the first clock signal input control section is comprised of a fifteenth n-type transistor having a source electrode connected to the clock signal input node, a drain electrode connected to the gate electrode of the fourth n-type transistor and a gate electrode connected to the pulse signal input node, and the switching means of the second clock signal input control section is comprised of a sixteenth n-type transistor having a source electrode connected to the clock signal input node, a drain electrode connected to the gate electrode of the sixth n-type transistor and a gate electrode connected to the pulse signal output node.

According to the above construction, the fifteenth and sixteenth n-type transistors are turned off when the pulse signal inputted to the gate electrodes of the fifteenth and sixteenth n-type transistors is "L", or when the latch circuit is in the inactive state, thereby stopping the input of the clock signal into the gate electrodes of the fourth and sixth n-type transistors. Thus, the latch circuit operation shifts into the operation as a level hold circuit.

In an embodiment of the present invention, the potential fixing means of the first clock signal input control section is comprised of a seventeenth n-type transistor having a source electrode connected to the gate electrode of the fourth n-type transistor, a drain electrode connected to the ground potential and a gate electrode connected to the power potential, and the potential fixing means of the second clock signal input control section is comprised of an eighteenth n-type transistor having a source electrode connected to the gate electrode of the sixth n-type transistor, a drain electrode connected to the ground potential and a gate electrode connected to the power potential.

According to the above construction, the gate electrodes of the fourth and sixth n-type transistors are fixed to the ground potential when the gate electrodes of the fourth and sixth n-type transistors and the clock signal input node are electrically disconnected from each other by the switching means. Thus, the erroneous operation that may occur during the period of transition from the active state into the inactive state of the latch circuit is prevented. Furthermore, by constituting the potential fixing means by a transistor, the elemental area becomes smaller than when the means is constructed of a resistor.

In an embodiment of the present invention, the potential fixing means of the first clock signal input control section is comprised of a nineteenth n-type transistor having a source electrode connected to the gate electrode of the fourth n-type transistor, a drain electrode connected to the ground potential and a gate electrode connected to its own source electrode, and the potential fixing means of the second clock signal input control section is comprised of a twentieth n-type transistor having a source electrode connected to the gate electrode of the sixth n-type transistor, a drain electrode connected to the ground potential and a gate electrode connected to its own source electrode.

According to the above construction, the gate electrodes of the fourth and sixth n-type transistors are fixed to the threshold voltages of the nineteenth and twentieth n-type transistors when the gate electrodes of the fourth and sixth n-type transistors and the clock signal input node are electrically disconnected from each other by the switching means. Thus, the erroneous operation that may occur during the period of transition from the inactive state into the active state of the latch circuit is prevented. Furthermore, the wiring on the circuit is simplified and the circuit area is reduced as compared with the case of the previous embodiment in which the gate electrodes of the nineteenth and twentieth n-type transistors are connected to the power potential.

In an embodiment of the present invention, the potential fixing means of the first clock signal input control section is comprised of a first resistor provided between the gate electrode of the fourth n-type transistor and the ground potential, and the potential fixing means of the second clock signal input control section is comprised of a second resistor provided between the gate electrode of the sixth n-type transistor and the ground potential.

According to the above construction, the gate electrodes of the fourth and sixth n-type transistors are fixed to the ground potential when the gate electrodes of the fourth and sixth n-type transistors and the clock signal input node are electrically disconnected from each other by the switching means. Thus, the erroneous operation that may occur during the period of transition from the inactive state into the active state of the latch circuit is prevented. Furthermore, the manufacturing process becomes simple since the structure of the potential fixing means is simplified. Furthermore, the circuit area is reduced by the multi-layer arrangement in which the resistor is provided below the wiring.

In an embodiment of the present invention, the potential fixing means of the first clock signal input control section is comprised of a twenty-first n-type transistor having a source electrode connected to the gate electrode of the fourth n-type transistor, a drain electrode connected to the ground potential and a gate electrode connected to the inverted pulse signal input node, and the potential fixing means of the second clock signal input control section is comprised of a twenty-second n-type transistor having a source electrode connected to the gate electrode of the sixth n-type transistor, a drain electrode connected to the ground potential and a gate electrode connected to the inverted pulse signal output node.

According to the above construction, the gate electrodes of the fourth and sixth n-type transistors are fixed to the ground potential when the gate electrodes of the fourth and sixth n-type transistors and the clock signal input node are electrically disconnected from each other by the switching means. Thus, the erroneous operation that may occur during the period of transition from the inactive state into the active state of the latch circuit is prevented. By contrast, when the gate electrodes of the fourth and sixth n-type transistors and the clock signal input node are electrically connected to each other by the switching means, the twenty-first and twenty-second n-type transistors are turned off to prevent the conducting current from the gate electrodes of the fourth and sixth n-type transistors to the ground potential.

Also, there is provided an active matrix type image display device comprising: a plurality of data signal lines arranged in a direction of column; a plurality of scanning signal lines arranged in a direction of row; a plurality of pixels that are arranged in a matrix form while being placed in positions surrounded by the data signal lines and the scanning signal lines; a data signal line drive circuit for supplying a video signal to the data signal lines; and a scanning signal line drive circuit for supplying a scanning signal to the scanning signal lines, at least one of the data signal line drive circuit and the scanning signal line drive circuit being comprised of the shift register of the present invention.

According to the above construction, either one of the data signal line drive circuit and the scanning signal line drive circuit is constructed of the shift register circuit according to any one of the eighteenth through twenty-ninth aspects of the invention. Therefore, the one signal line drive circuit is driven by the clock signal that has amplitude smaller than the amplitude of the transfer pulse signal (i.e., the power voltage). With this arrangement, the consumption of power of the clock wiring that has a large wiring load capacity due to the long wiring length and the consumption of power of the external circuit for generating the clock are remarkably reduced. Furthermore, when the latch circuit that constitutes the shift register circuit of the signal line drive circuit is in the inactive state, the input of the clock signal into the shift register circuit is stopped by the clock signal input control section, so that the load of the clock signal line is reduced.

In an embodiment of the present invention, one of the signal line drive circuits is comprised of the shift register circuit of the present invention.

constructed so as to generate a drive signal for driving the corresponding signal line by means of an output signal that has a narrower pulse width out of the two output signals of the pulse signal and the inverted pulse signal from each latch circuit constituting the shift register circuit.

According to the above construction, by generating the drive signal by means of the output signal having the narrower pulse width out of the output pulse signal and the output inverted pulse signal, the occurrence of time overlap of the output signals from the adjacent latch circuits is eliminated. Therefore, in the case where the one signal line drive circuit is the data signal line drive circuit, the sampling signals generated by the adjacent latch circuits do not overlap each other in terms of time. Accordingly, there is no occurrence of the start of writing the video signal into the other data signal line while a video signal is being written into a certain data signal line. In the case of the scanning signal line drive circuit, the scanning signals generated by the adjacent latch circuits do not overlap each other in terms of time. Accordingly, there is no occurrence of the start of writing of the video data into the pixels of the other row while video data are being written into the pixels of a certain row. That is, no noise is superimposed on the video signal in either case of the signal line drive circuits, so that a satisfactory image can be obtained without additionally incorporating any circuit for narrowing the pulse width of the drive signal.

In general, a large through current flows through the level shifter circuit at the time of change of a signal in the above case. However, in the construction of this latch circuit, the through current flows only at the time of change of the output signal (i.e., when the pulse signal is propagating), not at the time of change of the clock signal. Therefore, the consumption of power becomes extremely small.

In an embodiment of the present invention, the image display device comprises:

a level shifter circuit that amplifies the amplitude of a start signal having the same amplitude as that of the clock signal and supplies the resulting signal as the pulse signal to the latch circuit of the first stage in the shift register circuit of the one signal line drive circuit.

According to the above construction, in the one signal line drive circuit, the start signal is inputted to the latch circuit of the first stage of the shift register circuit after being preliminarily boosted. Therefore, even though the latch circuit of the first stage is made to have quite the same construction as that of the latch circuit of the other stage, a stable operation is achieved. Furthermore, the amplitude of the start signal can be made smaller than that of the drive voltage similar to the case of the clock signal, so that the consumption of power of the external circuit for generating the start signal can be reduced.

In an embodiment of the present invention, an image display device comprises:

a level shifter circuit that amplifies the amplitude of a control signal having the same amplitude as that of the clock signal and supplies the resulting signal to the one signal line drive circuit.

According to the above construction, the control signal is inputted to the buffer circuit and so on other than the shift register circuit after being preliminarily boosted. Therefore, the amplitude of all the control signals inputted to the one signal line drive circuit can be made smaller than that of the drive voltage, so that the consumption of power of the external circuit for generating the control signal can be reduced.

In an embodiment of the present invention, the one signal line drive circuit is formed on a substrate identical to that of the pixels.

According to the above construction, the pixels for performing display and the one signal line drive circuit for driving the pixels are fabricated on an identical substrate through identical processes. Thus, the reduction in manufacturing cost and mounting cost and the increase in yield of the mounted products are achieved.

In an embodiment of the present invention, an active element that constitutes each of the one signal line drive circuit and the pixels is a polysilicon thin-film transistor.

According to the above construction, by employing the polysilicon thin-film transistor that has an extremely high driving power as compared with the amorphous silicon thin-film transistor employed in the conventional active matrix type liquid crystal display device, the pixels and the signal line drive circuits are easily formed on the identical substrate.

Furthermore, the polysilicon thin-film transistor has a driving power that is one or two orders of magnitude smaller than the monocrystal silicon transistor although the driving power is much higher than that of the amorphous silicon thin-film transistor. Therefore, if the level shifter circuit is constructed of the polysilicon thin-film transistor, then there is a concern about a significant change in duty ratio of the signal. However, according to the structure of the shift register circuit in the one signal line drive circuit, output signals of an approximately same pulse width can be obtained from the latch circuit of any stage of the shift register circuit, and satisfactory image display is achieved. In the above case, the polysilicon thin-film transistor becomes a large load of the clock signal line since a large channel width must be provided due to its low driving power. However, according to the construction of the shift register circuit of the one signal line drive circuit, the clock signal line is connected to only the driving transistor of the latch circuit in the operating state by the first and second clock signal input control sections, so that the reduction of load of the clock signal line and the reduction in consumption of power of the drive circuit can be achieved.

In an embodiment of the present invention, the polysilicon thin-film transistor is formed on a glass substrate through a process at a temperature of not higher than 600° C.

According to the above construction, the polysilicon thin-film transistor is formed on the glass substrate through the processes at the temperature of not higher than 600° C. Therefore, the glass that is inexpensive and able to be easily processed to have a large size can be employed as the substrate although the strain point temperature is low, so that a large-size image display device is manufactured at low cost.

In order to achieve the aforementioned object, there is provided a CMOS logical circuit consisting of Complementary Metal-Oxide Semiconductors which performs a logical operation based on a plurality of input signals, an amplitude of at least one of the input signals is smaller than a drive voltage of the CMOS logical circuit.

In the logical circuit of the present invention, based on a plurality of input signals, a CMOS logical circuit performs a logical operation. The amplitude of at least one of the input signals is set smaller than the drive voltage of the CMOS logical circuit. Thus, it is possible to allow the amplitude of the input signal to be small in the case where it is necessary to increase the amplitude of an output of the logical circuit or in the case where the logical circuit does not operate correctly unless the drive voltage is increased to a certain degree or higher. Therefore, it is possible to reduce a load to be applied to an external circuit generating the input signal and reduce the power consumption.

The logical circuit of the present invention has a circuit having an n-type transistor and a circuit having a p-type transistor each of which provided on two electric current paths. As concerns the circuit having one of the n-type transistor and the p-type transistor, the one electric current path is provided with a circuit having the same construction as that of a circuit having an n-type transistor of a conventional CMOS logical circuit outputting a logical operation result similar to that of the logical circuit of the present invention. The other electric current path is provided with a circuit having the same construction as that of a circuit having a p-type transistor of the conventional CMOS logical circuit outputting a logical operation result similar to that of the logical circuit of the present invention. As concerns the circuit having the transistor of the other channel type, a gate electrode of the transistor provided on the one electric current path and that of the transistor provided on the other electric current path are connected to drain electrodes of the counterparts.

According to an embodiment, a logical operation circuit can be constituted in the circuit having one of the n-type transistor and the p-type transistor. In the circuit having the transistor of the other channel type, the gate electrode of the one transistor and that of the other transistor are connected to the drain electrodes of the counterparts to constitute a feedback loop. Therefore, it is possible to suppress the flow of through-current and keep the inside of the logical circuit stable.

According to the construction, it is possible to make the amplitude of the input signal smaller than that of the pulse signal outputted from the logical circuit, namely, the supply voltage of the logical circuit. Thus, according to the logical circuit of the present invention, electric current does not flow each time the level of the input signal is switched but flows only when the phase of the output signal is inverted. Accordingly, the power consumption hardly increases.

Compared with the conventional CMOS logical circuit, the logical circuit of the present invention has only two transistors provided additionally thereto. That is, the logical circuit has a level shift function and a logical operation function with a very small number of elements.

The logical circuit of the present invention has one electric current path at any timing during its operation. Even though an internal delay occurs, the logical circuit operates by a one-stage delay of the logic gate. Therefore, the logical circuit can operate at a very high speed.

According to an embodiment of the logical circuit of the present invention, in the n-type circuit or the p-type circuit, a signal having a smaller amplitude than a plurality of signals is inputted to one transistor positioned further from the output portion than the other transistor connected in series with the one transistor. Because the signal having a smaller amplitude is inputted to the transistor positioned further from the output portion, it is possible to operate the transistor sufficiently and achieve a reliable and high-speed operation of the logical circuit. That is, in a plurality of transistors connected in series with each other, the potential difference between the supply potential and the voltage of the source electrode of the transistor positioned further from the output portion is lower than that between the supply potential and the voltage of the source electrode of the transistor positioned at the output portion side. Considering that the drive force of the transistor is determined by the potential difference between its gate and source electrodes, it is desirable to input the signal having a smaller amplitude to the transistor located further from the out put portion.

According to an embodiment of the logical circuit of the present invention, third and fourth transistors are connected in series with each other on one electric current path in one of the n-type circuit and the p-type circuit, and fifth and sixth transistors are connected in parallel with each other on the other electric current path in the circuit of the other channel type. Signals to be inputted to the third and fifth input terminals are inverse to each other in phase. Signals to be inputted to the fourth and sixth input terminals are inverse to each other in phase. According to the construction, the number of the transistors constituting the logical circuit is as small as six, which provides the effect of constructing a small non-conjunction circuit, in addition to the effects described above. The logical circuit can function as a non-disjunction circuit by replacing an input signal and an inverted input signal with each other.

According to an embodiment of the logical circuit of the present invention, a fifth transistor is connected in parallel with the third and fourth transistors connected in series with each other on one electric current path. An eighth transistor is connected in series with the fifth and sixth transistors connected in parallel with each other on the other electric current path and the eighth transistor is positioned at the output-terminal side. Signals to be inputted to the third and sixth input terminals are inverse to each other in phase. Signals to be inputted to the fourth and seventh input terminals are inverse to each other in phase. Signals to be inputted to the fifth and eighth input terminals are inverse to each other in phase. Therefore, the number of the transistors constituting the logical circuit is as small as eight, which provides the effect of constructing a small-size logical product and non-disjunction circuit, in addition to the effects described above. The logical circuit can function as a logical sum and non-conjunction circuit by replacing an input signal and an inverted input signal with each other.

According to an embodiment of the logical circuit of the present invention, the fifth transistor is connected in parallel with the third and fourth transistors connected in series with each other on the one electric current path. The eighth transistor is connected in series with the fifth and sixth transistors connected in parallel with each other on the other electric current path, such that the eighth transistor is positioned at a second supply potential side. The signals to be inputted to the third and sixth input terminals are inverse to each other in phase. The signals to be inputted to the fourth and seventh input terminals are inverse to each other in phase. The signals to be inputted to the fifth and eighth input terminals are inverse to each other in phase. Therefore, the number of the transistors constituting the logical circuit is as small as eight, which provides the effect of constructing a small-size logical product and non-disjunction circuit, in addition to the effects described above. The logical circuit can function as a logical sum and non-conjunction circuit by replacing an input signal and an inverted input signal with each other.

According to an embodiment of the logical circuit of the present invention, in the case where a first supply potential is at a high power source side, the logical circuit is additionally provided with the p-type transistor that receives an input signal or a phase-inverted input signal at its gate electrode. The p-type transistor has a function of limiting the flow of electric current from the supply potential at an operating time when an output node or an inverted output node becomes a low level (ground potential). Thus, it is possible to increase an operating margin.

According to an embodiment of the logical circuit of the present invention, at least one of input signals is inputted through a transfer transistor for controlling a signal input. The construction allows the logical circuit to be cut off from an input signal line when the signal input is not required. Thus, the construction has an advantage of reducing a capacitive load to be applied to the input signal line. Accordingly, the attenuation of the input signal and waveform distortion can be reduced. Consequently, the operating margin of the logical circuit can be increased and thus the power consumption for driving the input signal line can be reduced.

According to an embodiment of the logical circuit of the present invention, a grounding transistor is provided between one supply potential and the gate electrode of a transistor receiving a signal controlled by the transfer transistor, and the gate electrode of the grounding transistor is connected to a different supply potential. According to the construction, the signal-input portion is always supplied with the supply potential through the transistor. Therefore, when the logical circuit is electrically cut off from the input signal line, the logical circuit has an advantage that it can maintain a stable state without malfunctioning and another advantage that a capacitive load to be applied to the input signal line can be reduced. In this construction, it is necessary to set the drive force of the grounding transistor much lower than that of the transfer transistor that transfers the input signal.

According to an embodiment of the logical circuit of the present invention, a grounding transistor is provided between one supply potential and the gate electrode of the transistor to which the signal controlled by the transfer transistor is inputted, and a signal having a phase inverse to that of a signal to be inputted to the transfer transistor is inputted to the gate electrode of the grounding transistor. According to the construction, the signal-input portion is electrically connected to the input signal line in only a signal input-requiring time period and the time period before and after the signal input-requiring time period. The signal-input portion is electrically disconnected from the input signal line except the signal input-requiring time period. Therefore, the logical circuit has an advantage that it can maintain a stable state without malfunctioning and another advantage that a capacitive load to be applied to the input signal line can be reduced. In this construction, the signal-input portion is electrically connected only to one of electric current paths. Thus, it is not necessary to set the drive force of the grounding transistor much lower than that of the transfer transistor that transfers the input signal.

According to an embodiment of the logical circuit of the present invention, any one of input signals is inputted to the gate electrode of the transfer transistor and used as a control signal. Therefore, it is possible to reduce the number of signal lines and terminals for the control signal.

According to the image display device of the present invention, a scanning signal line drive circuit and/or a data signal line drive circuit supplying a signal to a scanning signal line and a data signal line, respectively has the logical circuit of the present invention. According to the construction, the image display device can be expected to consume a low electric power. That is, the amplitude of the input signal can be made smaller than the drive voltage. Thus, it is possible to reduce the power consumption of an external circuit generating a signal. In a conventional logical operation circuit, high current flows at an input signal-switching time. However, according to the present invention, through-current flows at an output signal-switching time. Therefore, the image display device consumes a low electric power.

According to an embodiment of the image display device of the present invention, the logical circuit of the present invention is used to constitute a logical circuit receiving an output pulse of a shift register circuit constituting the data signal line drive circuit and a pulse width control signal inputted from outside as input signals and generating an output signal having a pulse width smaller than the pulse width of the output pulse of the shift register circuit. According to the construction, the image display device can be expected to consume a low electric power. That is, the amplitude of the input signal can be made smaller than the drive voltage. Thus, it is possible to reduce the power consumption of the external circuit generating a signal. In the conventional logical operation circuit, high current flows at an input signal-switching time. However, according to the present invention, through-current flows not at an input signal-switching time but at an output signal-switching time. Therefore, the image display device consumes a low electric power. The logical circuit of the present invention generates an output signal having a pulse width smaller than the pulse width of the output pulse of the shift register circuit. Therefore, in sampling a video signal on data signal lines, based on the output signal, a time overlap does not occur between adjacent data signal lines. Thus, the image display device is expected to make a display of an improved quality.

According to an embodiment of the image display device of the present invention, the logical circuit of the present invention is used to constitute a logical circuit receiving an output pulse of a shift register circuit constituting the scanning signal line drive circuit and a pulse width control signal inputted from outside as input signals and generating an output signal having a pulse width smaller than the pulse width of the output pulse of the shift register circuit. According to the construction, the image display device can be expected to consume a low electric power. That is, the amplitude of the input signal can be made smaller than the drive voltage. Thus, it is possible to reduce the power consumption of the external circuit generating a signal. In the conventional logical operation circuit, high current flows at an input signal-switching time. However, according to the present invention, through-current flows at an output signal-switching time. Therefore, the image display device consumes a low electric power. The logical circuit of the present invention generates an output signal having a pulse width smaller than the pulse width of the output pulse of the shift register circuit. Therefore, in writing a video signal to pixels, based on the output signal, a time overlap of scanning signals do not occur between adjacent horizontal lines. Thus, the image display device is expected to make a display of an improved quality.

According to an embodiment of the image display device of the present invention, the logical circuit of the present invention is used to constitute a logical circuit receiving an output pulse of a shift register circuit constituting the scanning signal line drive circuit and one of a plurality of control signals inputted from outside as input signals and outputting signals simultaneously to a plurality of shift register circuits having a different combination. According to the construction, the image display device can be expected to consume a low electric power. That is, the amplitude of an input signal can be made smaller than the drive voltage. Thus, it is possible to reduce the power consumption of the external circuit generating a signal. In the conventional logical operation circuit, high current flows at an input signal-switching time. However, according to the present invention, through-current flows at an output signal-switching time. Therefore, the image display device consumes a low electric power. Further, it is possible to change the timing of the output signal by means of a plurality of control signals inputted from outside. Therefore, it is possible to activate a plurality of scanning signal lines simultaneously and change the combination of the scanning signal lines that are activated simultaneously. Accordingly, for example, it is possible to achieve a combination-varied scanning of two horizontal lines, which is effective for displaying an NTSC image in an image display device of a VGA specification.

According to the an embodiment of image display device of the present invention, the data signal line drive circuit and/or the scanning signal line drive circuit having any one of the above-described logical circuits is formed on a substrate identical to that of pixels. According to the construction, because the data signal line drive circuit and the scanning signal line drive circuit are dispersedly provided widely on the periphery of the image display device, wires such as the input signal line is long and the wiring capacity is large. However, it is possible to reduce the amplitude of the input signal. Thus, it is possible to prevent a high load from being applied to the external circuit for generating the input signal. Further, in the construction, it is possible to manufacture pixels for making a display and the data signal line drive circuit and the scanning signal line drive circuit both for driving the pixels on the same substrate and in the same process. Accordingly, it is possible to manufacture the data signal line drive circuit and the scanning signal line drive circuit at low costs, mount them on the substrate at a low cost, and mount non-defective data signal line drive circuits and scanning signal line drive circuits on the substrate at a high yield.

According to an embodiment of the image display device of the present invention, an active element that constitutes each of the data signal line drive circuit and the scanning signal line drive circuit having any one of the above-described logical circuits and the pixels is made of a polysilicon thin-film transistor. Therefore, compared with an amorphous silicon thin-film transistor used for the conventional active matrix type liquid crystal display device, the image display device of the present invention has a high drive force.

The drive force of the polysilicon thin-film transistor is smaller than that of the amorphous silicon thin-film transistor by two orders. Therefore, to drive a wire having a large load by using the conventional level shifter circuit, it is necessary to use a very large buffer circuit immediately rearward from the level shifter circuit. However, according to the present invention, the use of the buffer circuit is not necessary, which leads to a low power consumption.

According to an embodiment of the image display device of the present invention, the active element is formed through a process at a temperature of not higher than 600° C. Accordingly, it is possible to use a glass substrate low in a distortion temperature, inexpensive, and easy to enlarge a substrate size. Thus, in addition to the above-described effects, it is possible to manufacture a large image display device at a low cost.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 23 is a circuit diagram of a latch circuit different from that of FIG. 3;

FIGS. 24A through 24G are charts of waveforms of a clock signal, input pulse signals, output signals of a clock signal input control section and output pulse signals of FIG. 23;

FIGS. 29A through 29J are charts of waveforms of clock signals to the latch circuits, output signals of the latch circuits and sampling signals of FIG. 26;

FIGS. 32A through 32J are charts of waveforms of clock signals to the latch circuits, output signals of the latch circuits and scanning signals of FIG. 31;

FIGS. 40A through 40G are charts of waveforms of clock signals to the latch circuits, output signals of the latch circuits and sampling signals of FIG. 39;

FIGS. 42A through 42H are charts of waveforms of clock signals to the latch circuits, output signals of the latch circuits, a pulse width control signal and scanning signals of FIG. 41;

DETAILED DESCRIPTION OF THE PREFERRED EMBODIMENTS

Figure 1:
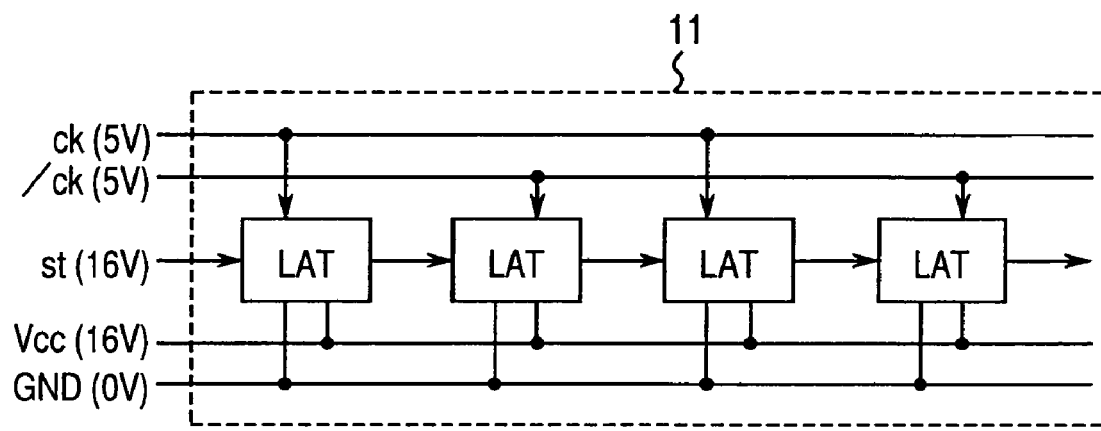
FIG. 1 is a block diagram showing an example of the shift register circuit of the present invention.

The present invention will be described in detail below on the basis of the embodiments shown in the drawings.

FIG. 1 is a block diagram showing an example of a shift register circuit according to the present invention. This shift register circuit 11 is constructed by serially connecting a plurality of latch circuits (half latch circuits) LAT. That is, a start signal (pulse signal) st is inputted to the input node of the latch circuit LAT of the first stage, while the input node of the latch circuit LAT of the second stage is connected to the output node. Likewise, the input node of each latch circuit LAT is connected to the output node of the preceding stage, while the output node is connected to the input node of the latch circuit LAT of the succeeding stage. Then, a clock signal ck is inputted to the control nodes of the latch circuits LAT of the odd-number stages. In contrast to this, a clock signal /ck that is the inverted signal of the clock signal ck is inputted to the control nodes of the latch circuits LAT of the even-number stages.

Thus, the latch circuits LAT of the present embodiment are controlled by either one of the clock signals ck and the clock signal /ck. It is herein assumed that the clock signals ck and /ck have an amplitude of 5 V in contrast to the drive voltage of 16 V of the shift register circuit 11. As described above, by inputting the clock signals ck and /ck having the voltage lower than the drive voltage of the shift register circuit 11, the consumption of power of the clock signals ck and /ck can be suppressed. It is to be noted that some signals necessitate their inverted signals, however, no description is herein provided for them (described in detail later).

Figure 2:
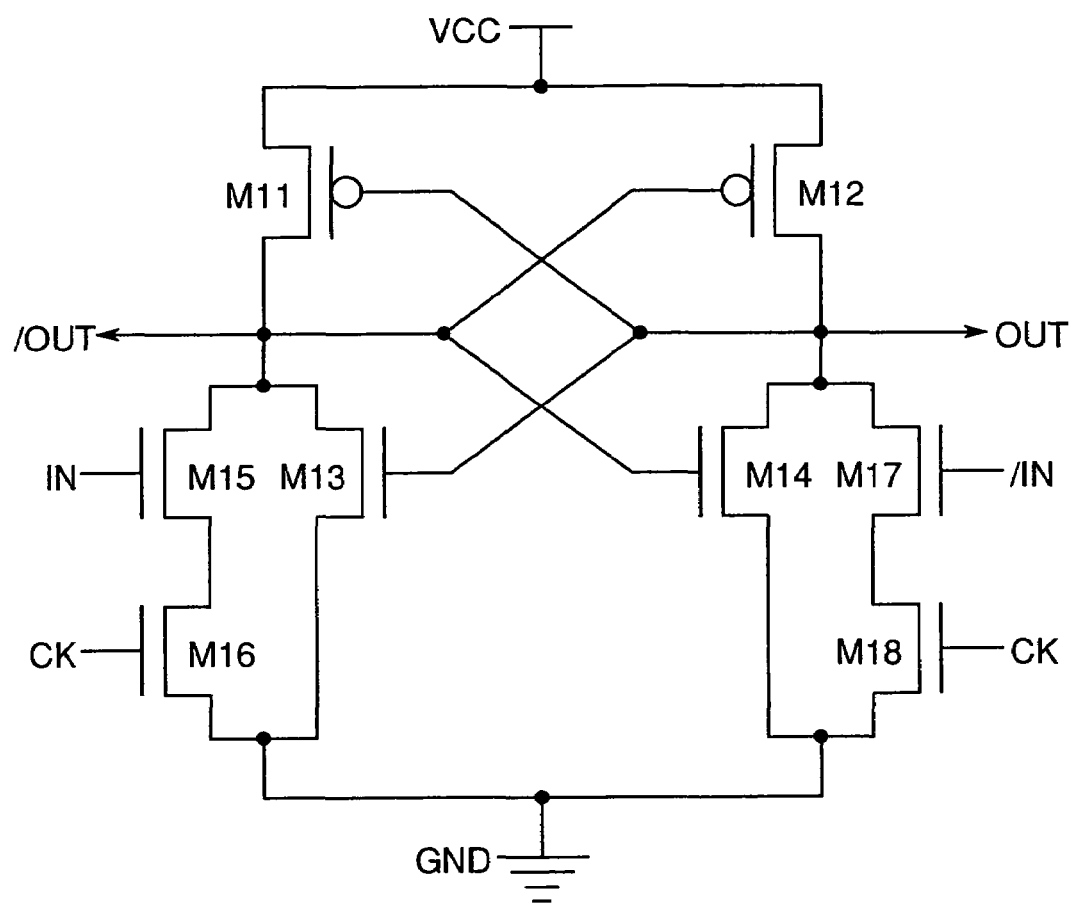
FIG. 2 is a circuit diagram showing an example of the latch circuit of FIG. 1.

FIG. 2 shows a circuit diagram showing an example of the construction of a latch circuit that constitutes the shift register circuit 11 of FIG. 1. To the source electrodes of two p-type transistors Ml1 and M12 that serve as first and second p-type transistors is connected a power potential Vcc (=16 V). Then, the gate electrode of the p-type transistor Ml 1 is connected to the drain electrode of the p-type transistor M12, while the gate electrode of the p-type transistor M12 is connected to the drain electrode of the p-type transistor M11.

To the drain electrode of the p-type transistor M11 is connected the source electrode of an n-type transistor M13 that serves as a first n-type transistor, thereby forming an output node /OUT. The drain electrode of the n-type transistor M13 is connected to the ground potential GND, while the gate electrode is connected to the drain electrode of the p-type transistor M12. Likewise, to the drain electrode of the p-type transistor M12 is connected the source electrode of an n-type transistor M14 that serves as a second n-type transistor, thereby forming an output node OUT. The drain electrode of the n-type transistor M14 is connected to the ground potential GND, while the gate electrode is connected to the drain electrode of the p-type transistor M11.

Further, between the drain electrode (output node /OUT) of the p-type transistor M11 and the ground potential GND are serially connected two n-type transistors M15 and M16 that serve as third and fourth n-type transistors. Then, a pulse signal is inputted from an input terminal IN to the gate electrode of the n-type transistor M15, while a clock signal is inputted from an input terminal CK to the gate electrode of the n-type transistor M16. Likewise, between the drain electrode (output node OUT) of the p-type transistor M12 and the ground potential GND are serially connected two n-type transistors M17 and M18 that serve as fifth and sixth n-type transistors. Then, an inverted signal of the above pulse signal is inputted from an input terminal /IN to the gate electrode of the n-type transistor M17, while the clock signal is inputted from an input terminal CK to the gate electrode of the n-type transistor M18.

Figure 3:
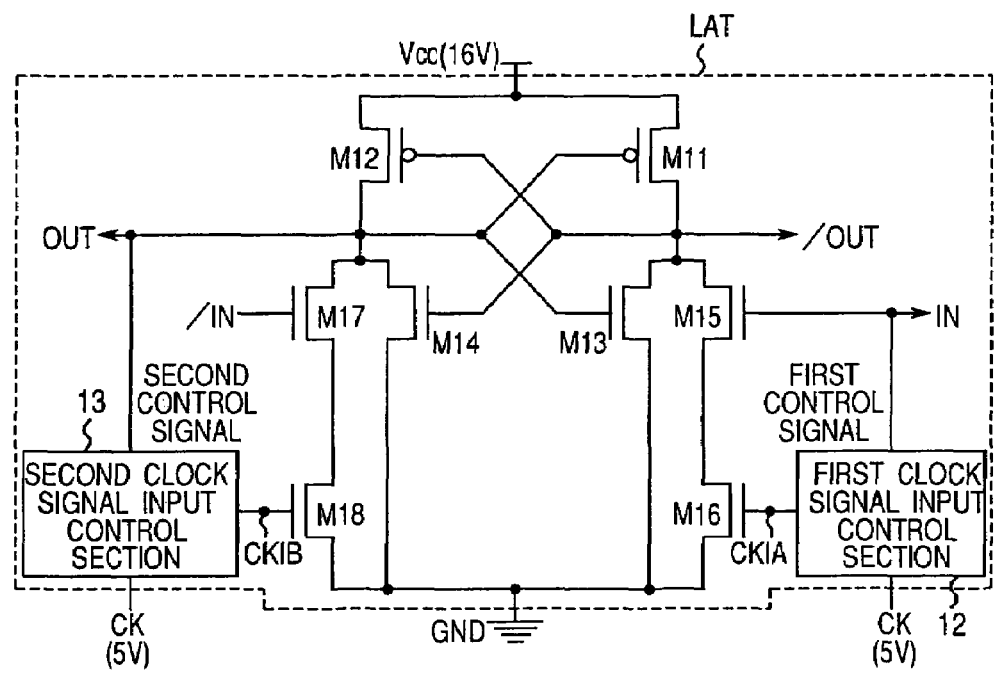
FIG. 3 is a circuit diagram showing another example of the latch circuit of FIG. 1.

FIG. 3 shows a latch circuit LAT that serves as an example of a shift register circuit constructed by incorporating the first and second clock signal input sections 12 and 13 to the latch circuit of FIG. 2.

The first clock signal input control section 12 has an input node, which is connected to the input terminal IN of the n-type transistor M15 and into which the above pulse signal is inputted as a first control signal, a clock input node CK into which the clock signal ck (clock signal /ck) is inputted and an output node CKIA connected to the gate of the n-type transistor M16. Then, the output node CKIA has the potential level "H" when the first control signal has the logic level "H" and the clock signal ck (/ck) is active.

The second clock signal input control section 13 has an input node, which is connected to the above output node OUT and into which the output pulse signal out is inputted as a second control signal, a clock input node CK into which the clock signal ck (/ck) is inputted and an output node CKIB connected to the gate of the n-type transistor M18. Then, the output node CKIB has the potential level "H" when the second control signal has the logic level "H" and the clock signal ck (/ck) is active.

Figure 4:
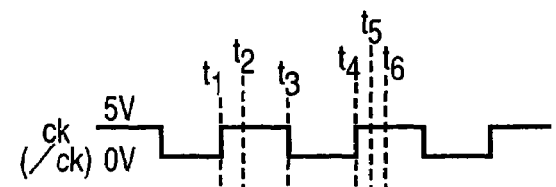
FIGS. 4A through 4G are charts of waveforms of a clock signal, input pulse signals, output signals of a clock signal input control section and output pulse signals of FIG. 3.

The latch circuit LAT having the above construction operates as follows. FIG. 4 is a chart of the waveforms of the clock signal ck (/ck) inputted to the clock input node CK, the pulse signals in and /in inputted to the input nodes IN and /IN, an output signal ckia from the output node CKIA, an output signal ckib from the output node CKIB and pulse signals out and /out outputted from the output nodes OUT and /OUT. The operation of the latch circuit LAT will be described below with reference to FIG. 3 and FIG. 4. It is to be noted that the input pulse signal in is used as the first control signal and the output pulse signal out is used as the second control signal in the present embodiment.

First, at a time point $t_1$ in FIG. 4, the clock signal ck (/ck) becomes "H (active)". Then, the input pulse signal in (first control signal) is "H", and therefore, the output signal ckia from the output node CKIA of the first clock signal input control section 12 becomes "H". Consequently, the n-type transistors M15 and M16 are turned on to make the output node /OUT have the GND level. Then, the gate potential of the p-type transistor M12 becomes "L", and the p-type transistor M12 is turned on to make the output node OUT have the Vcc (16 V) level at a time point $t_2$. Therefore, the p-type transistor M11 is turned off to fix the potential of the output node /OUT at GND.

The output pulse signal out (second control signal) from the output node OUT is Vcc and the clock signal ck (/ck) is also "H". Therefore, the output signal ckib from the second clock signal input control section 13 becomes "H" to turn on the n-type transistor M18. However, since the input pulse signal /in is "L", the n-type transistor M17 is turned off. Further, since the output node /OUT is at the GND level, the p-type transistor M14 is off. Therefore, the potential of the output node OUT is fixed at Vcc.

That is, the latch circuit LAT of the present embodiment operates as a normal level shifter circuit as shown in FIG. 36 when the first and second control signals have the logic level "H" and the clock signal ck (/ck) is active.

Subsequently, at a time point $t_3$ in FIG. 4, the clock signal ck (/ck) becomes "L". Then, the output signals ckia and ckib from the first and second clock signal input control sections 12 and 13 become "L". Therefore, the n-type transistors M16 and M18 are turned off and the latch circuit LAT operates simply as a level hold circuit, so that the level of the output node /OUT is kept at GND and the level of the output node OUT is kept at Vcc (16 V).

That is, the latch circuit LAT of the present embodiment operates as a level hold circuit except for the case where it operates as a level shifter circuit in the interval between the time point $t_1$ and the time point $t_3$.

Subsequently, at a time point $t_4$, the clock signal ck (/ck) becomes "H". Then, the output pulse signal out (second control signal) is "H", and therefore, the output signal ckib from the output node CKIB of the second clock signal input control section 13 becomes "H". The input inverted pulse signal /in is "H". Consequently, the n-type transistors M17 and M18 are turned on, so that the output node OUT comes to have the GND level at a time point $t_5$ and the output signal ckib becomes "L". Then, the gate potential of the p-type transistor M11 becomes "L" to turn on the p-type transistor M11, and the output node /OUT comes to have the Vcc (16 V) level at a time point $t_6$.

As described above, the latch circuit LAT of the present embodiment operates as a level shifter circuit when the first and second control signals have the logic level "H" and the clock signal ck (/ck) is active and operates as a level hold circuit in any other case. That is, the present latch circuit LAT functions as a latch circuit having a level shifter function. Therefore, by constructing the shift register circuit 11 by serially connecting the plurality of the present latch circuits LAT as shown in FIG. 1, the circuit can be operated with a clock signal having an amplitude lower than the drive voltage (Vcc), so that the consumption of power of the external circuit for generating the clock signal can be reduced.

Further, as shown in FIG. 4, the leading edge of the output signal out is delayed behind the trailing edge of the output pulse signal /out. Therefore, if the shift register circuit 11 is constructed by serially connecting the plurality of the present latch circuits LAT, then a specified time interval can be provided between the leading edges of the output pulse signals out of adjacent two latch circuits LAT. Therefore, by employing the present shift register circuit 11 in the data signal line drive circuit of the image display device, the sampling signals corresponding to the adjacent data signal lines can be prevented from overlapping each other even if the characteristics of the transistors M11 through M18 change and consequently a slight deviation occurs in terms of timing between output signals from adjacent two latch circuits LAT. Therefore, no noise is superimposed on the data signal lines, therefore eliminating the concern about the occurrence of troubles such as blur, ghost and crosstalk on the display image.

In the above case, as shown in FIG. 4, the pulse width of the above output signal becomes different from the pulse width of the clock signal, however, the change in level occurs similarly in the latch circuit LAT of any stage. Accordingly, the pulse width of the output signal does not change alternately in the latch circuits LAT of the stages. Therefore, in the aforementioned data signal line drive circuit, no deviation occurs in terms of timing when taking in the image data into the data signal lines, and a satisfactory display quality can be obtained.

Furthermore, as described above, the latch circuit LAT of the present embodiment operates as a level hold circuit to merely keep the specified state regardless of the state of the clock signal ck (/ck) in the inactive state, and therefore, the clock signal ck (/ck) is not necessitated. Therefore, by electrically disconnecting the clock input node CK from the output nodes CKIA and CIKB in the first and second clock signal input control sections 12 and 13 in the case of the inactive state, the load and the consumption of power of the clock signal line can be reduced.

Figure 5:
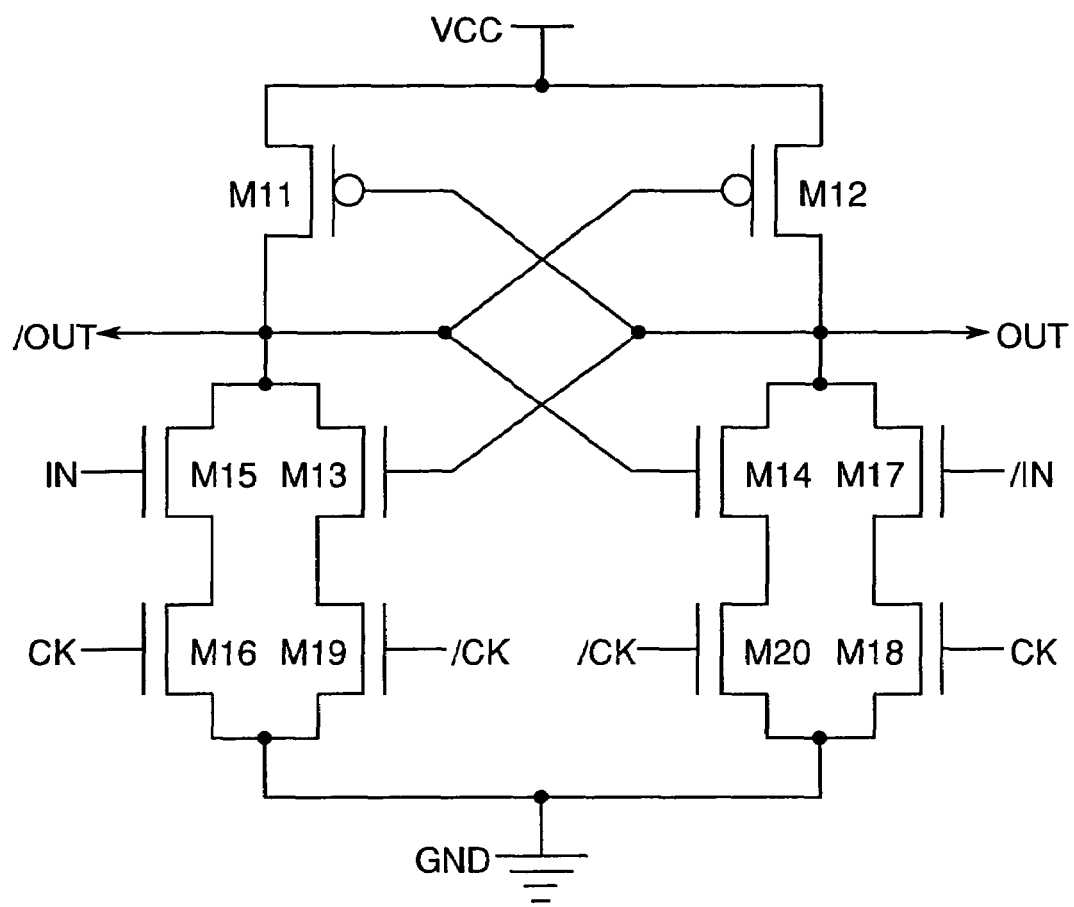
FIG. 5 is a circuit diagram showing an example of the latch circuit constituting the shift register shown in FIG. 8.

FIG. 5 shows another example of a latch circuit according to the present invention.

This latch circuit differs from the latch circuit of FIG. 2 only in that transistors M19 and M20 that serve as the seventh and eighth n-type transistors of which the gate electrodes receive the inverted clock signal /ck as inputs are provided on the ground potential GND side of the first and second n-type transistors M13 and M14 of FIG. 2. That is, the source electrode and drain electrode of the transistor M19 are connected to the drain electrode of the transistor M13 and the ground potential GND, respectively, while the source electrode and drain electrode of the transistor M20 are connected to the drain electrode of the transistor M14 and the ground potential GND, respectively.

The latch circuit shown in FIG. 5 operates similarly to the level shifter circuit described with reference to FIG. 2. That is, a level shifter circuit is constituted by the transistors M11, M12, M13 and M15 when the clock signal ck is active, and a latch circuit (two inverter circuits that are connected to each other) is constituted by the transistors M11, M12, M17 and M18 when the inverted clock signal /ck is active. The waveforms of the clock signals (ck and /ck), input pulse signals (IN and /IN) and the output pulse signals (OUT and /OUT) of this latch circuit are the same as the signal waveforms described with reference to FIG. 4 except that the signals ckia and ckib do not exist.

The above latch circuit operates as a circuit that concurrently has a level shifter function and a latch (hold) function, and some transistors (M11 and M12) of the circuit construction for managing the level shifter function and the latch function are commonly owned. Therefore, the circuit size does not extremely expand as compared with the case where separate circuit constructions are provided.

As a result, the above latch circuit can output a relatively large drive voltage Vcc by inputting the clock signals ck and /ck or the pulse signals IN and /IN having a small amplitude.

It is to be herein noted that the serially connected transistors may be replaced with each other in terms of position (this can also hold true in the other embodiments).

Figure 6:
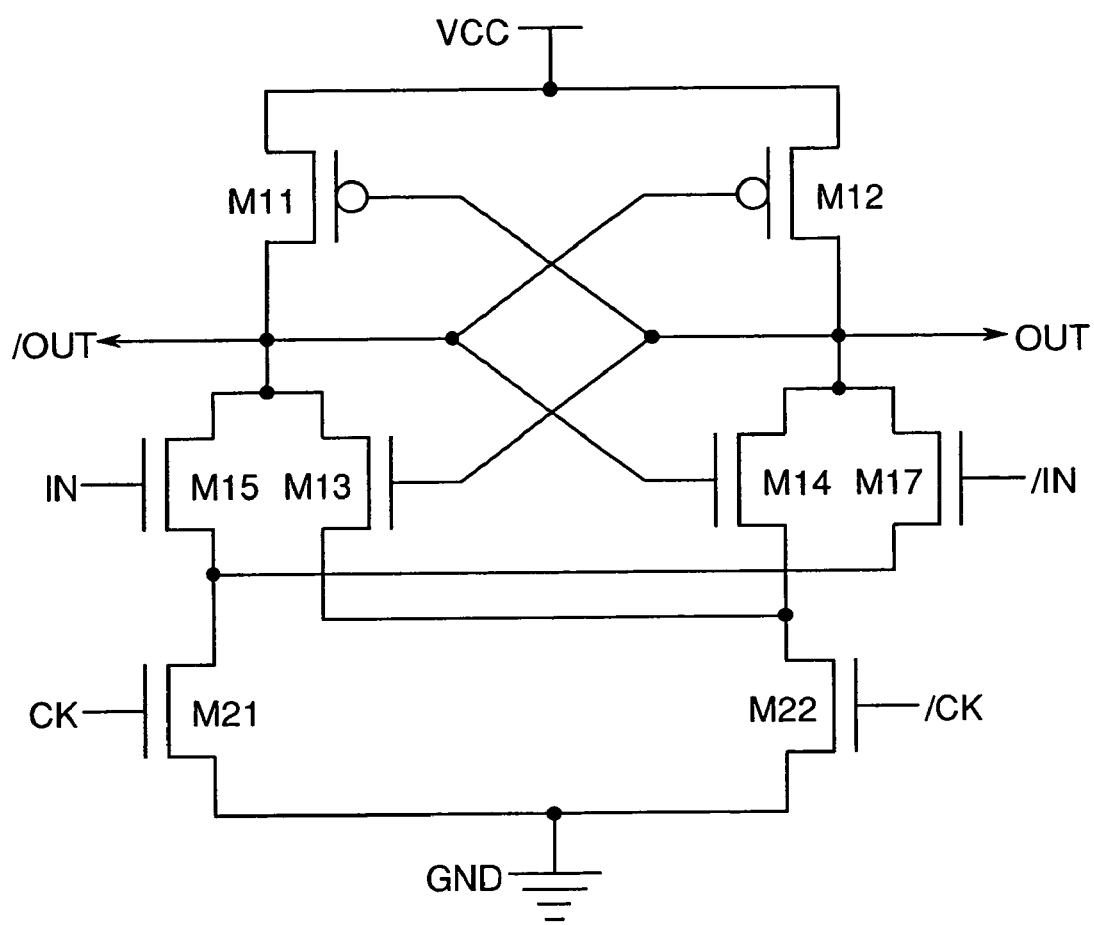
FIG. 6 is a circuit diagram showing another example of the latch circuit of FIG. 1.

FIG. 6 shows an example of the latch circuit mentioned in claim 6.

The latch circuit of FIG. 6 differs from the latch circuit of FIG. 2 only in that n-type transistors M21 and M22 are employed as the ninth and tenth n-type transistors in place of the n-type transistors M16 and M18 of the latch circuit of FIG. 2, the source electrode and drain electrode of the n-type transistor M21 are connected to the drain electrodes of the n-type transistors M15 and M17 and the ground potential GND, respectively, and the source electrode and drain electrode of the n-type transistor M22 are connected to the drain electrode of the n-type transistors M13 and M14 and the ground potential GND, respectively.

That is, in this latch circuit, the transistors M16 and M18 into which the clock signal (ck) of FIG. 2 is inputted are provided by the one common transistor M21, and the common transistor M22 into which the inverted clock signal (/ck) is inputted is provided on the ground terminal side of the transistors M13 and M14 of FIG. 2. Therefore, by virtue of the common used of the transistor, the latch circuit is allowed to have a small number of elements and a reduced circuit size as compared with the latch circuit described with reference to FIG. 5.

It is to be noted that the present invention can also hold even if the polarities of all the transistors are made inverse to those of the present embodiment or if the polarities of the power source and the signals are all inverted, when the effects similar to the aforementioned effects can be expected. The same thing can be said for not only the present embodiment but also the other embodiments (provided that, if any logical product circuit and logical sum circuit are employed, then they must be replaced by a logical sum circuit and a logical product circuit, respectively).

Figure 7:
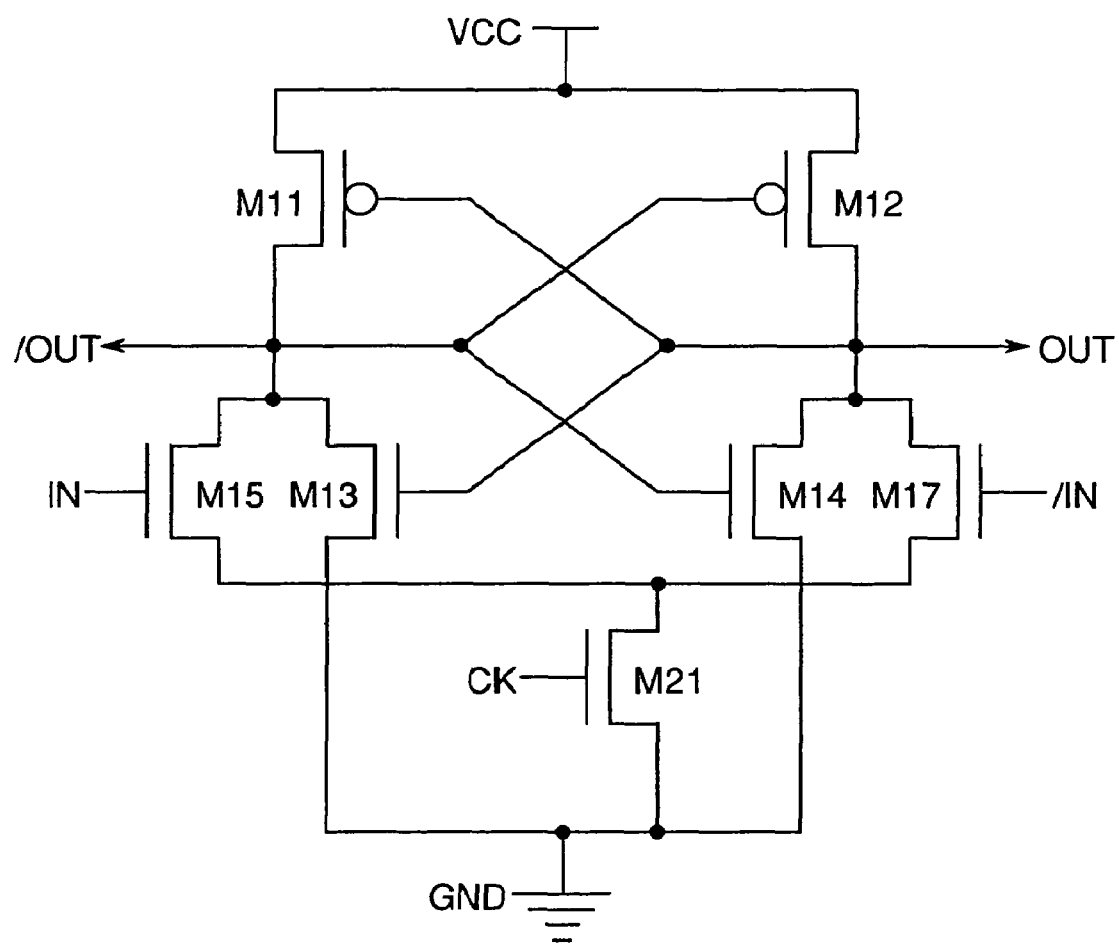
FIG. 7 is a circuit diagram showing another example of the latch circuit of FIG. 1.

FIG. 7 shows another example of a latch circuit according to the present invention.

This latch circuit differs from the latch circuit of FIG. 2 only in that the n-type transistor M21 is employed as the ninth n-type transistor in place of the n-type transistors M16 and M18 of the latch circuit of FIG. 2 and the source electrode and drain electrode of the n-type transistor M21 are connected to the drain electrodes of the n-type transistors M15 and M17 and the ground potential GND, respectively.

That is, in this latch circuit, the transistors M16 and M18 into which the clock signal (ck) is inputted in the latch circuit of FIG. 2 are provided by one transistor M21, and therefore, the number of elements can further be reduced.

Figure 8:
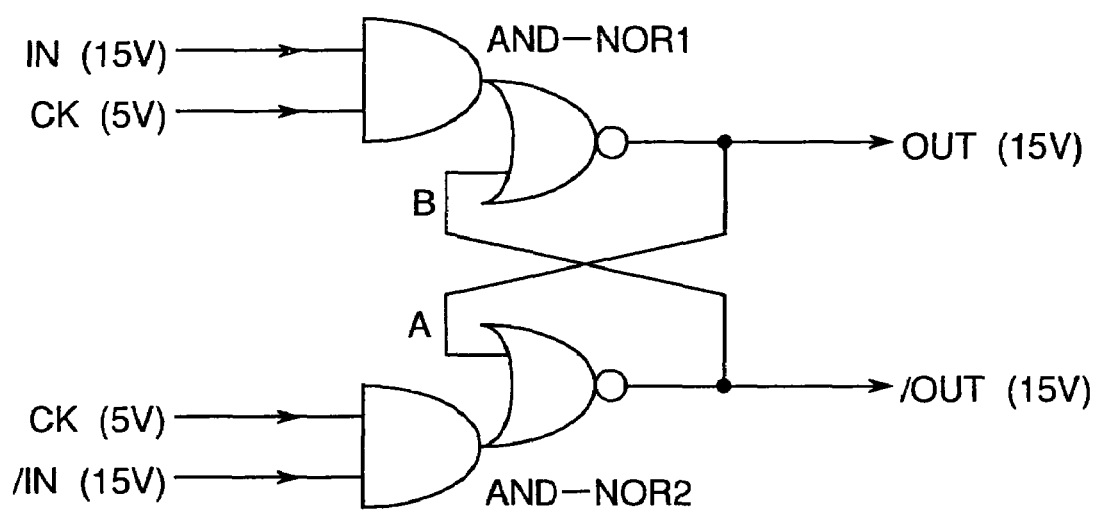
FIG. 8 is a circuit diagram showing another example of the latch circuit of FIG. 1.

FIG. 8 shows another example of a latch circuit according to the present invention.

This latch circuit is constructed of first and second logical product and non-disjunction circuits AND-NOR1 and AND-NOR2. The logical product circuit section of the first logical product and non-disjunction circuit AND-NOR1 receives the clock signal (CK) and the pulse signal (IN) as inputs, while the non-disjunction circuit section of the first logical product and non-disjunction circuit AND-NOR1 receives an output signal of the above logical product circuit section and an output signal B (/OUT) of the second logical product and non-disjunction circuit AND-NOR2 as inputs. The logical product circuit section of the second logical product and non-disjunction circuit AND-NOR2 receives the clock signal (CK) and the pulse signal (/IN) as inputs, while the non-disjunction circuit section of the second logical product and non-disjunction circuit AND-NOR2 receives an output signal of the above logical product circuit section and an output signal A (OUT) of the first logical product and non-disjunction circuit AND-NOR1 as inputs.

In the above case, the amplitude of one of the input signals (one of IN and CK) is made smaller than the drive voltage Vcc. It is to be noted that the signals (CK and IN or /CK and /IN) necessitate the respective inverted signals, however, they are not shown.

Figure 9:
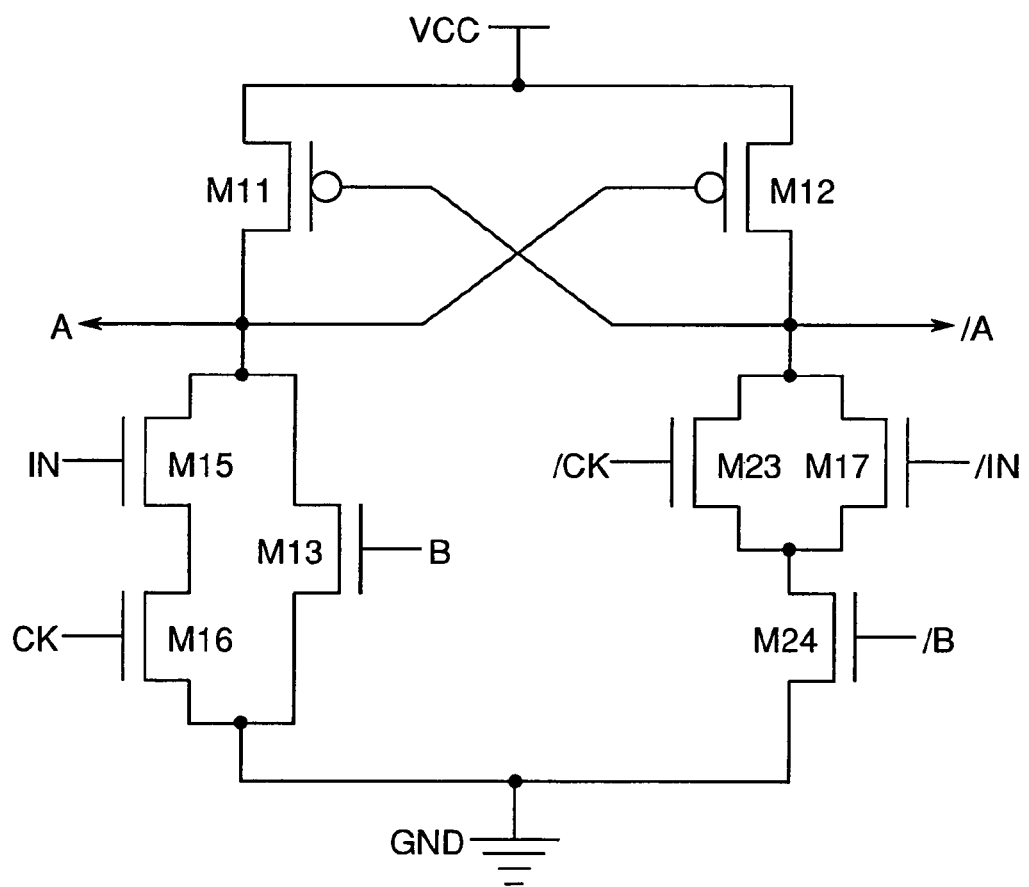
FIG. 9 is a diagram showing an example of a logical product and non-disjunction circuit constituting the latch circuit of FIG. 8.

FIG. 9 shows an example of a latch circuit constituting the logical product and non-disjunction circuits AND-NOR1 and AND-NOR2 shown in FIG. 8.

This latch circuit differs from the latch circuit of FIG. 2 only in that a transistor M23 is employed as the eleventh n-type transistor of which the gate electrode receives the inverted clock signal (/ck) as an input in place of the n-type transistor M14 of the latch circuit of FIG. 2 and a transistor M24 is employed as the twelfth n-type transistor of which the gate electrode receives the inverted signal B(/OUT) of the output signal as an input and the source electrode is also connected to the transistor M23.

Also, with the above construction, a logical result of the desired amplitude (power source amplitude) can be obtained by inputting clock signals (CK and /CK) having an amplitude smaller than that of the power voltage.

It is to be noted that the transistors M17 and M23 may be replaced with the transistor M24 in terms of position in FIG. 9 as described earlier.

Figure 10:
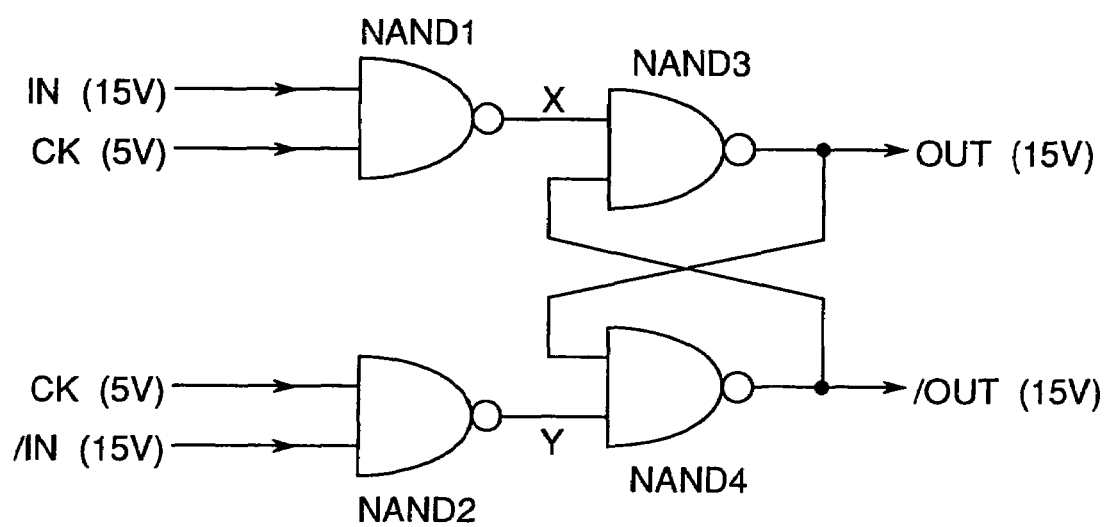
FIG. 10 is a circuit diagram showing another example of the latch circuit of FIG. 1.

FIG. 10 shows another example of a latch circuit according to the present invention.

This latch circuit is constructed of first through fourth non-conjunction circuits NAND1, NAND2, NAND3 and NAND4. The first non-conjunction circuit NAND1 receives the clock signal (CK) and the pulse signal (IN) as inputs, while the second non-conjunction circuit NAND2 receives the clock signal (CK) and the inverted pulse signal (/IN) as inputs. The third non-conjunction circuit NAND3 receives an output signal X of the first non-conjunction circuit NAND1 and an output signal (/OUT) of the fourth non-conjunction circuit NAND4 as inputs, while the fourth non-conjunction circuit NAND4 receives an output signal Y of the second non-conjunction circuit NAND2 and an output signal (OUT) of the third non-conjunction circuit NAND3 as inputs.

Also, in this latch circuit, the amplitude of one (IN or /IN) of the signals inputted to the first and second non-conjunction circuits NAND1 and NAND2 can be made smaller than the drive voltage Vcc. It is to be herein noted that the signals (CK and IN or /CK and /IN) necessitate the respective inverted signals, however, they are not shown.

Figure 11:
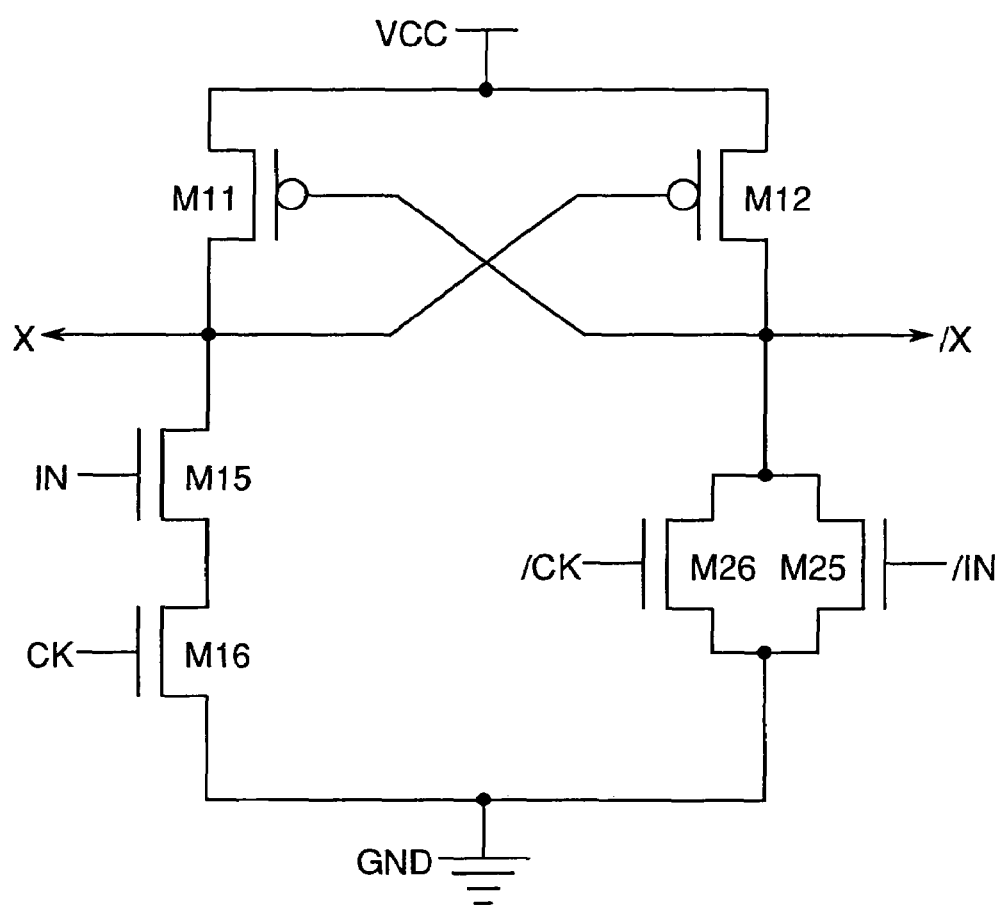
FIG. 11 is a diagram showing an example of a logical product and non-disjunction circuit constituting the latch circuit of FIG. 10.

FIG. 11 shows an example of a latch circuit constituting the first and second non-conjunction circuits NAND1 and NAND2 shown in FIG. 10.

This latch circuit differs from the latch circuit of FIG. 9 only in that the transistor M13 and the transistor M24 of the latch circuit of FIG. 9 are removed and the transistors M17 and M23 of FIG. 9 are replaced by transistors M25 and M26 that serve as the thirteenth and fourteenth n-type transistors of which the drain electrodes are connected to the ground potential GND.

Also, with this construction, a logical result of the desired amplitude (power source amplitude) can be obtained by inputting clock signals (CK and /CK) having an amplitude smaller than that of the power voltage.

Figure 12:
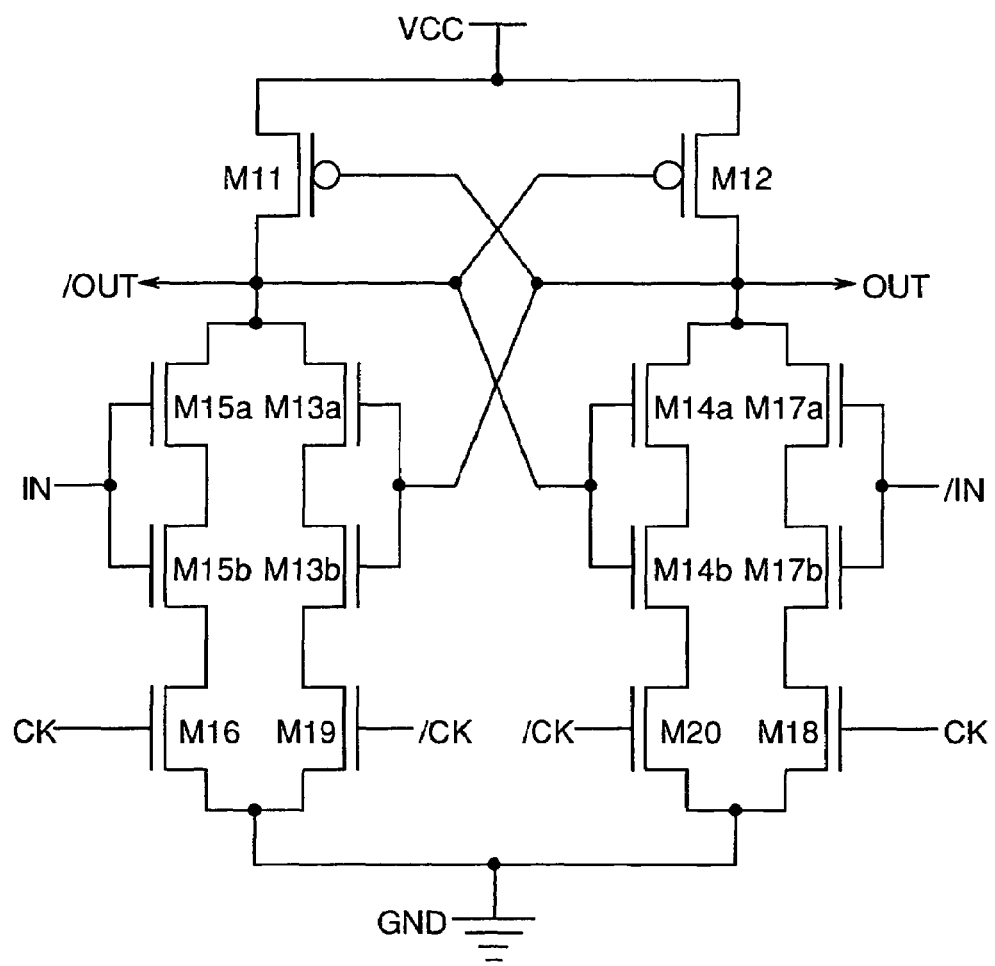
FIG. 12 is a circuit diagram showing another example of the latch circuit of FIG. 1.

FIG. 12 shows another example of a latch circuit according to the present invention.

In this latch circuit, the transistors M13, M14, M15 and M17 located on the output terminals OUT and /OUT side of the n-type transistors of FIG. 5 are provided by transistors M13a, M13b, M14a, M14b, M15a, M15b, M17a and M17b that have a dual-gate structure as illustrated and the transistors M16, M18, M19 and M20 located on the ground potential GND side have a single-gate structure.

With this arrangement, the reliability of the circuit can be improved while suppressing an increase in input capacity to the minimum.

Figure 13:
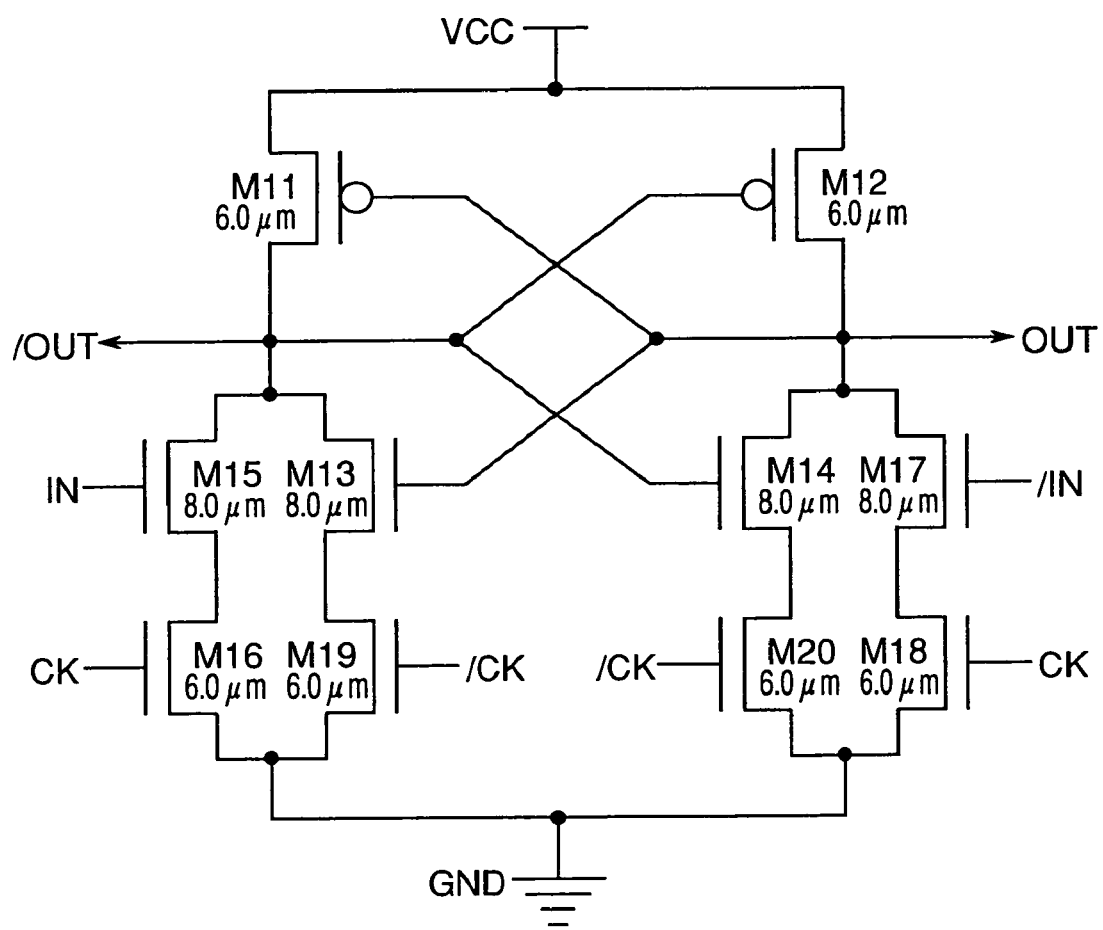
FIG. 13 is a circuit diagram showing another example of the latch circuit of FIG. 1.

FIG. 13 shows an example of the latch circuit according to the present invention.

In this latch circuit, the transistors M16, M18, M19 and M20 located on the ground potential GND side of the n-type transistors of FIG. 5 are made to have a channel length of 6 μm and the transistors M13, M14, M15 and M17 located on the output terminals OUT and /OUT side are made to have a long channel length of 8 μm. With this arrangement, the reliability of the circuit can be improved while suppressing an increase in input capacity to the minimum.

Figure 14:
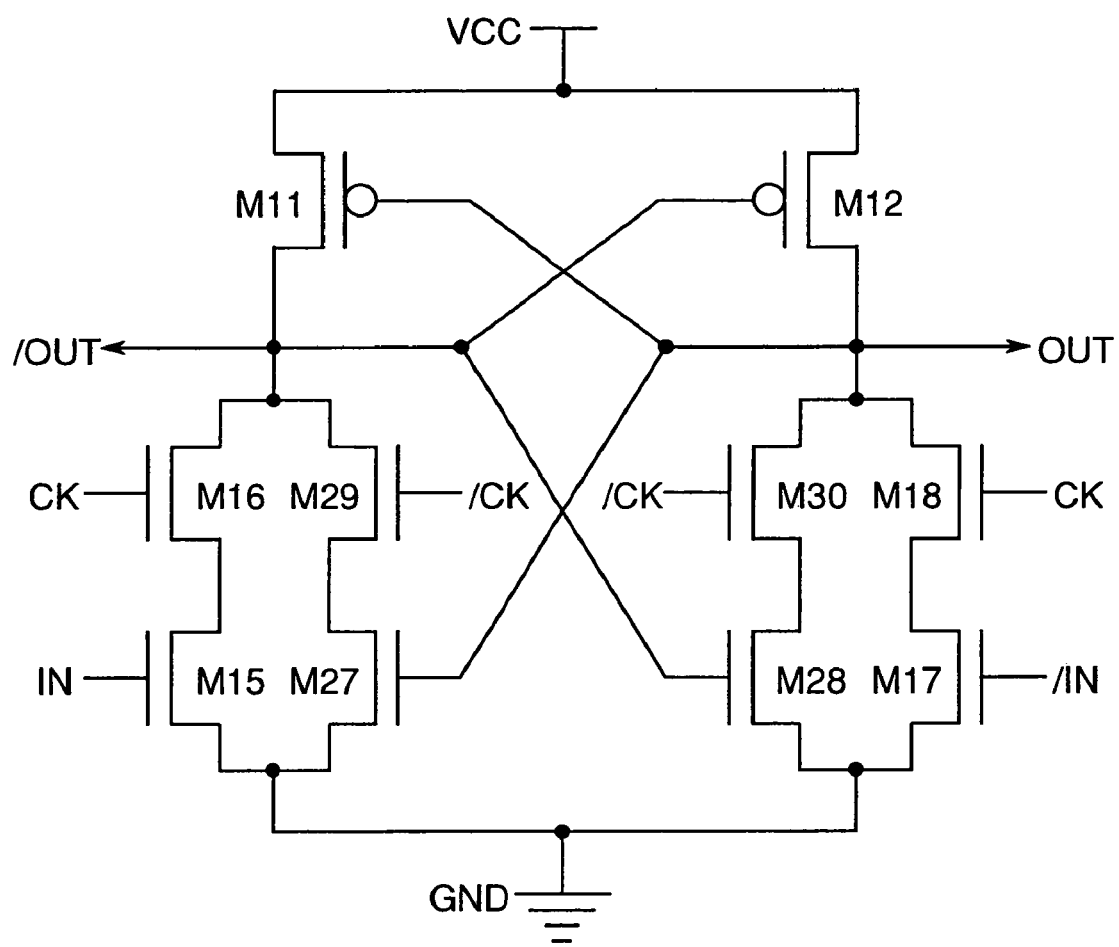
FIG. 14 is a circuit diagram showing another example of the latch circuit of FIG. 1.

FIG. 14 shows a modification example of the latch circuit described with reference to FIG. 5. This latch circuit differs from the latch circuit of FIG. 5 in that the transistors M13 and M14 located on the output terminals OUT and /OUT side of FIG. 5 are replaced by n-type transistors M27 and M28, the transistors M19 and M20 located on the ground potential GND side of FIG. 5 are replaced by n-type transistors M29 and M30, the series connection of these transistors being inverted, and the series connections of the transistors M15 and M16 and M17 and M18 of FIG. 5 are inverted. It is to be noted that the signals IN and CK and /IN and CK inputted to the gate electrodes of the transistors M15 and M16 and M17 and M18 of FIG. 14 can be inverted. With this inversion, the signals (CK and /CK) having the smaller amplitude are inputted to the transistors M15 and M17 located on the ground potential GND side of FIG. 14, so that the operation becomes stabilized and the operating speed also improves. That is, the construction of FIG. 5 is more preferable to the construction of FIG. 14.

Figure 15:
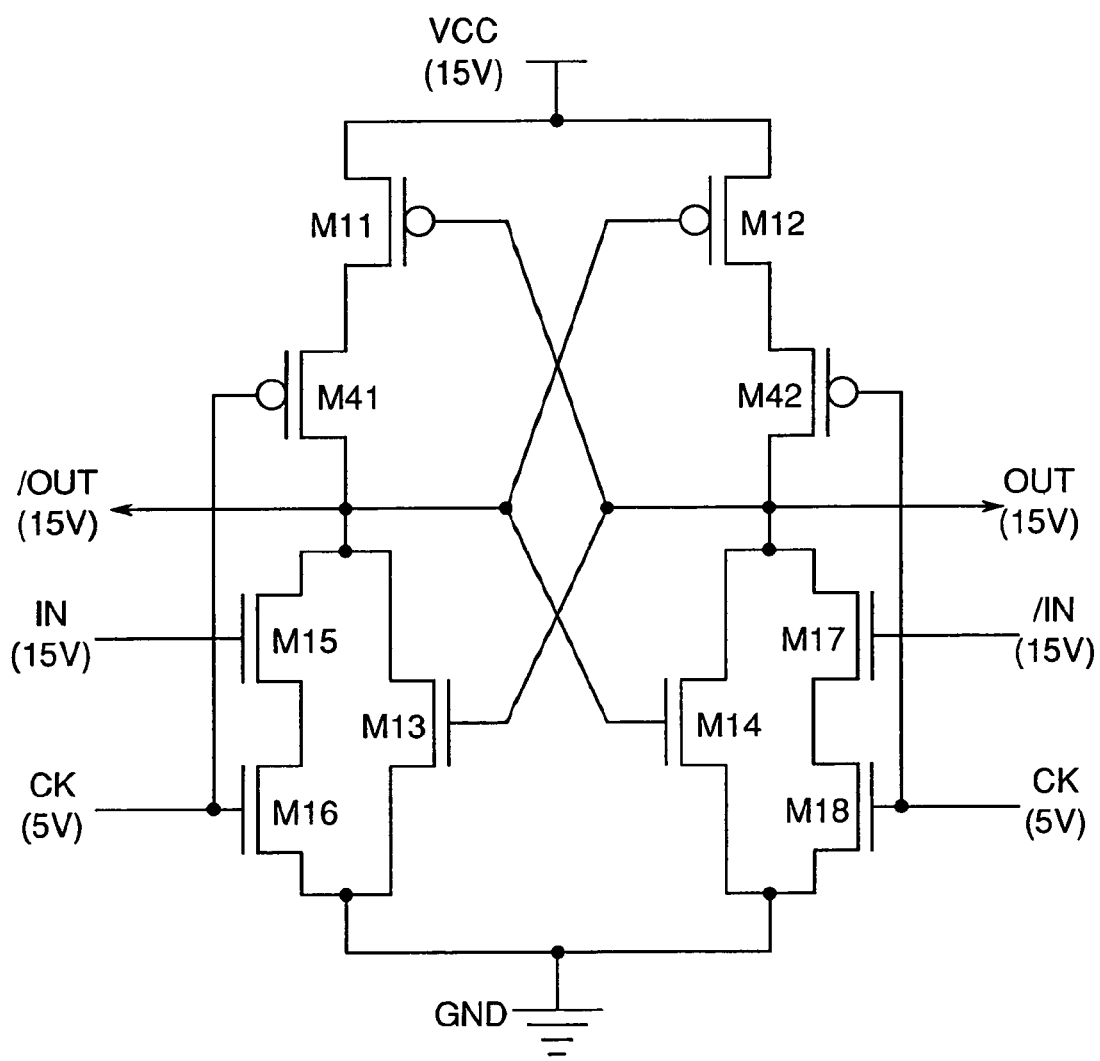
FIG. 15 is a circuit diagram showing a modification example of the latch circuit of FIG. 2.

FIG. 15 shows an example of the latch circuit mentioned in claim 12.

This latch circuit is a modification example obtained by incorporating transistors M41 and M42 that serve as the third and fourth p-type transistors into the latch circuit described with reference to FIG. 2. The third p-type transistor M41 has a source electrode connected to the drain electrode of the first p-type transistor M11, a drain electrode connected to the source electrode of the first n-type transistor M13 and a gate electrode connected to the gate electrode of the fourth n-type transistor M16 into which the clock signal (CK) is inputted. The fourth p-type transistor M42 has a source electrode connected to the drain electrode of the second p-type transistor M12, a drain electrode connected to the source electrode of the second n-type transistor M14 and a gate electrode connected to the gate electrode of the sixth n-type transistor M18 into which the clock signal (CK) is inputted.

According to this latch circuit, the third and fourth p-type transistors M41 and M42 of which the gate electrodes receive the clock signal (CK) as the input are additionally provided between the power potential Vcc of the latch circuit and both the output nodes OUT and /OUT of FIG. 2. With this arrangement, in an operating stage during which both the output nodes OUT and /OUT come to have the low level (ground potential), the p-type transistors M41 and M42 operate so as to limit the current from the power potential Vcc side, thereby increasing the operating margin.

Figure 16:
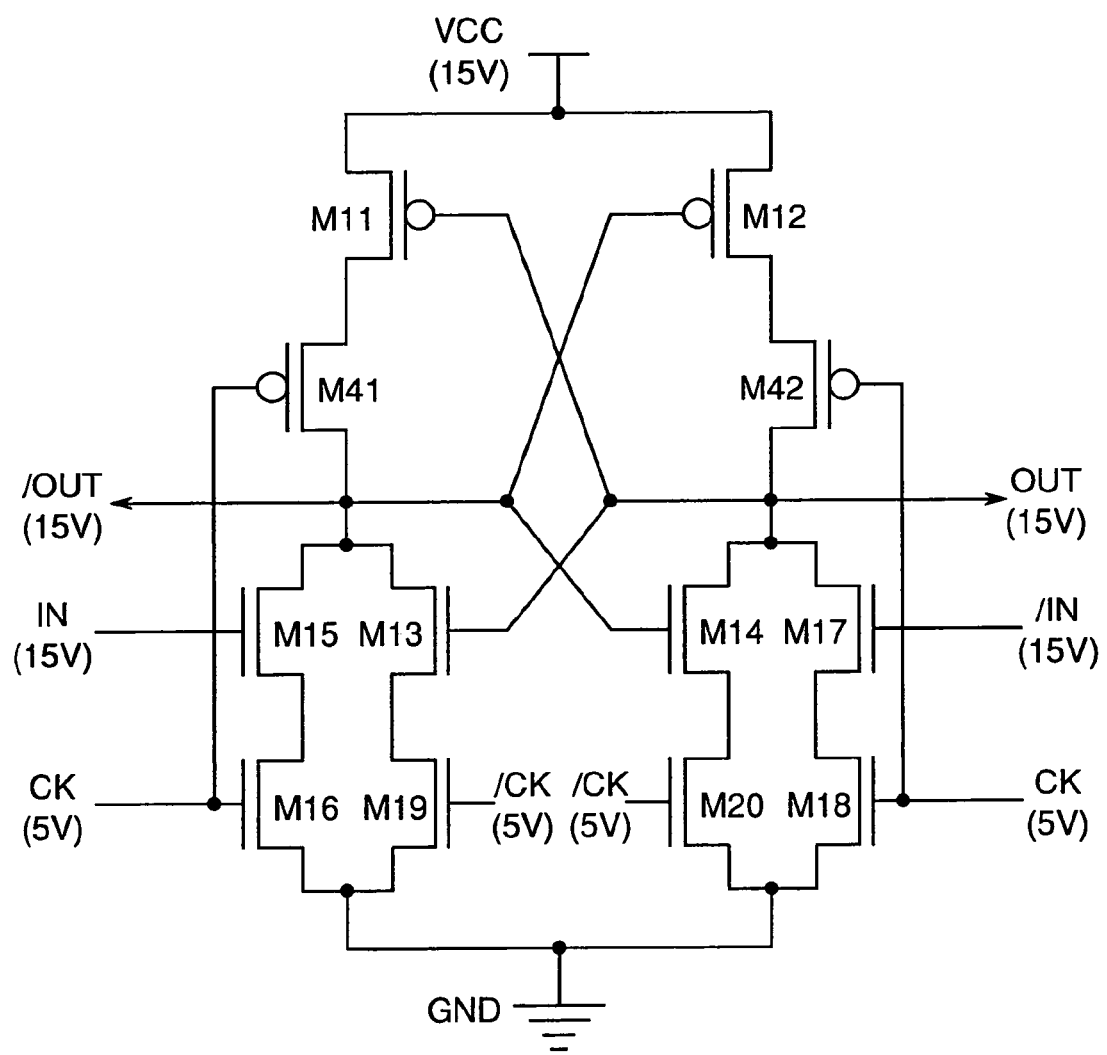
FIG. 16 is a circuit diagram showing a modification example of the latch circuit of FIG. 5.

FIG. 16 shows another example of a latch circuit according to the present invention.

This latch circuit is a modification example obtained by incorporating through connection transistors M41 and M42 that serve as the third and fourth p-type transistors, similar to those described with reference to FIG. 15, into the latch circuit described with reference to FIG. 5.

Therefore, according to this latch circuit, the third and fourth p-type transistors M41 and M42 of which the gate electrodes receive the clock signal (CK) as the input are additionally provided between the power potential Vcc of the latch circuit and both the output nodes OUT and /OUT of FIG. 5. With this arrangement, in an operating stage during which both the output nodes OUT and /OUT come to have the low level (ground potential), the p-type transistors M41 and M42 operate so as to limit the current from the power potential Vcc side, thereby increasing the operating margin.

Figure 17:
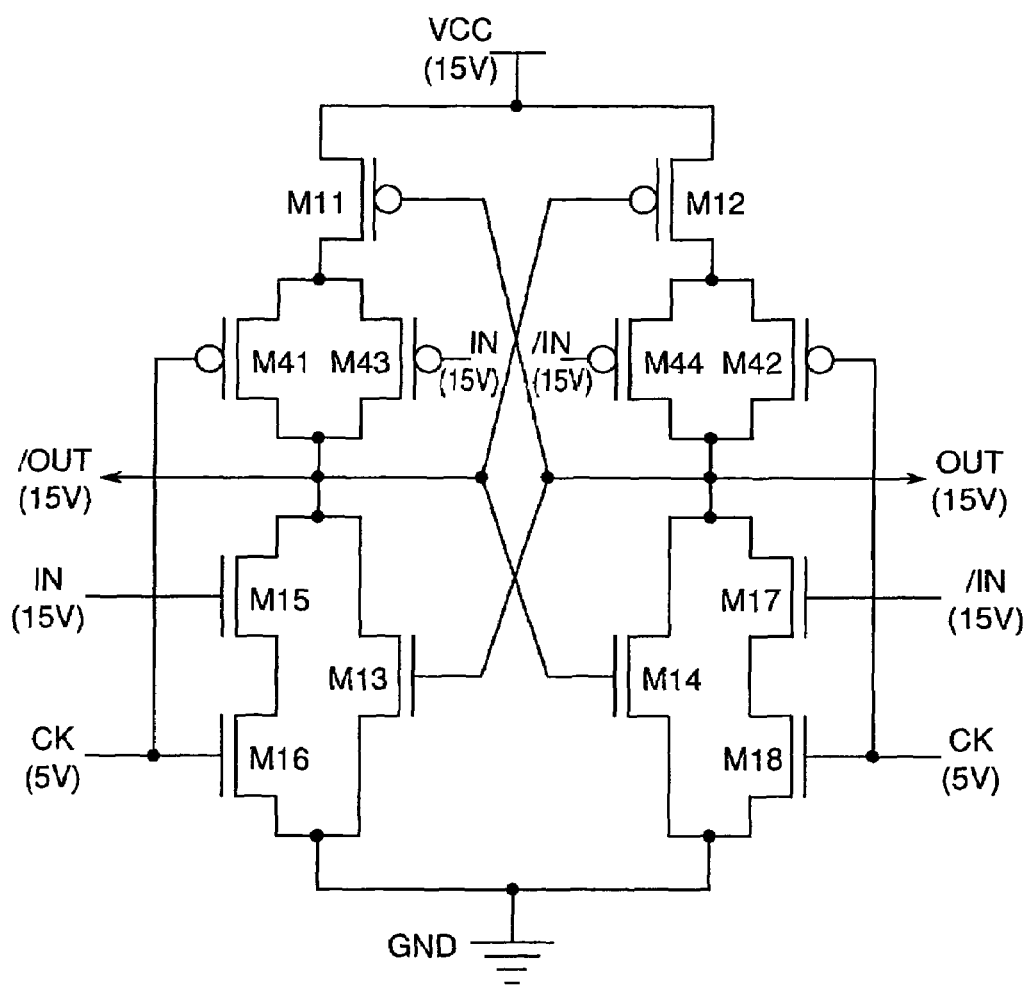
FIG. 17 is a circuit diagram showing another modification example of the latch circuit of FIG. 2.

FIG. 17 shows another example of a latch circuit according to the present invention.

This latch circuit is a modification example obtained by incorporating transistors M41, M42, M43 and M44 that serve as the third through sixth p-type transistors into the latch circuit described with reference to FIG. 2. The third and fourth p-type transistors M41 and M42 are connected between the first and second p-type transistors M11 and M12 and the first and second n-type transistors M13 and M14 similar to the description with reference to FIG. 15. On the other hand, the fifth p-type transistor M43 and the sixth p-type transistor M44 are connected in parallel with the third p-type transistor M41 and the fourth p-type transistor M42, respectively. The input pulse signal (IN) and the inverted signal (/IN) of the input pulse signal are inputted to the gate electrode of the fifth p-type transistor M43 and the gate electrode of the sixth p-type transistor M44, respectively.

In this latch circuit, between the power potential Vcc and both the output nodes OUT and /OUT of the latch circuit of FIG. 2 are additionally provided the third and fifth p-type transistors M41 and M43 which are connected in parallel with each other and the gate electrodes of which receive the clock signal (CK) and the input pulse signal (IN), respectively, as inputs, as well as the fourth and sixth p-type transistors M42 and M44 which are connected in parallel with each other and the gate electrodes of which receive the clock signal (CK) and the inverted input pulse signal (/IN), respectively as inputs. With this arrangement, in the operating stage during which both the output nodes OUT and /OUT come to have the low level (ground potential), the p-type transistors M41, M42, M43 and M44 operate so as to limit the current from the power potential Vcc side, thereby further increasing the operating margin.

Figure 18:
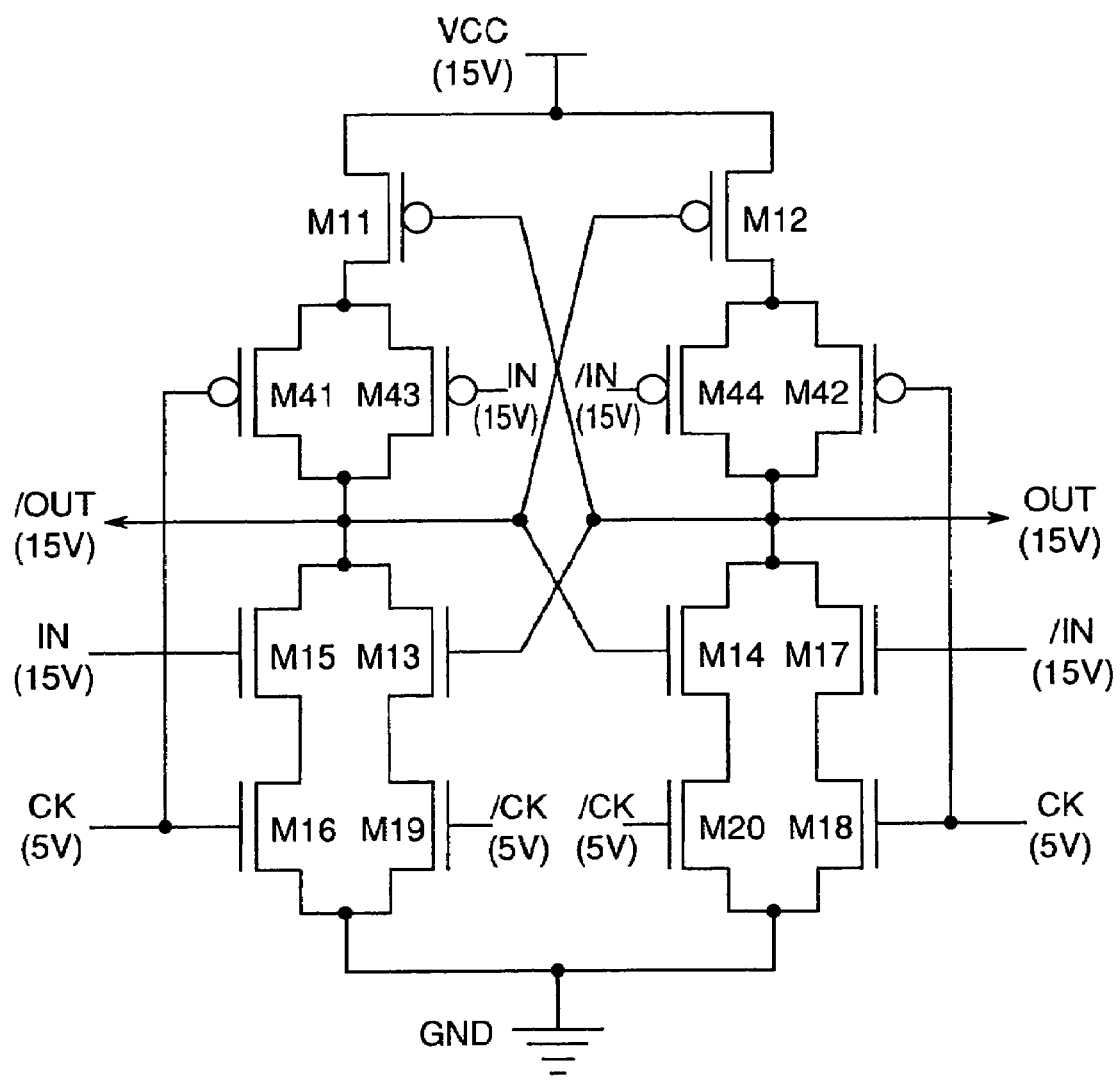
FIG. 18 is a circuit diagram showing another modification example of the latch circuit of FIG. 5.

FIG. 18 shows another example of a latch circuit according to the present invention.

This latch circuit is a modification example obtained by incorporating through connection the transistors M41 through M44 that serve as the third through sixth p-type transistors, similar to those described with reference to FIG. 17, into the latch circuit described with reference to FIG. 5.

Therefore, in this latch circuit, between the power potential Vcc and both the output nodes OUT and /OUT of the latch circuit of FIG. 5 are additionally provided the third and fifth p-type transistors M41 and M43 which are connected in parallel with each other and the gate electrodes of which receive the clock signal (CK) and the input pulse signal (IN), respectively, as inputs, as well as the fourth and sixth p-type transistors M42 and M44 which are connected in parallel with each other and the gate electrodes of which receive the clock signal (CK) and the inverted input pulse signal (/IN), respectively, as inputs. With this arrangement, in the operating stage during which both the output nodes OUT and /OUT come to have the low level (ground potential), the p-type transistors M41, M42, M43 and M44 operate so as to limit the current from the power potential Vcc side, thereby further increasing the operating margin.

The first and second clock signal input control sections 12 and 13, which are described with reference to FIG. 3, will be described more concretely below. It is to be noted that the first clock signal input control section 12 and the second clock signal input control section 13 have the same circuit construction, and therefore, the following description will be provided for the first clock signal input control section 12 as a representative.

Figure 19:
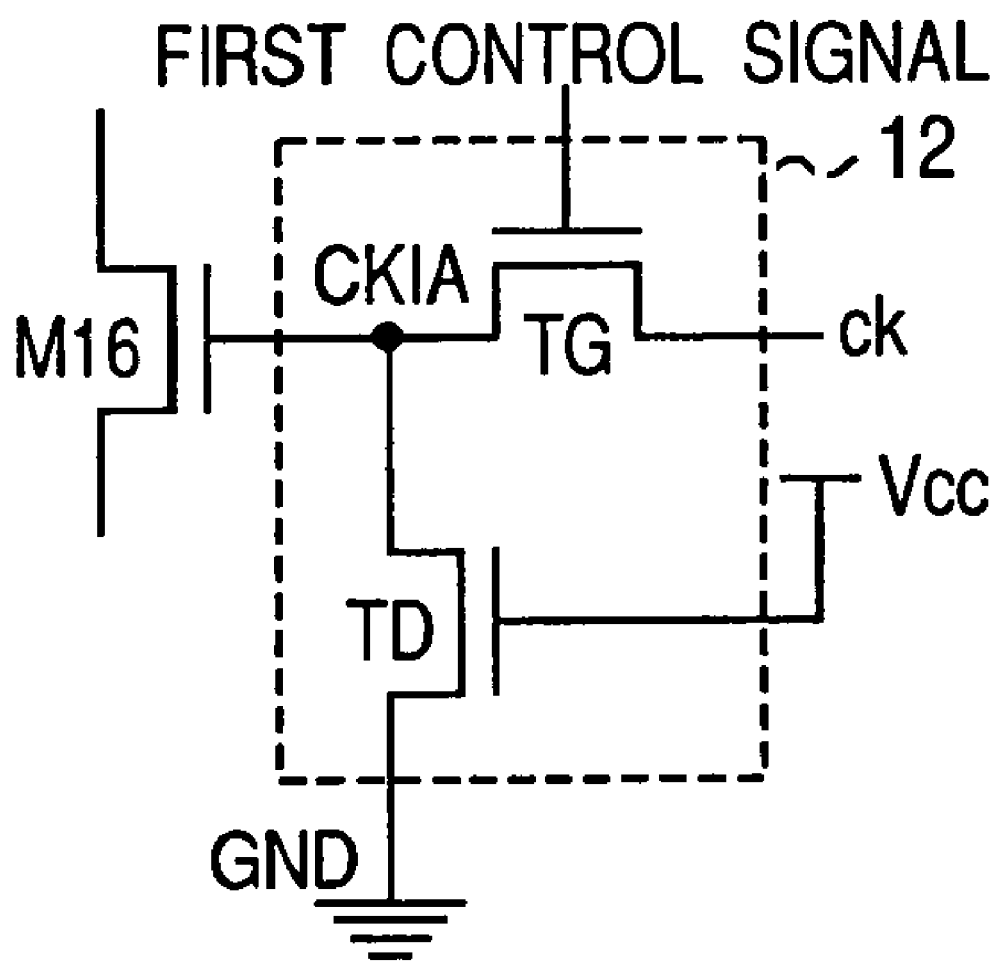
FIG. 19 is a diagram showing an example of the circuit construction of the clock signal input control section of FIG. 3.

FIG. 19 shows an example of the first clock signal input control section 12 of a shift register according to the present invention.

The first clock signal input control section 12 is constructed roughly of two n-type transistors TG and TD that serve as a switching means and a potential fixing means, respectively. Then, the drain electrode of the transistor TG that serves as the fifteenth n-type transistor constituting the switching means is connected to the gate of the n-type transistor M16 that constitutes the latch circuit LAT, thereby forming the aforementioned output node CKIA. Then, the clock input node CK is connected to the source electrode of the transistor TG, while the first control signal (input pulse signal in) is inputted to the gate electrode. The source electrode of the transistor TD that serves as the seventeenth n-type transistor constituting the potential fixing means is connected to the output node CKIA, while the ground potential GND is connected to the drain electrode. Further, the gate electrode is connected to the power potential Vcc (=16V). It is to be noted that the second clock signal input control section 13 is similarly provided with a sixteenth n-type transistor that serves as a switching means and an eighteenth n-type transistor that serves as a potential fixing means.

In the first clock signal input control section 12 having the above construction, if the logic level of the first control signal (input pulse signal in) becomes "H", then the n-type transistor TG is turned on to connect the clock input node CK to the output node CKIA, so that the clock signal ck is inputted to the n-type transistor M16. The input pulse signal in is also inputted to the gate of the n-type transistor M15. Consequently, as described above, the n-type transistors M15 and M16 that are connected in series with each other are turned on in the case where the input pulse signal in and the output pulse signal out are "H" and the clock signal ck (/ck) is active, so that the latch circuit LAT operates as a level shifter circuit.

By contrast, if the logic level of the first control signal in is "L", then the n-type transistor TG is turned off to put the output node CKIA into a floating state. Therefore, the gate electrode is connected to the power potential Vcc, while the drain electrode is connected to the ground potential GND, so that the potential of the output node CKIA is fixed by using the ON-state resistance of the n-type transistor TD that is consistently in the ON-state as a pull-down resistance. Consequently, as described above, the n-type transistor M16 is turned off regardless of the state of the clock signal ck (/ck), and the latch circuit LAT operates as a level hold circuit.

That is, in this first clock signal input control section 12, the n-type transistor TG constitutes the switching means, while the n-type transistor TD, power potential Vcc and ground potential GND constitute the potential fixing means.

Figure 20:
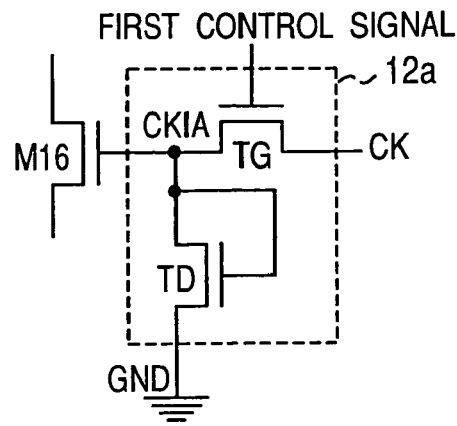
FIG. 20 is a diagram showing an example of the circuit construction different from that of FIG. 19.

FIG. 20 shows an example of the first clock signal input control section 12 of the shift register mentioned in claim 27. Similar to the case of FIG. 19, between the gate electrode of the n-type transistor M16 and the clock input node CK is formed the transistor TG of which the gate electrode receives the first control signal (input pulse signal in) as an input, thereby forming the output node CKIA. Further, the source electrode of the transistor TD that serves as the nineteenth n-type transistor constituting the potential fixing means and is used as a pull-down resistance of the output node CKIA is connected to this output node CKIA, the ground potential GND is connected to the drain electrode of this n-type transistor TD and the gate electrode is connected to its own source electrode. Therefore, the pull-down voltage becomes the threshold voltage of the n-type transistor TD. That is, the first clock signal input control section 12a shown in FIG. 20 has the advantage that the wiring becomes simple as compared with the construction of the first clock signal input control section 12 shown in FIG. 19.

It is to be noted that the second clock signal input control section 13 is similarly provided with the twentieth n-type transistor that serves as a potential fixing means.

Figure 21:
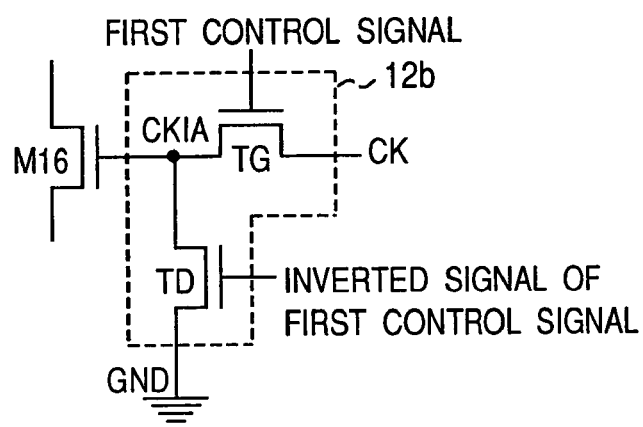
FIG. 21 is a diagram showing an example of the circuit construction different from those of FIG. 19 and FIG. 20.

FIG. 21 shows an example of the first clock signal input control section 12 of the shift register circuit mentioned in claim 29. Similar to the cases of FIG. 19 and FIG. 20, between the gate electrode of the n-type transistor M16 and the clock input node CK is formed the n-type transistor TG of which the gate electrode receives the first control signal (input pulse signal in) as an input, thereby forming the output node CKIA.

Further, the source electrode of the transistor TD that serves as the twenty-first n-type transistor constituting the potential fixing means and is used as a pull-down resistance of the output node CKIA is connected to this output node CKIA, and the ground potential GND is connected to the drain electrode of this n-type transistor TD. To the gate electrode of this n-type transistor TD is inputted the inverted signal of the first control signal (the inverted signal of the second control signal in the case of the second clock signal input control section 13) inputted to the gate electrode of the n-type transistor TG. Therefore, the n-type transistor TD is turned off when the n-type transistor TG is on, thereby enabling the prevention of the through current from the gate electrode of the n-type transistor M16 to the ground potential GND occurring when the clock input node CK and the output node CKIA are electrically connected to each other.

It is to be noted that the second clock signal input control section 13 is similarly provided with the twenty-second n-type transistor that serves as a potential fixing means.

Figure 22:
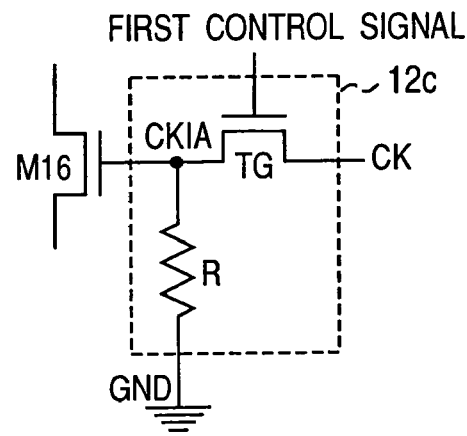
FIG. 22 is a diagram showing an example of the circuit construction different from those of FIG. 19 through FIG. 21.

FIG. 22 shows an example of the first clock signal input control section 12 of the shift register circuit mentioned in claim 28. Similar to the cases of FIG. 19 through FIG. 21, between the gate electrode of the n-type transistor M16 and the clock input node CK is provided the n-type transistor TG of which the gate electrode receives the input of the first control signal (input pulse signal in), thereby forming the output node CKIA. Further, one end of a resistor R that serves as a first resistor to be used as a pull-down resistance of the output node CKIA is connected to this output node CKIA, and the ground potential GND is connected to the other end. If the elemental area of the resistor is simply compared with the elemental area of the transistor, which have an identical resistance, then the resistor has the greater area. However, the resistor has the advantage that it can reduce its substantial occupation area by multi-layer wiring (for forming the resistor below the wiring) taking advantage of its simple structure.

It is to be noted that the second clock signal input control section 13 is similarly provided with a resistor that serves as a second resistor.

Figure 43:
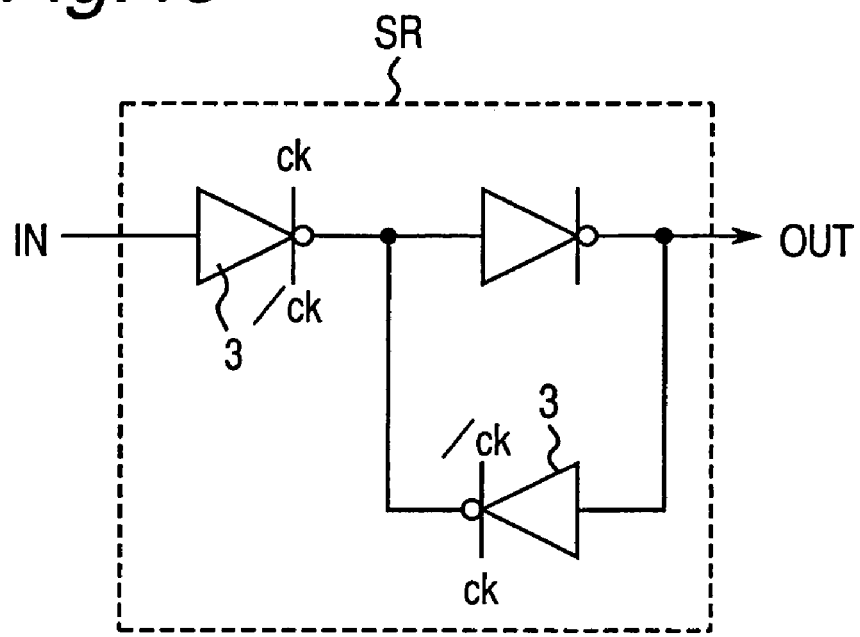
FIG. 43 is a circuit diagram of the latch circuit of FIG. 39 and FIG. 41.
Figure 44:
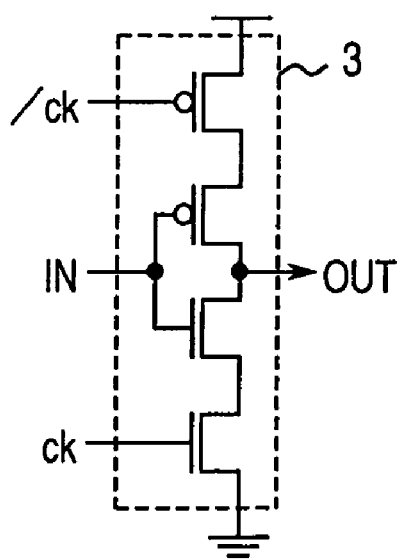
FIG. 44 is a diagram showing the concrete construction of the clocked inverter circuit of FIG. 43.
Figure 45:
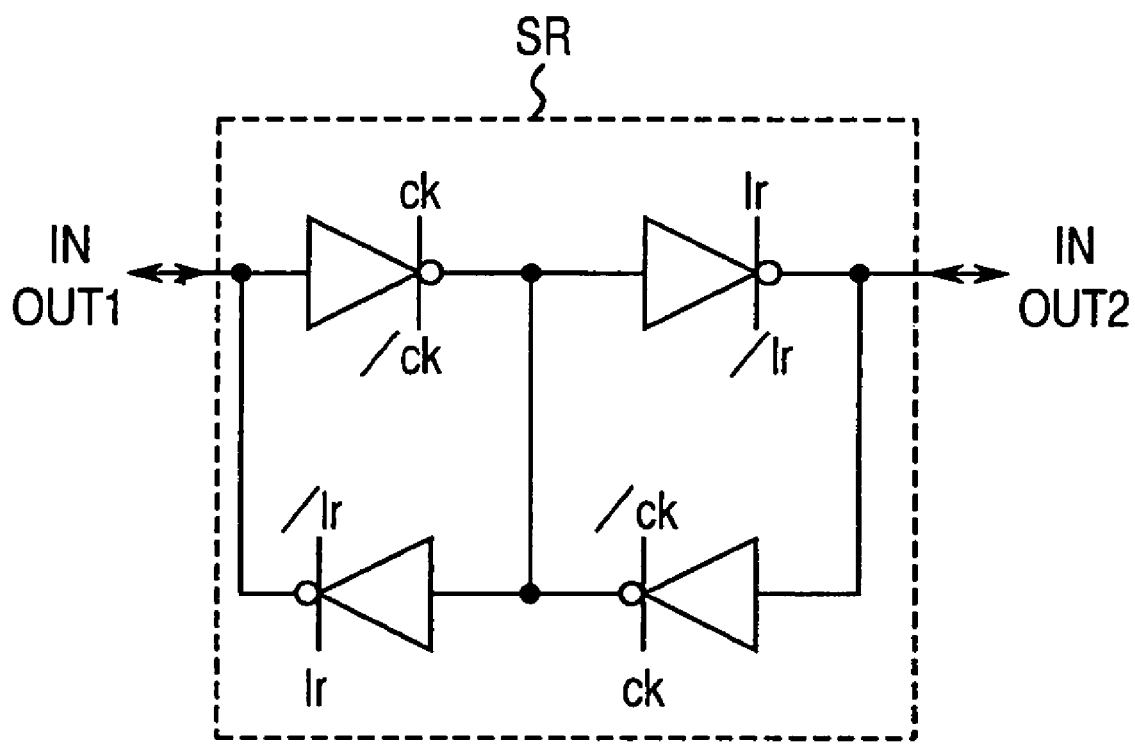
FIG. 45 is a circuit diagram of a latch circuit capable of executing bidirectional scanning.
Figure 46:
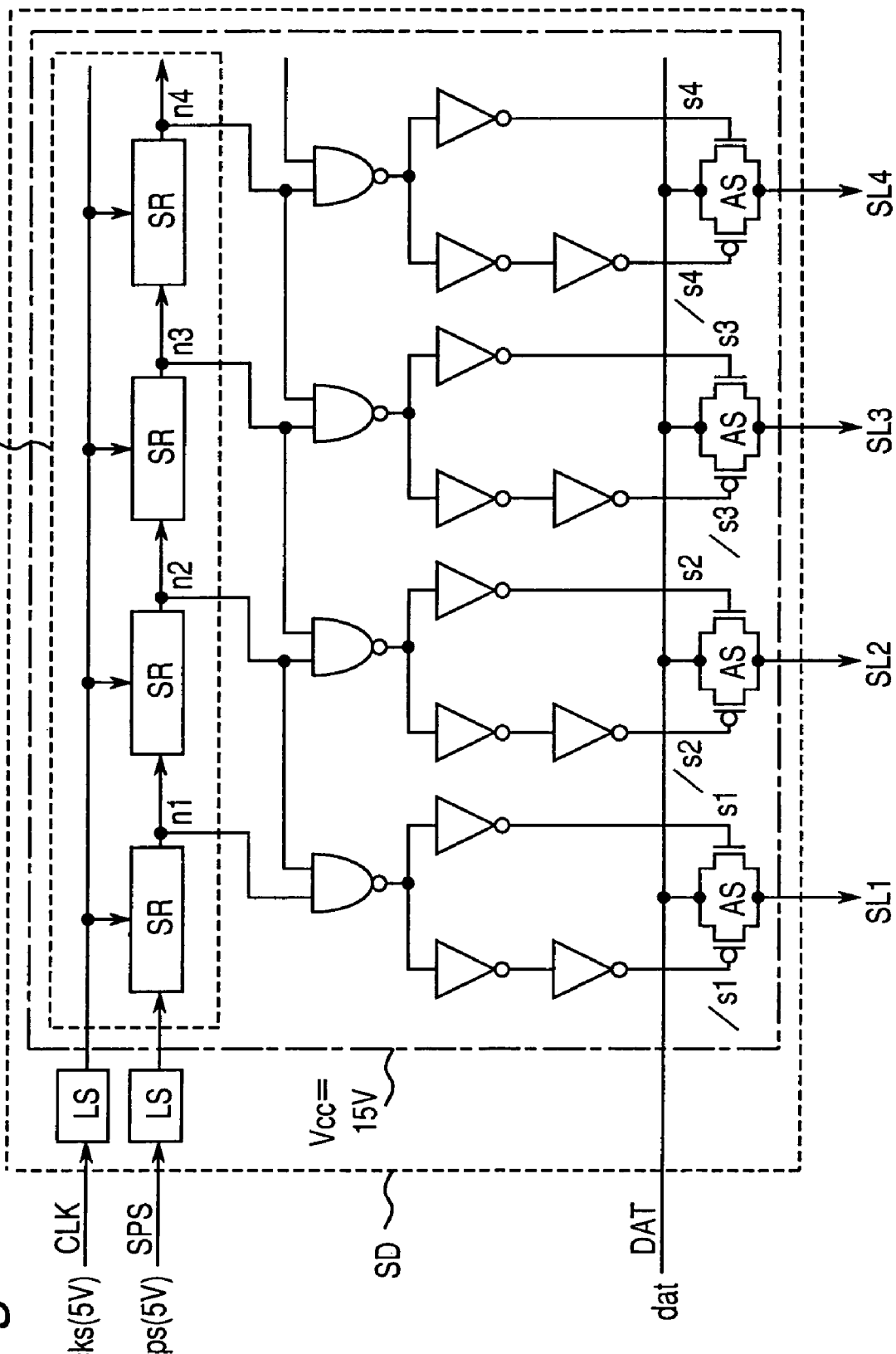
FIG. 46 is a circuit diagram of the data signal line drive circuit mounted with a level shifter circuit.
Figure 47:
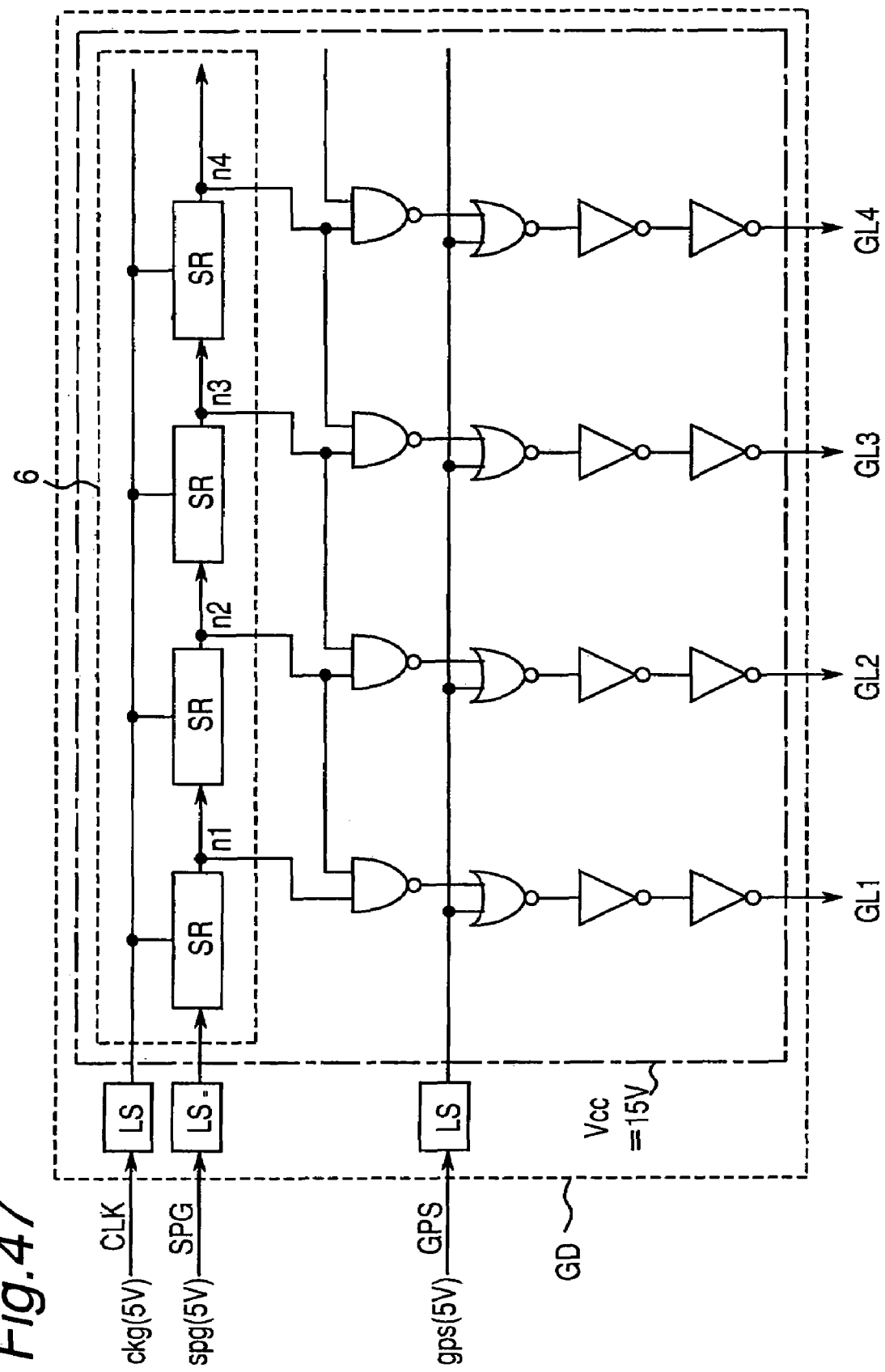
FIG. 47 is a circuit diagram of the scanning signal line drive circuit mounted with a level shifter circuit.

As described above, in the present embodiment, the individual latch circuits LAT that constitute the shift register circuit 11 operate in synchronization with only either one of the clock signal ck and the inverted clock signal /ck. Therefore, the load of the clock signal line can be reduced by half as compared with the case where both the clock signal ck and the inverted clock signal /ck are used as in the latch circuits SR shown in FIG. 43, thereby allowing the consumption of power to be reduced.

Figure 48:
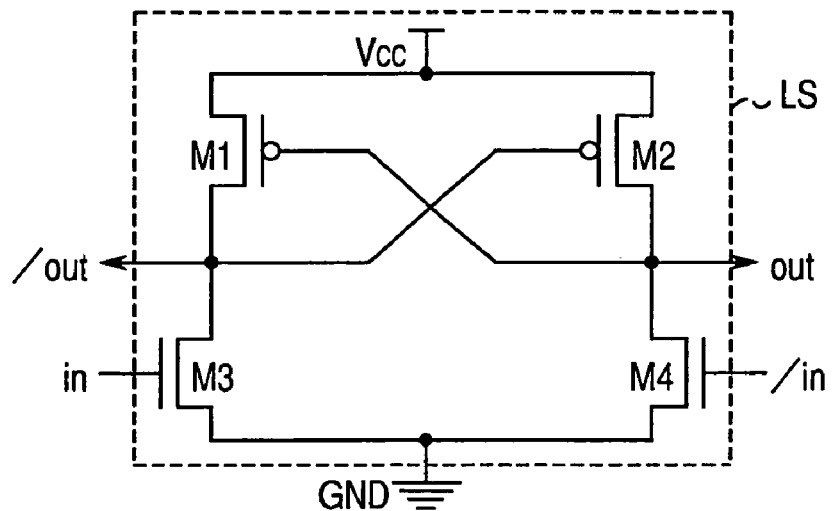
FIG. 48 is a concrete circuit diagram of the level shifter circuit of FIG. 46 and FIG. 47.

In the individual latch circuits LAT that constitute the shift register circuit 11, the n-type transistors M16 and M18 are provided between the two p-type transistors M11 and M12 and the two n-type transistors M15 and M17 (corresponding to the n-type transistors M3 and M4 connected to the ground potential GND of the level shifter circuit shown in FIG. 48). Then, the output signals ckia and ckib of the first and second clock signal input control sections 12 and 13 are inputted to the gate electrodes of the n-type transistors M16 and M18. Further, the n-type transistors M13 and M14 are provided between each of the output nodes OUT and /OUT and the ground potential GND. Then, the output nodes OUT and /OUT are connected to the gate electrodes of the n-type transistors M13 and M14.

Therefore, if the input pulse signal in to the first clock signal input control section 12 and the output pulse signal out to the second clock signal input control section 13 are "H" (i.e., the latch circuit LAT is active) and the clock signal ck is active, then the latch circuit LAT functions as a level shifter similar to the level shifter circuit LS shown in FIG. 48. In any other case, the circuit can function as a level hold circuit.

As a result, the shift register circuit 11 can be operated with the clock signal having amplitude smaller than the drive voltage (Vcc), so that the consumption of power of the external circuit for generating the clock signal can be reduced. Further, the pulse width of the output signal out becomes smaller than the pulse width of the output pulse signal /out. Therefore, by using the output signal out as a drive signal, a time interval can be provided between the output signals from adjacent two latch circuits LAT. If the shift register is utilized in the data signal line drive circuit of an image display device, then no noise is superimposed on the image signal. When the latch circuit LAT is inactive, by electrically disconnecting the clock input node CK from the output nodes CKIA and CKIB by the first and second clock signal input control sections 12 and 13, the load and the consumption of power of the clock signal line can be reduced.

FIG. 23 shows an example of the latch circuit LAT that constitutes the shift register circuit mentioned in claim 23. In FIG. 23, the p-type transistors M11 and M12, the n-type transistors M13 through M18 and the first and second clock signal input control sections 15 and 16 have the same constructions and functions as those of the p-type transistors M11 and M12, the n-type transistors M13 through M18 and the first and second clock signal input control sections 12 and 13 of FIG. 3. It is to be noted that the concrete circuit constructions of the first and second clock signal input control sections 15 and 16 are as shown in FIG. 19 through FIG. 22.

In the present embodiment, the input terminal of a first inverter circuit INV is connected to the drain of the p-type transistor M11 (the output node /OUT of the latch circuit LAT shown in FIG. 3). Likewise, a second inverter circuit INV is connected to the drain of the p-type transistor M12 (the output node OUT of the latch circuit LAT shown in FIG. 3). Then, the output terminal of the first inverter circuit INV is used as an output node OUT, while the output terminal of the second inverter circuit INV is used as an output node /OUT. In general, the level shifter circuit has a driving power smaller than those of the other logical operation circuits. Therefore, by incorporating a circuit having a buffering operation (amplifying operation) such as the inverter circuit INV, the signal propagation to the subsequent stage can be ensured to allow the shift register operation to be stably executed.

FIGS. 24A through 24G show the waveforms of the clock signal ck (/ck) inputted to the clock input node CK, the pulse signals in and /in inputted to the input nodes IN and /IN, the output signal ckia outputted from the output node CKIA, the output signal ckib outputted from the output node CKIB and the pulse signals out and /out outputted from the output nodes OUT and /OUT. In comparison with the waveforms shown in FIG. 4, the phases of the output signals out and /out are inverted due to the incorporation of the inverter circuit INV for the output nodes OUT and /OUT shown in FIG. 3, and consequently, the leading edge of the output signal out occurs earlier than the trailing edge of the output signal /out.

Therefore, similar to the case of the latch circuit LAT shown in FIG. 3, even if a slight deviation occurs in terms of timing between the output signals /out from adjacent latch circuits LAT when the shift register circuit 11 formed of the present latch circuit LAT is used for the data signal line drive circuit and the output signal /out is utilized, similar to the case of the latch circuit LAT shown in FIG. 3, the sampling signals corresponding to adjacent data signal lines can be prevented from overlapping.

It is also acceptable to remove the first and second clock signal input control sections 15 and 16 of the latch circuit of FIG. 23 and input the clock signal (CK) to the gate electrodes of the transistors M16 and M18, thereby providing the first and second inverters INV for the output terminals OUT and /OUT of the latch circuit described with reference to FIG. 17. Also, with this construction, the signal propagation to the subsequent stage can be ensured by the buffering operation of the inverters INV, thereby allowing the shift register operation to be stably executed.

Figure 25:
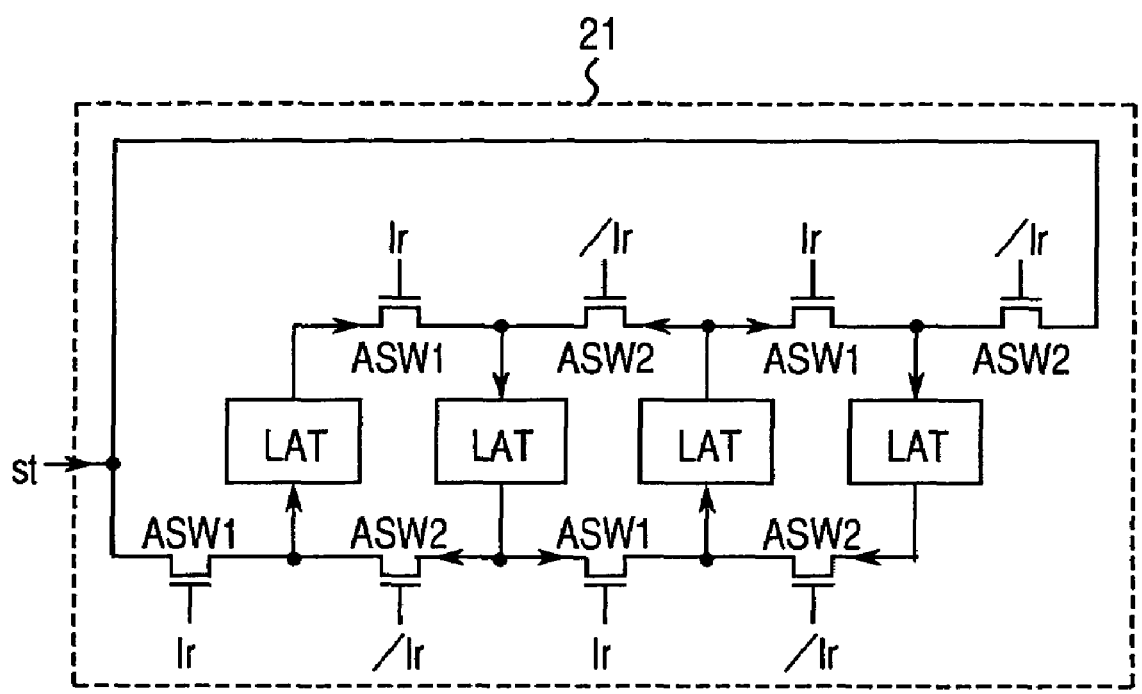
FIG. 25 is a block diagram of a shift register circuit different from that of FIG. 1.

FIG. 25 is a block diagram showing an example of the shift register circuit mentioned in claim 20. In this shift register circuit 21, the output nodes and input nodes of adjacent latch circuits LAT are connected via analog switches ASW. That is, a start signal (pulse signal) st is inputted to the input node of the latch circuit LAT of the first stage via an analog switch ASW1 that is controlled to be turned on and off by an external control signal lr. On the other hand, the output node is connected to the input node of the latch circuit LAT of the second stage via the analog switch ASW1. Next, the input node of the latch circuit LAT of the second stage is connected to the output node of the latch circuit LAT of the third stage via an analog switch ASW2 that is controlled to be turned on and off by an external control signal /lr besides the output node of the latch circuit LAT of the first stage. On the other hand, the output node is connected to the input node of the latch circuit LAT of the first stage via the analog switch ASW2 and connected to the input node of the latch circuit LAT of the third stage via the analog switch ASW1. Next, the input node of the latch circuit LAT of the third stage is connected to the output node of the latch circuit LAT of the fourth stage via the analog switch ASW2 besides the output node of the latch circuit LAT of the second stage. On the other hand, the output node is connected to the input node of the latch circuit LAT of the fourth stage via the analog switch ASW1 besides the input node of the latch circuit LAT of the second stage. Then, the start signal st is inputted via the analog switch ASW2 to the input node of the latch circuit LAT of the fourth stage, or the final stage besides the output signal from the latch circuit LAT of the third stage.

The shift register circuit 21 having the above construction can switch the scanning direction as follows. That is, when the control signal lr becomes active, the analog switch ASW1 that is controlled to be turned on and off by the control signal lr is turned on, while the analog switch ASW2 that is controlled to be turned on and off by the control signal /lr is turned off. Consequently, the start signal st is inputted to the latch circuit LAT of the first stage, and the output pulse signals from the latch circuits LAT of the preceding stages are inputted to the succeeding stages. That is, the shift register circuit 21 executes scanning from the front latch circuit LAT to the last latch circuit LAT. By contrast, when the control signal lr becomes inactive, the analog switch ASW1 is turned off, while the analog switch ASW2 is turned on. Consequently, the start signal st is inputted to the latch circuit LAT of the fourth stage (final stage), and the output pulse signals from the latch circuits LAT of the succeeding stages are inputted to the preceding stages. That is, the shift register circuit 21 executes scanning from the last latch circuit LAT to the front latch circuit LAT.

Figure 26:
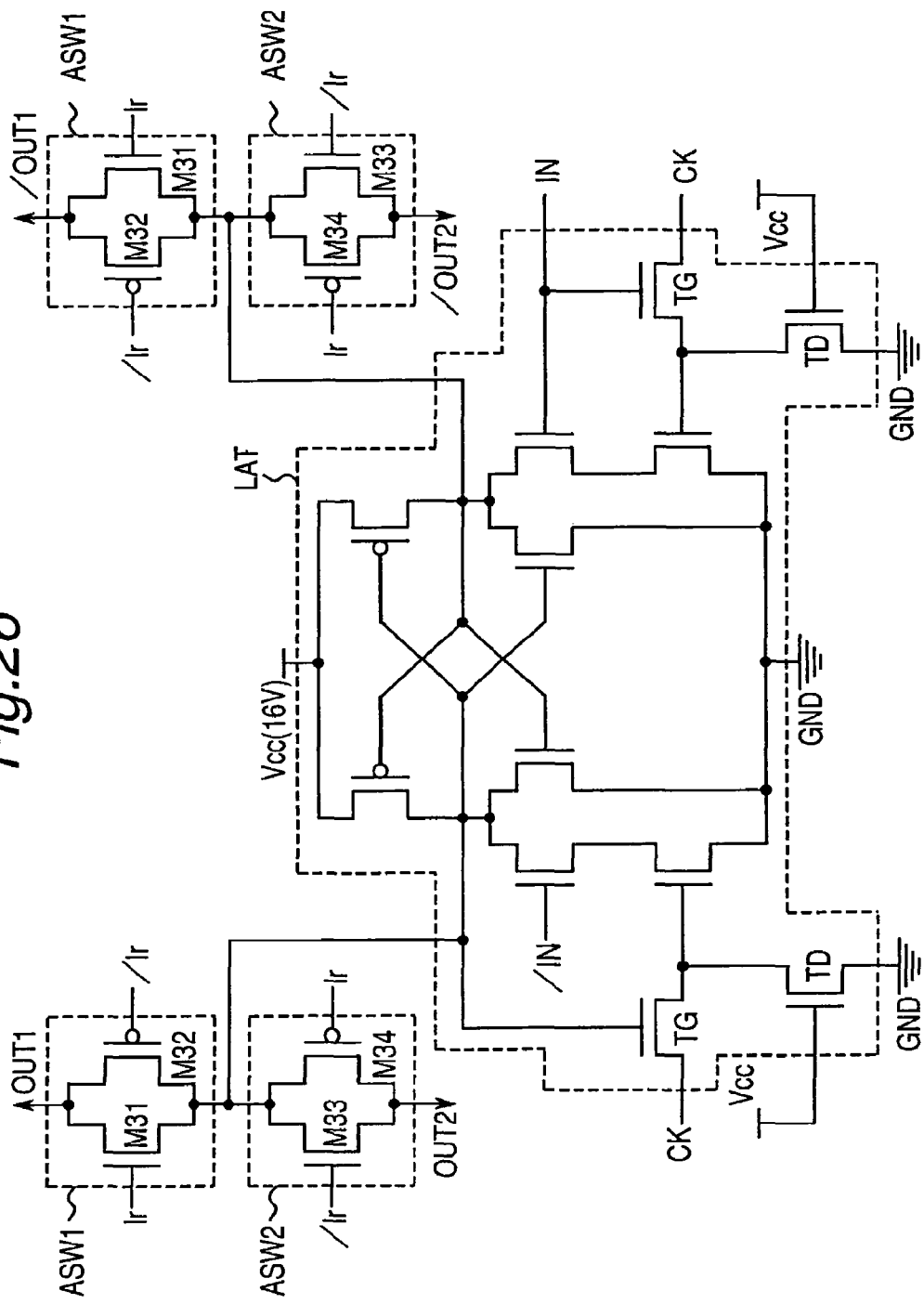
FIG. 26 is a circuit diagram of the latch circuit and the analog switch of FIG. 25.

FIG. 26 shows a circuit diagram of the latch circuit LAT and the analog switch ASW, which constitute the shift register circuit 21 of FIG. 25. The analog switch ASW1 is constructed by connecting the source electrode of an n-type transistor M31 of which the gate electrode receives the input of the control signal lr to the source electrode of a p-type transistor M32 of which the gate electrode receives the input of the control signal /lr and connecting their drain electrodes to each other. Then, the output node /OUT or the output node OUT of the latch circuit LAT is connected to the source electrode side, and the drain side thereof is made to serve as output nodes /OUT1 and OUT1. The analog switch ASW2 is constructed by connecting the source electrode of an n-type transistor M33 of which the gate electrode receives the input of the control signal /lr to the source electrode of a p-type transistor M34 of which the gate electrode receives the input of the control signal lr and connecting their drain electrodes to each other. Then, the output node /OUT or the output node OUT of the latch circuit LAT is connected to the source electrode side, and the drain side thereof is made to serve as output nodes /OUT2 and OUT2. It is to be noted that the latch circuit LAT in FIG. 26 is constructed of the latch circuit section shown in FIG. 3 and the clock signal input control section shown in FIG. 19. However, the latch circuit may, of course, be constructed on the basis of the latch circuit section of FIG. 23 and the clock signal input control section of FIG. 20 to FIG. 22.

Figure 27:
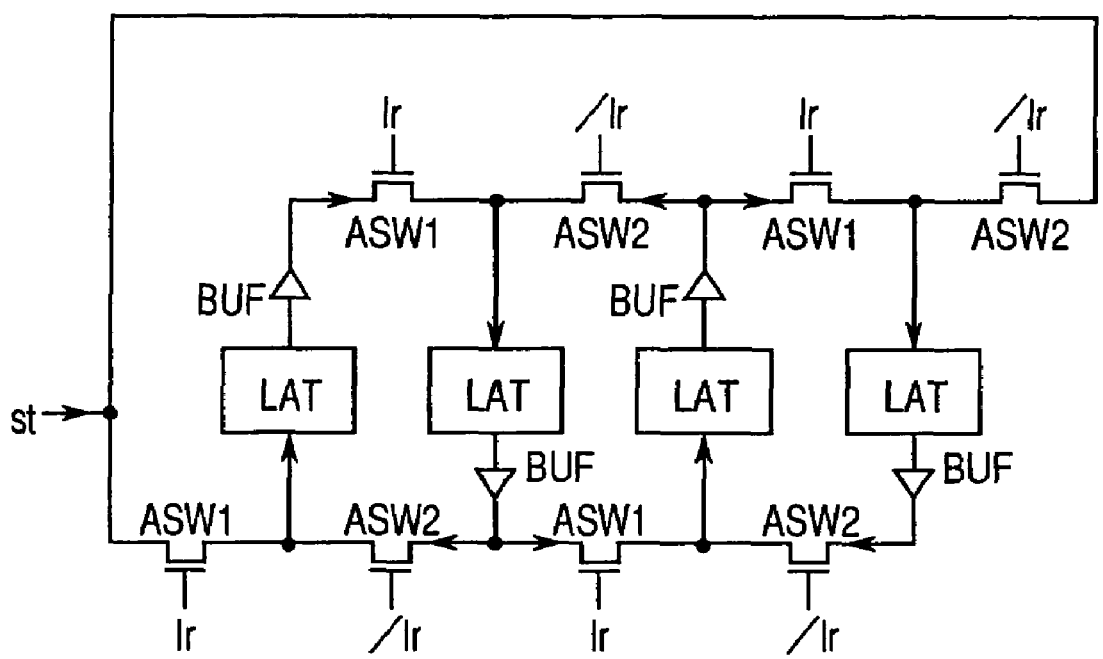
FIG. 27 is a block diagram showing another example of the shift register circuit of the present invention.

FIG. 27 is an example of the shift register mentioned in claim 21, showing a modification example of the shift register circuit described with reference to FIG. 25. In this shift register circuit, buffer circuits BUF are additionally provided between the outputs of the latch circuits LAT and the analog switches ASW1 and ASW2 that serve as the first and second transfer gates toward the latch circuits of the preceding stages and the succeeding stages.

This shift register circuit can also switch the scanning direction of the shift register circuit similarly to the shift register circuit of FIG. 25. Further, even in the case where the driving power (signal propagation capability) of the latch circuit LAT is reduced by way of the analog switches ASW, a great driving power can be obtained by virtue of the incorporation of the buffer circuits BUF, thereby allowing the shift register circuit to be stably operated.

It is to be noted that each of the latch circuits that constitute the above shift register circuit can be constructed by providing the inverter circuit INV described with reference to FIG. 23 for the output terminals toward the analog switches ASW1 and ASW2 located on both sides of the latch circuit LAT described with reference to FIG. 26.

Figure 28:
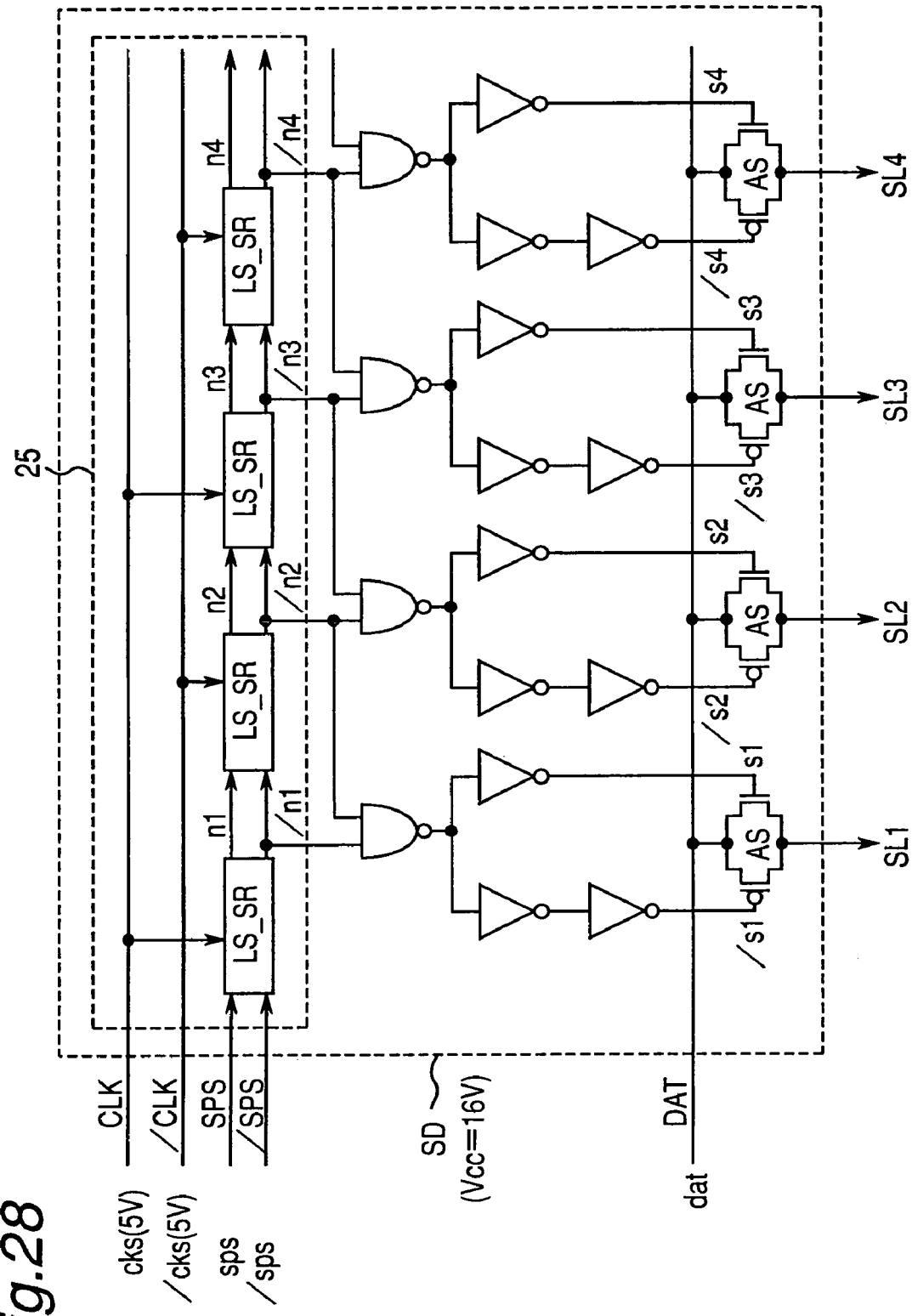
FIG. 28 is a circuit diagram of a data signal line drive circuit employing the shift register circuit shown in FIG. 1 or FIG. 25.
Figure 39:
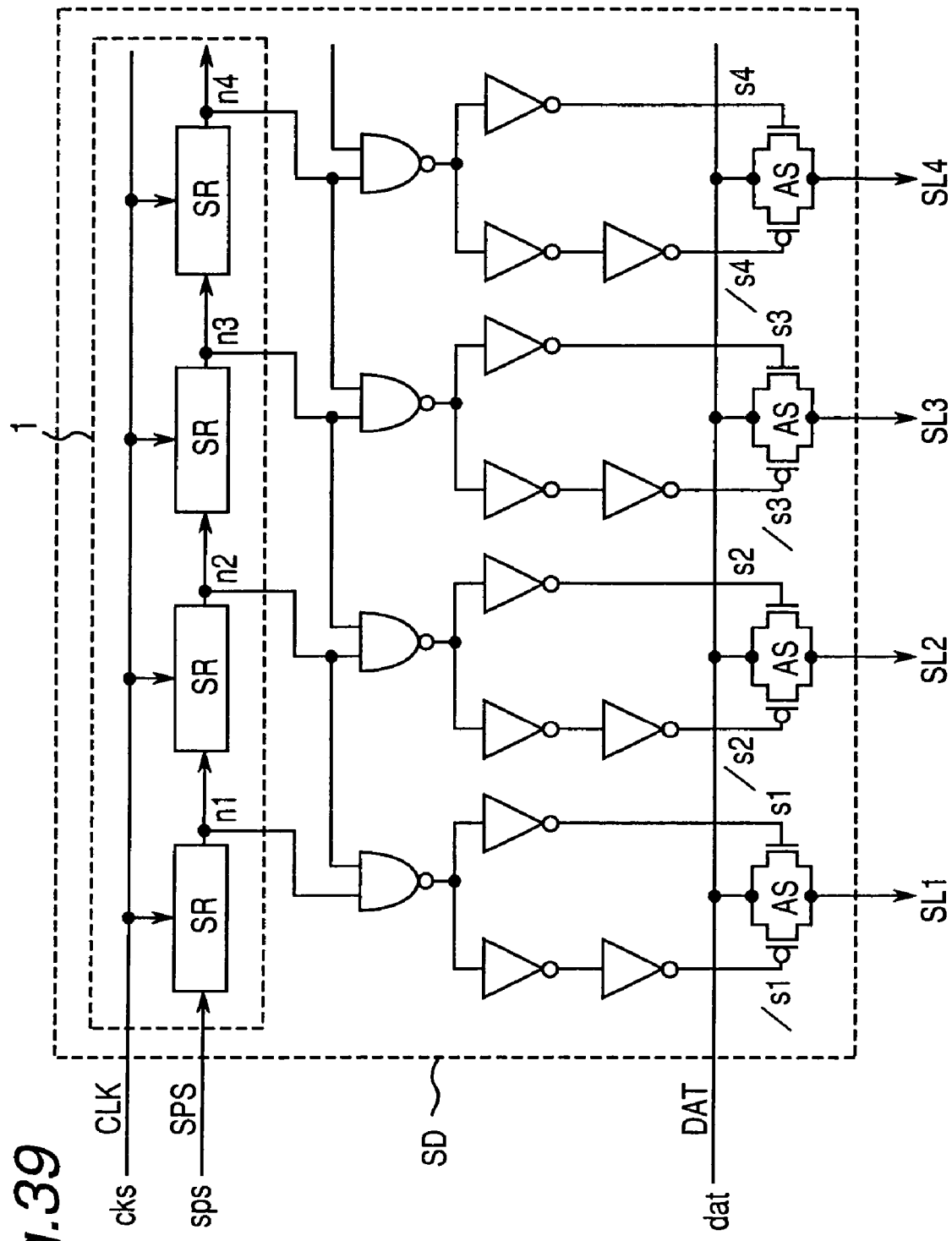
FIG. 39 is a diagram showing the detailed circuit construction of the data signal line drive circuit of FIG. 37.

FIG. 28 is a circuit diagram of a data signal line drive circuit SD that employs the shift register circuit 11 shown in FIG. 2 or the shift register circuit 21 shown in FIG. 25 (in this case, the scanning is executed in the forward direction when the control signal lr becomes active). The basic construction of the present data signal line drive circuit SD is roughly the same as that of the conventional data signal line drive circuit SD shown in FIG. 39. That is, the signal of a sequence of output signals /n of adjacent latch circuits LS_SR that constitute a shift register circuit 25 is amplified by a buffer circuit constructed of a plurality of inverter circuits, and an inverted signal is generated as the occasion demands. A sampling signal s and its inverted signal /s are outputted to a sampling circuit (analog switch) AS. Then, the sampling circuit AS executes switching on the basis of the sampling signals s and /s and supplies video data dat from the video signal line DAT to the data signal line SL. Clock signals cks and /cks to the latch circuits LS_SR, output signals n1, /n1 through n3, /n3 of the latch circuits LS_SR and sampling signals s1 and s2 in the above case are shown in FIGS. 29A through 29J.

In this case, each latch circuit LS_SR that constitutes the shift register circuit 25 is a latch circuit that has the same construction and the same level shifter function as those of the latch circuit LAT shown in FIG. 3 or FIG. 23. Therefore, the output signals n1, /n1 through n3, /n3 having the amplitude of 16 V can be outputted on the basis of the clock signals cks and /cks having the amplitude of 5 V. Therefore, when the data signal line drive circuit SD constructed of the shift register circuit 25 having the latch circuit LS_SR as described above is employed, a high driving voltage can be obtained on the basis of the clock signals cks and /cks having the small amplitude, so that the increase in consumption of power due to the clock signals cks and /cks in the case where the aforementioned drive circuit integrated type liquid crystal display device is constructed of a polysilicon thin-film transistor having a high threshold voltage absolute value can be prevented.

In this case, the latch circuit LS_SR is assumed to be the latch circuit LAT having the circuit construction shown in FIG. 23. Then, the sampling signals s and /s for taking in the video data dat are generated on the basis of the low-active output signal /n out of the output signals n and /n from the latch circuit LS_SR of each stage of the shift register circuit 25. In the above case, the output signals out and /out of the latch circuit LAT having the circuit construction shown in FIG. 23 are arranged so that the pulse width of the output signal /out is narrower than the pulse width of the output signal out as shown in FIGS. 24A through 24G. Therefore, with regard to the sampling signals s and /s generated by the present data signal line drive circuit SD, the adjacent sampling signals s1 and s2 have no overlap in terms of time as shown in FIGS. 29A through 29J. That is, it is impossible to write the video data into any other data signal line SL immediately before the completion of the writing of video data into a certain data signal line SL, and this prevents the superimposition of noises on the data signal line SL, thereby allowing a satisfactory image display to be obtained.

In the above description, each latch circuit LS_SR that constitutes the shift register circuit 25 is the latch circuit LAT of the circuit construction shown in FIG. 23 and the sampling signals s and /s are generated on the basis of the low-active output signal /n. However, the latch circuits LS_SR may be constructed of the latch circuit LAT of the circuit construction shown in FIG. 3. In the above case, the adjacent sampling signals s1 and s2 can be made to have no overlap in terms of time by generating the sampling signals s and /s on the basis of the high-active output signal n.

Further, as described above, the latch circuit LS_SR (i.e., the latch circuit LAT shown in FIG. 3 or FIG. 23) that constitutes the shift register circuit 25 has the first and second clock signal input control sections identical to the first and second clock signal input control sections 12 and 13. Then, since the circuit operates merely as a level hold circuit in the inactive state, the clock signals cks and /cks are unnecessary. Therefore, in the inactive state, the load and the consumption of power of the clock signal line can be reduced by stopping the inputs of the clock signals cks and /cks by the first and second clock signal input control sections.

It is also acceptable to eliminate the inputs of the inverted signals /cks and /sps out of the clock signals and the start signals inputted to each latch circuits LS_SR of FIG. 28.

Figure 30:
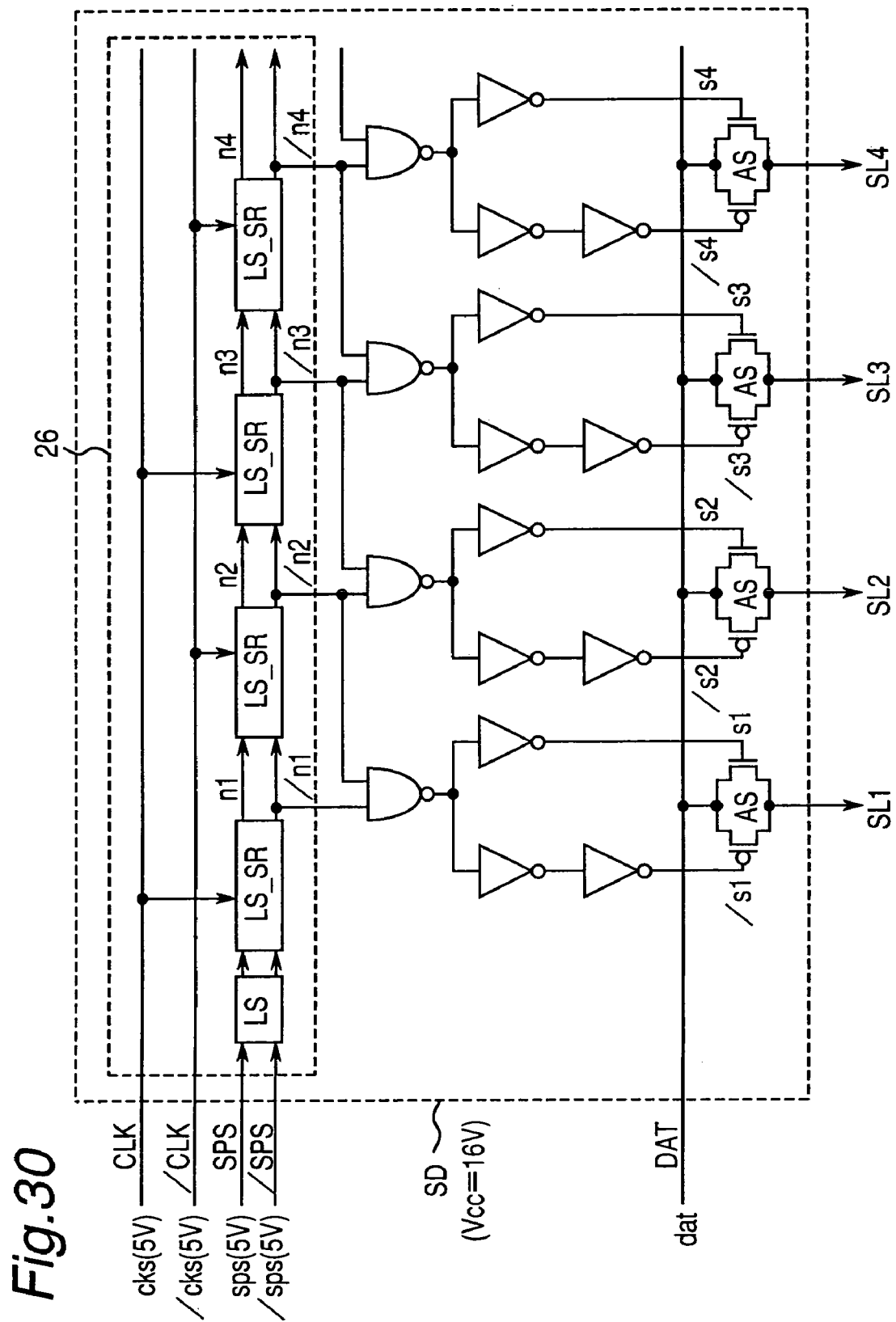
FIG. 30 is a circuit diagram of a data signal line drive circuit different from that of FIG. 28.
Figure 49:
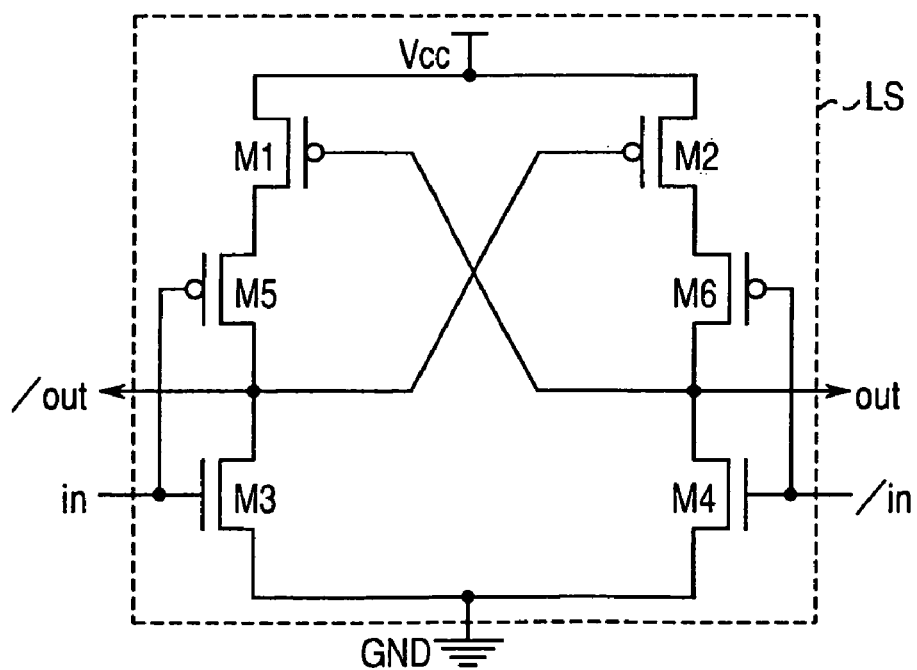
FIG. 49 is a circuit diagram of the level shifter circuit different from that of FIG. 48.
Figure 50:
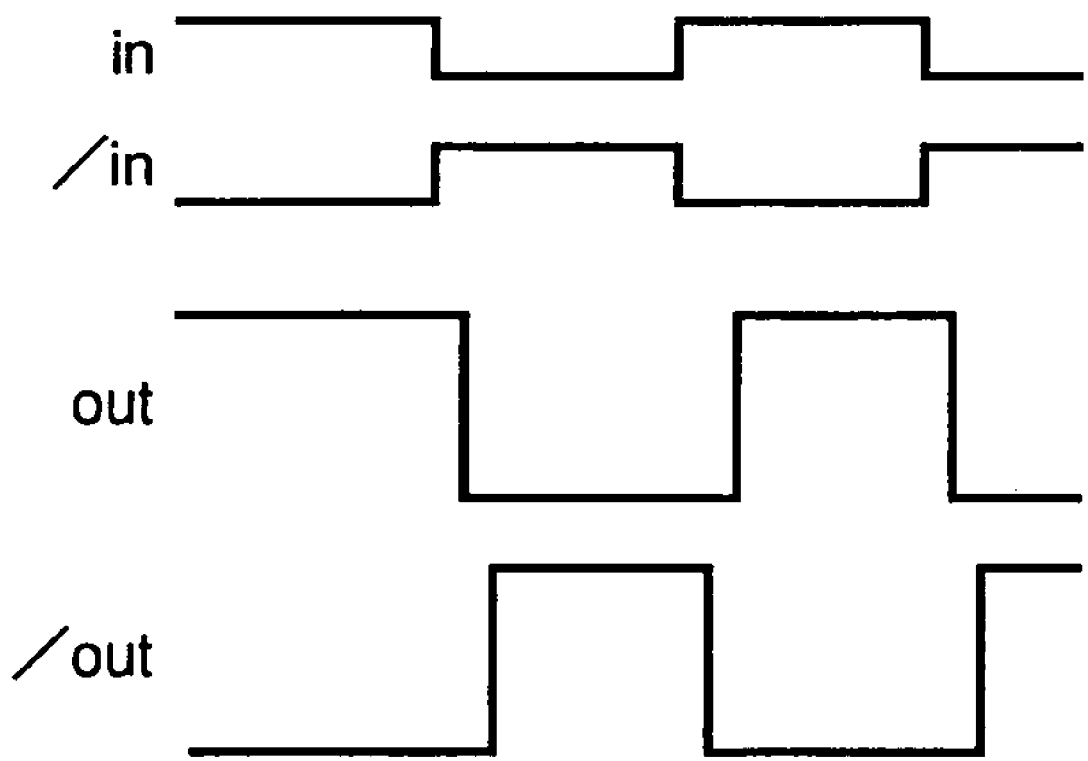
FIG. 50 is a chart of waveforms of input signals and output signals of FIG. 48 or FIG. 49.

FIG. 30 is a circuit diagram showing another example of the construction of the data signal line drive circuit SD that employs the shift register circuit 11 or the shift register circuit 21. In the present data signal line drive circuit SD, a normal level shifter circuit LS having the circuit construction shown in FIG. 48 or FIG. 49 is provided for a start signal line SPS to the latch circuit LS_SR of the first stage of a shift register circuit 26. Then, by the level shifter circuit LS, start signals sps and /sps having the same amplitude of 5 V as those of the clock signals cks and /cks are boosted to have an amplitude of 16 V and supplied to the latch circuit LS_SR of the first stage.

As described above, by making the start signal sps have the amplitude of 5 V, all the digital input signals to the present data signal line drive circuit SD are allowed to have the amplitude of 5 V. That is, according to the present embodiment, the output level of the external signal generating circuit can be uniformed to 5 V, thereby allowing a low consumption of power and simplification of the system to be achieved.

Figure 31:
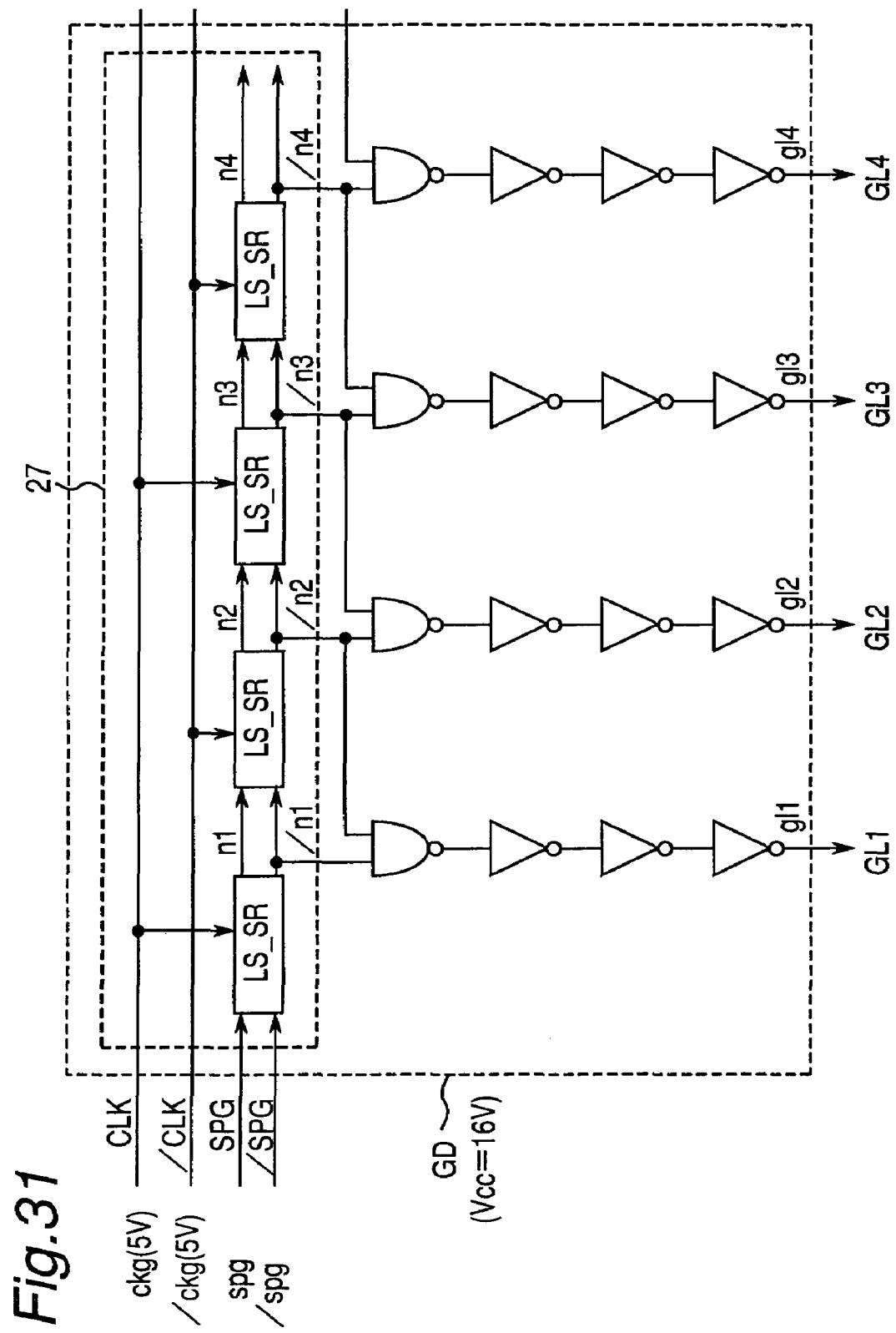
FIG. 31 is a circuit diagram of a scanning signal line drive circuit employing the shift register circuit shown in FIG. 1 or FIG. 25.

FIG. 31 is a circuit diagram of the scanning signal line drive circuit GD that employs the shift register circuit 11 shown in FIG. 2 or the shift register circuit 21 shown in FIG. 25 (in this case, the scanning is executed in the forward direction when the control signal lr becomes active). The basic construction of the present scanning signal line drive circuit GD has a buffer circuit obtained by removing the pulse width control signal line GPS and the NOR circuit from the buffer circuit of the conventional scanning signal line drive circuit GD shown in FIG. 41. That is, the signal of a sequence of the output signals /n of adjacent latch circuits LS_SR that constitute a shift register circuit 27 is obtained by the NAND circuit, amplified by the buffer circuit constructed of a plurality of inverter circuits and supplied to the scanning signal line GL. The clock signals ckg and /ckg to the latch circuits LS_SR, output signals n1, /n1 through n3, /n3 of the latch circuits LS_SR and scanning signals gl1 and gl2 to the scanning signal line GL in the above case are shown in FIGS. 32A through 32J.

In this case, each latch circuit LS_SR that constitutes the shift register circuit 27 is a latch circuit that has a level shifter function having the same construction as that of the latch circuit LAT shown in FIG. 3 or FIG. 23. Therefore, similar to the case of the data signal line drive circuit SD shown in FIG. 28 or FIG. 30, a high drive voltage can be obtained on the basis of clock signals ckg and /ckg having a low amplitude, so that the increase in consumption of power due to the clock signals ckg and /ckg can be prevented in the case where the drive circuit integrated type liquid crystal display device is constructed of a polysilicon thin-film transistor.

The latch circuit LS_SR is the latch circuit LAT having the construction shown in FIG. 23, and the scanning signal gl for writing the video data dat into pixels is obtained on the basis of the low-active output signal /n from the latch circuit LS_SR of each stage. Therefore, similar to the case of the data signal line drive circuit SD shown in FIG. 28 or FIG. 30, adjacent scanning signals gl1 and gl2 have no overlap as shown in FIGS. 32A through 32J. That is, it is impossible to start writing the video data into any other pixel immediately before the completion of the writing of video data into a certain pixel, and this prevents the superimposition of noises on the image signal, thereby allowing a satisfactory image display to be obtained. As described above, according to the present scanning signal line drive circuit GD, the occurrence of overlap of adjacent scanning signals gl can be eliminated merely by generating the scanning signal gl on the basis of the low-active output signal /n from the latch circuit LS_SR. Accordingly, there is no need for a circuit for supplying the pulse width control signal gps for controlling the pulse width of the scanning signal gl in contrast to the case of the scanning signal line drive circuit GD shown in FIG. 41.

Also, in the case of the present scanning signal line drive circuit GD, adjacent scanning signals gl1 and gl2 can be made to have no overlap by constituting the latch circuit LS_SR by the latch circuit LAT having the construction shown in FIG. 3 and generating the scanning signal gl on the basis of the high-active output signal n.

Furthermore, similar to the case of the data signal line drive circuit SD shown in FIG. 28 or FIG. 30, in the inactive state, the load and the consumption of power of the clock signal line can be reduced by stopping the input of the clock signals ckg and /ckg by the first and second clock signal input control sections that constitute the latch circuit LS_SR.

Figure 33:
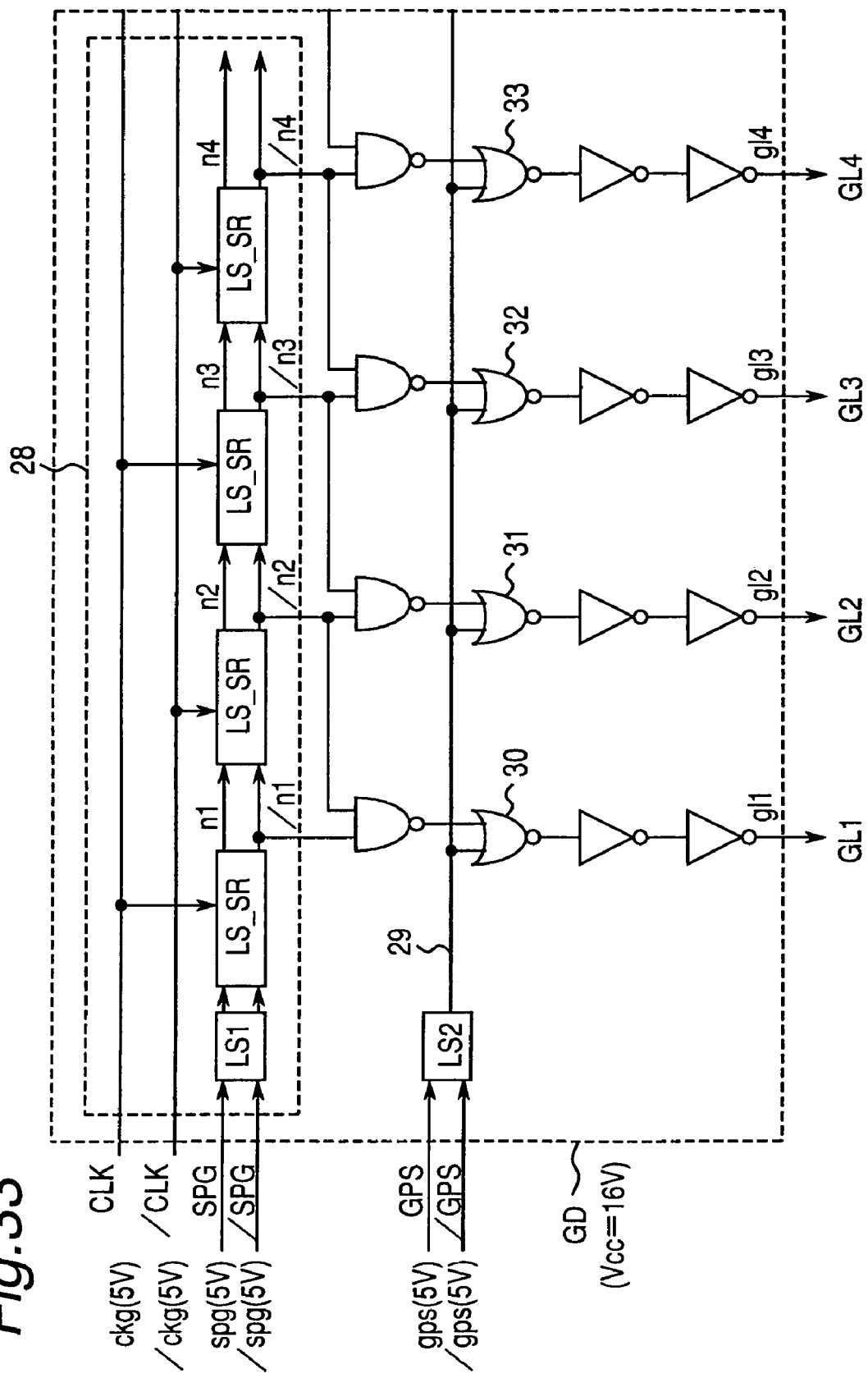
FIG. 33 is a circuit diagram of a scanning signal line drive circuit different from that of FIG. 31.
Figure 41:
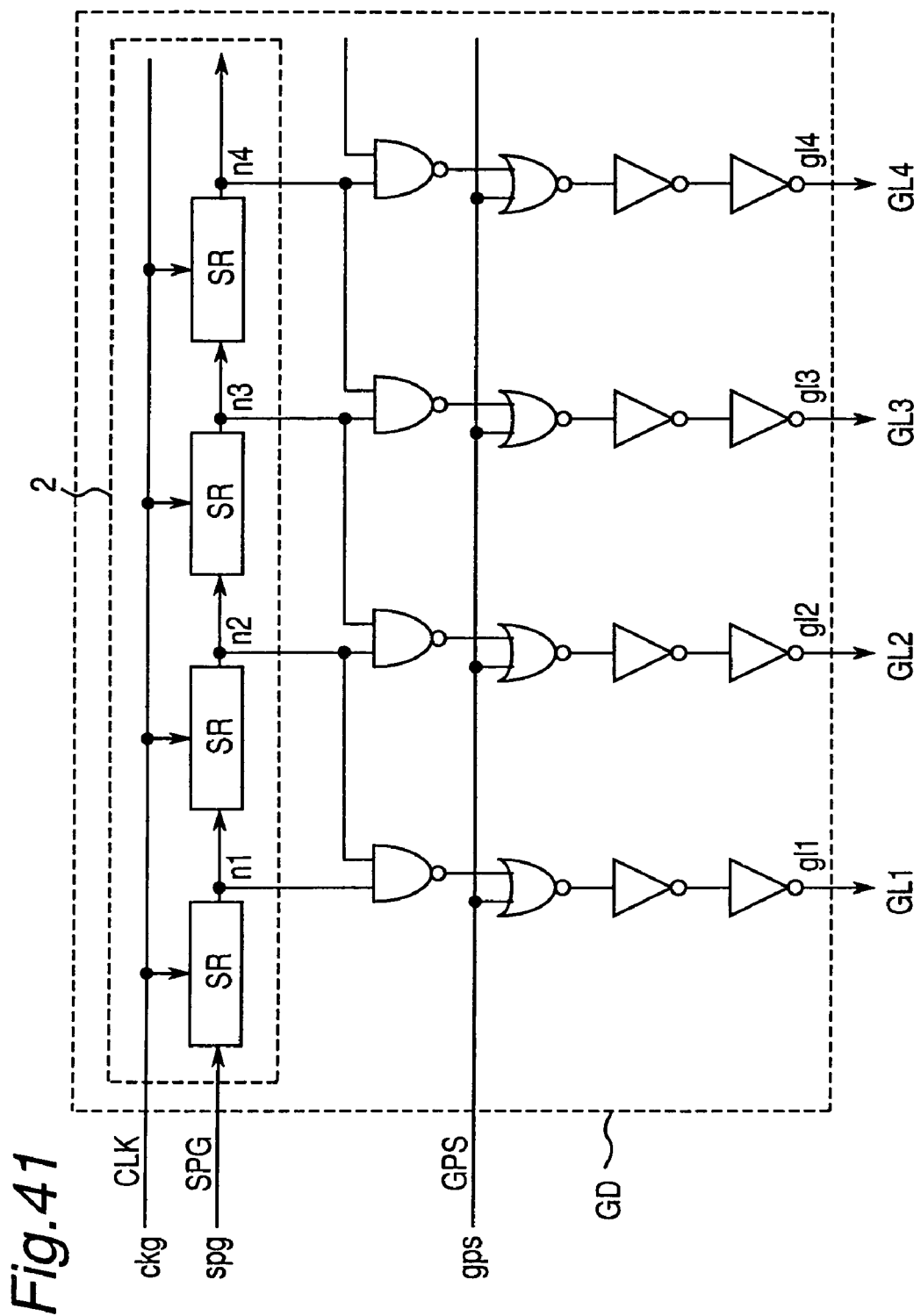
FIG. 41 is a diagram showing the detailed circuit construction of the scanning signal line drive circuit of FIG. 37.

FIG. 33 is a circuit diagram showing another example of the construction of the scanning signal line drive circuit GD that employs the shift register circuit 11 or the shift register circuit 21. In the present scanning signal line drive circuit GD, a normal level shifter circuit LS1 having the construction shown in FIG. 48 or FIG. 49 is provided for the start signal lines SPG and /SPG to the latch circuit LS_SR of the first stage of a shift register circuit 28. Further, a pulse width control signal line 29 similar to the case of FIG. 41 is provided and a level shifter circuit LS2 as described above is connected to this pulse width control signal line 29. Then, start signals spg and /spg having the same amplitude of 5 V as those of the clock signals ckg and /ckg are boosted to have an amplitude of 16 V by the level shifter circuit LS1 and supplied to the latch circuit LS_SR of the first stage. Further, pulse width control signals gps and /gps having the same amplitude of 5 V as those of the clock signals ckg and /ckg are boosted to have an amplitude of 16 V by the level shifter circuit LS2 and supplied to NOR circuits 30 through 33 of the stages.

Therefore, by making the start signals spg and /spg and the pulse width control signals gps and /gps have the amplitude of 5 V, all the digital input signals to the scanning signal line drive circuit GD are allowed to have the amplitude of 5 V. That is, according to the present embodiment, the output level of the external signal generating circuit can be uniformed to 5 V, thereby allowing a low consumption of power and simplification of the system to be achieved.

Further, the pulse width of the scanning signal gl can be more appropriately set by generating the scanning signal gl taking the overlap of the sequence of the output signals /n of the adjacent latch circuits LS_SR with the pulse width control signals gps and /gps.

The present embodiment has been described on the basis of the example in which the control signal is generated by means of the output signal having the narrower pulse width out of the output signals out and /out from the latch circuits LS_SR that constitute the data signal line drive circuit SD and the scanning signal line drive circuit GD. However, according to the present invention, it is also acceptable to use the output signal having the wider pulse width. In the above case, the time overlap occurring in the control signal based on the output signals from the adjacent latch circuits LS_SR as described above cannot be positively eliminated, however, an effect for reducing the amplitude of the clock signal can be obtained.

Figure 37:
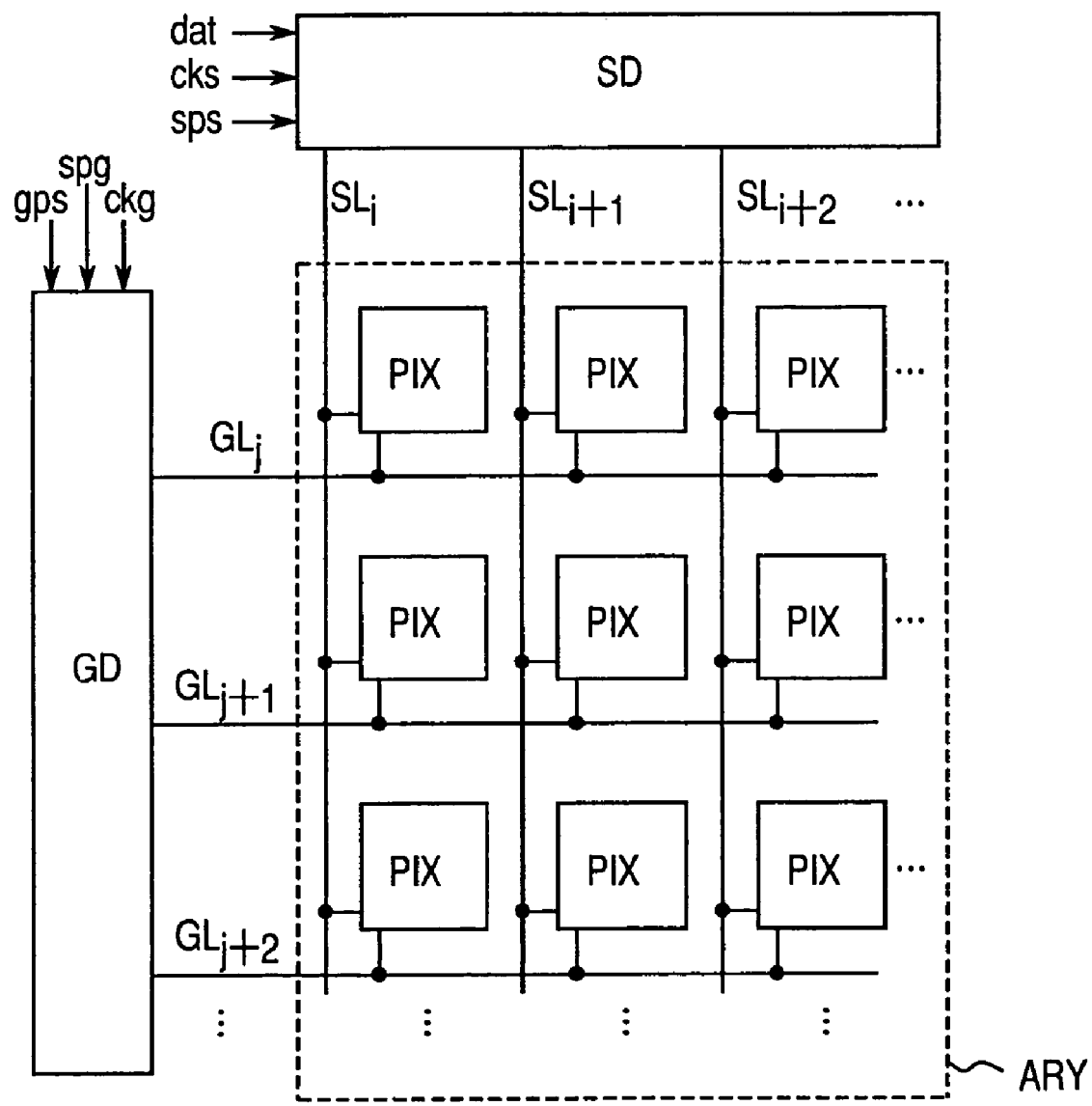
FIG. 37 is a schematic diagram of the construction of an active matrix driving system liquid crystal display device.

As described above, by using at least one of the data signal line drive circuit SD and the scanning signal line drive circuit GD of the present embodiment as the data signal line drive circuit SD or the scanning signal line drive circuit GD of a liquid crystal display device as shown in FIG. 37, an image display device that concurrently has a low consumption of power and a high display quality can be constructed.

In such a circuit constitution, the data signal line drive circuit SD and the scanning signal line drive circuit GD are arranged broadly throughout the range of a length approximately equal to the length of the side of the screen (i.e., the display region), and therefore, clock signals cks and ckg and so on have very long wiring lengths. Therefore, the wiring load capacity of the clock wiring is very large, and the reduction in consumption of power through the reduction in amplitude of each signal is very effective.

Among the clock signals and the start signals inputted to the latch circuits LS_SR of FIG. 31, the inverted signals /cks and /sps can also be eliminated. Among the pulse width control signals inputted to the NOR circuits 30 through 33 of FIG. 33, the inverted signal /gps can also be eliminated.

Figure 34:
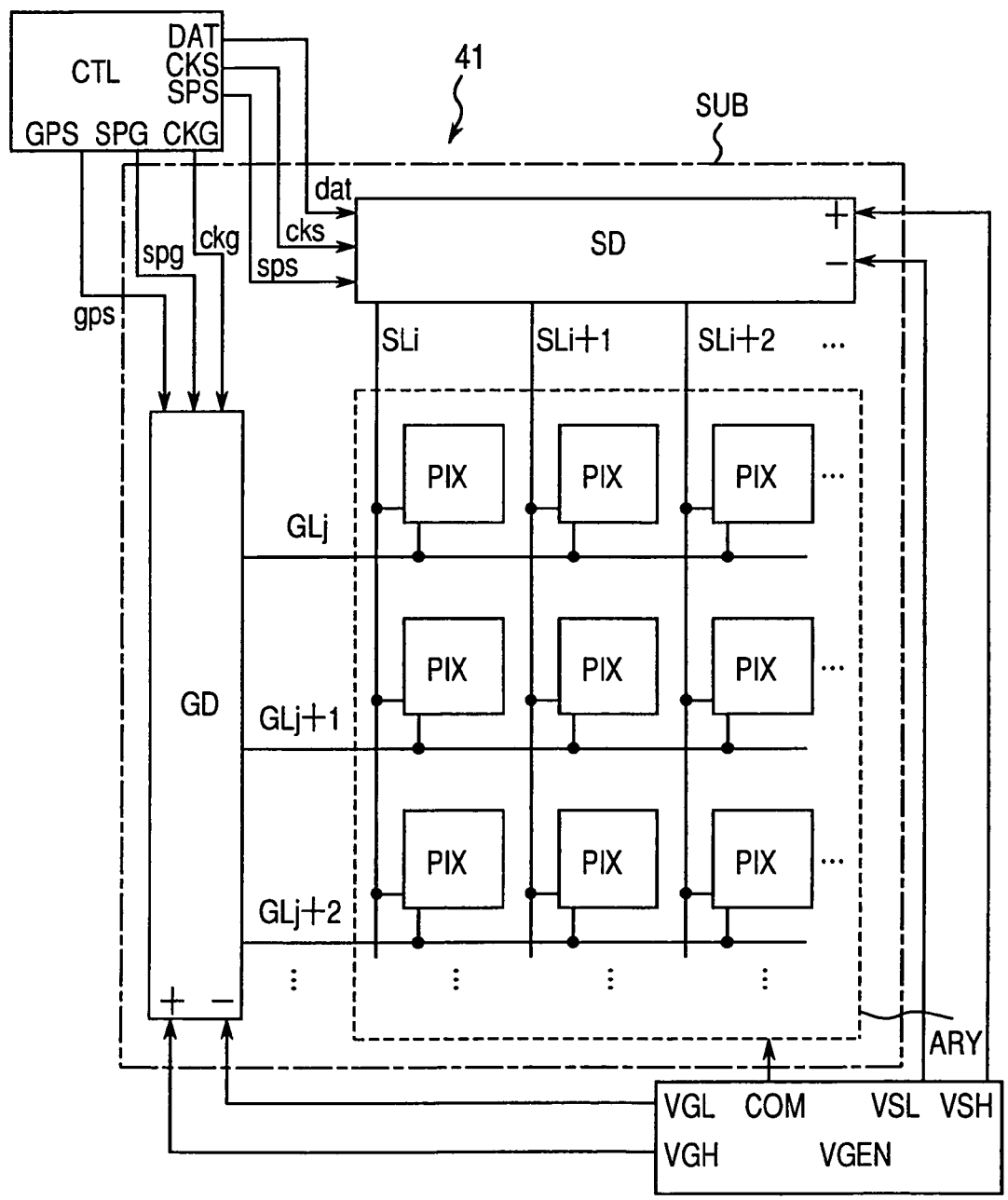
FIG. 34 is a schematic diagram of the construction of a monolithic type liquid crystal display device that serves as an image display device of the present invention.

FIG. 34 is a diagram showing the construction of a liquid crystal display device according to an example of the image display device mentioned in claim 30. This liquid crystal display device 41 is provided with the data signal line drive circuit SD shown in FIG. 28 or FIG. 30 and the scanning signal line drive circuit GD shown in FIG. 31 or FIG. 33. The data signal line drive circuit SD has the same circuit construction as that of the data signal line drive circuit SD shown in FIG. 28 or FIG. 30. The scanning signal line drive circuit GD has the same circuit construction as that of the scanning signal line drive circuit GD shown in FIG. 31 or FIG. 33. The pixel array ARY has the same construction as that of the pixel array ARY of the liquid crystal display device shown in FIG. 37.

In the liquid crystal display device 41 shown in FIG. 34, the pixels PIX, the data signal line drive circuit SD and the scanning signal line drive circuit GD are formed on an identical substrate SUB and exhibit the so-called driver monolithic structure.

In such a circuit construction, the wiring load capacity is very large similar to the case of the liquid crystal display device shown in FIG. 37. By making both the signal line drive circuits SD and GD have the above construction and making the amplitude of the above input signals to both the signal line drive circuits SD and GD smaller than those of the driving voltages of both the signal line drive circuits SD and GD, a great effect of reducing the consumption of power can be obtained.

Further, by (monolithically) forming the data signal line drive circuit SD and the scanning signal line drive circuit GD on the same substrate SUB as that of the pixel array ARY, the manufacturing cost and mounting cost of the signal line drive circuits SD and GD and so on can be reduced as compared with the case where they are formed and mounted on different substrates, and an effect for improving the reliability can also be obtained.

Figure 35:
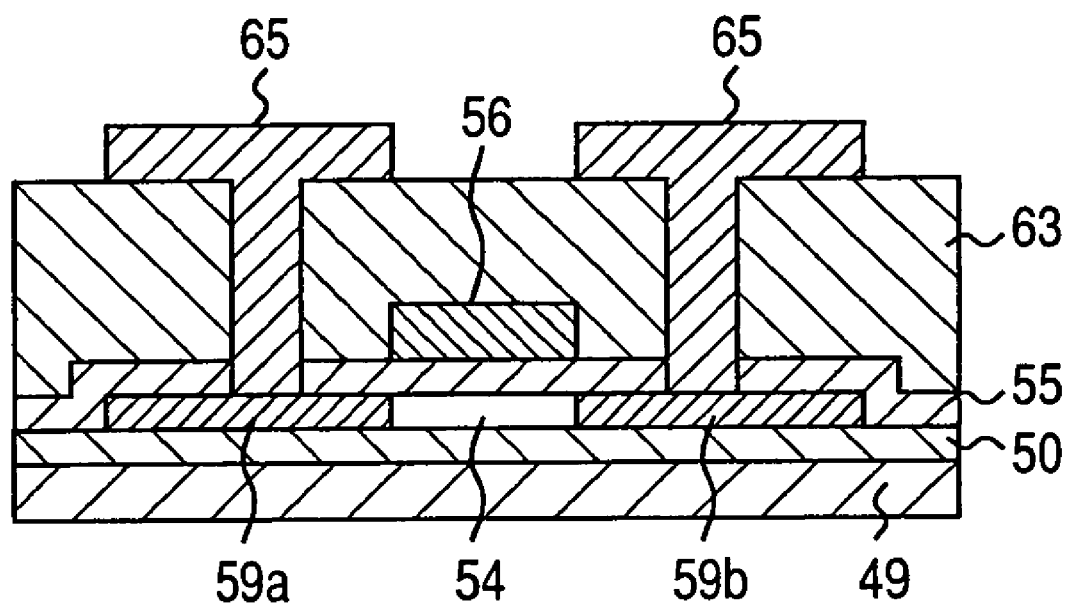
FIG. 35 is a sectional view of a polysilicon thin-film transistor employed in the liquid crystal display device of FIG. 34.

A transparent substrate such as a quartz substrate or a glass substrate is employed as the substrate SUB in the monolithic type liquid crystal display device as shown in FIG. 34. Therefore, a polysilicon thin-film transistor that has a very high driving power characteristic as compared with that of the amorphous silicon thin film transistor employed in the conventional active matrix type liquid crystal display device is employed as an active element. FIG. 35 shows an example of the structure of the polysilicon thin-film transistor. There are shown reference numerals of 49 for an insulating substrate of a glass substrate or the like, 50 for a silicon oxide film, 54 for a polysilicon film, 59a for a source region and 59b for a drain region. There are further shown reference numerals of 55 for a silicon oxide film that serves as a gate insulating film, 56 for a gate electrode, 63 for a silicon oxide film that serves as an interlayer insulating film and 65 for a metal wiring. FIGS. 36A through 36K are sectional views showing an example of a procedure for fabricating the polysilicon thin-film transistor. The fabricating processes for forming a polysilicon thin-film transistor at a temperature of not higher than 600° C. will be simply described below.

Figure 36A:
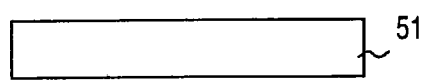
FIG. 36A through FIG. 36K are diagrams showing a procedure for fabricating the polysilicon thin-film transistor shown in FIG. 35.
Figure 36B:
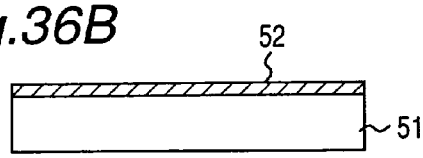
Figure 36C:
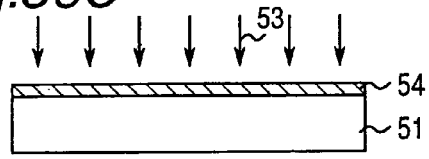
Figure 36D:
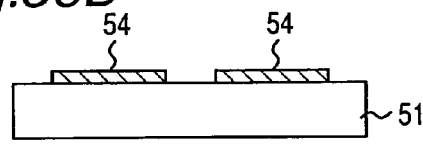
Figure 36E:
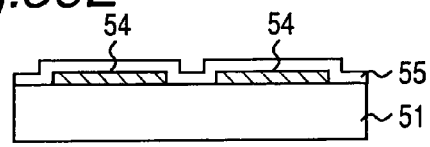
Figure 36F:
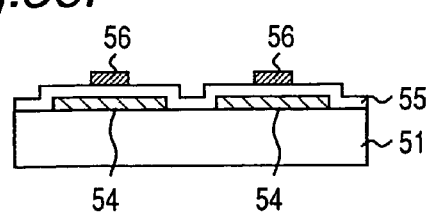

First, an amorphous silicon thin film 52 is deposited on a glass substrate 51 as shown in FIG. 36B. Then, an exciter laser 53 is applied as shown in FIG. 36C, thereby forming a polysilicon thin film 54. Next, the polysilicon thin film 54 is patterned into an active region shape as shown in FIG. 36D, and thereafter a gate insulating film 55 made of silicon dioxide is formed on the upper surface as shown in FIG. 36E. Next, a gate electrode 56 of a thin-film transistor is formed of aluminum or the like on the gate insulating film 55 as shown in FIG. 36F.

Figure 36G:
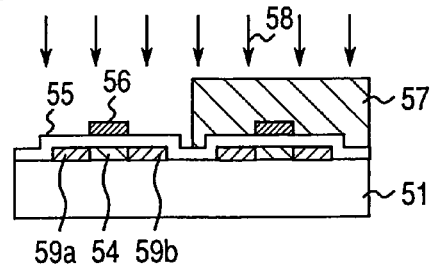
Figure 36H:
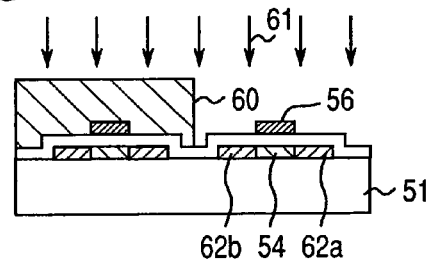
Figure 36I:
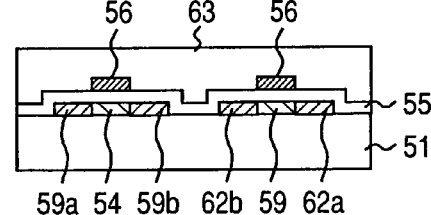
Figure 36J:
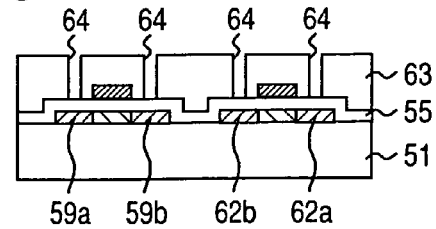
Figure 36K:
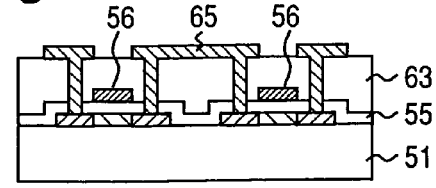

Subsequently, as shown in FIG. 36G, the region of the p-type thin-film transistor is covered with a resist 57 and an impurity of "phosphorus 58" is injected into the source region and the drain region of an n-type thin-film transistor using the gate electrode 56 as an exposure mask. Thus, n$^+$ regions 59a and 59b are formed on both sides of the gate electrode 56 of the polysilicon thin film 54. Likewise, as shown in FIG. 36H, the region of the n-type thin-film transistor is covered with a resist 60 and an impurity of "boron 61" is injected into the source region and the drain region of a p-type thin-film transistor using the gate electrode 56 as an exposure mask. Thus, p+regions 62a and 62b are formed on both sides of the gate electrode 56 of the polysilicon thin film 54. Subsequently, as shown in FIG. 36I, an interlayer insulating film 63 made of silicon dioxide or silicon nitride is deposited. Then, contact holes 64 that reach the n$^+$ regions 59a and 59b and the p$^+$ regions 62a and 62b (i.e., the source and drain regions) are opened through the interlayer insulating film 63 as shown in FIG. 36J, and thereafter, a metal wiring 65 of aluminum or the like is formed through the contact holes 64 as shown in FIG. 36K.

Since the process maximum temperature is 600° C. in the gate insulating film 55 forming stage in the above fabricating procedure, a highly thermos table glass such as the 1737 glass of U.S. Corning Corp. can be used. Furthermore, since the fabrication can be achieved at a temperature not higher than 600° C., an inexpensive large-area glass substrate can be used, thereby allowing the cost reduction and the increased area of the liquid crystal display device to be achieved.

Further, when forming the above liquid crystal display device, a transparent electrode (in the case of the transmission type liquid crystal display device) or a reflection electrode (in the case of the reflection type liquid crystal display device) is to be subsequently further formed via another interlayer insulating film.

Although the above description is based on the complementary type polysilicon thin-film transistor taken as an example, the transistor may not be the complementary type in the least. Furthermore, although the above description is based on the forward stagger (top gate) in which the polysilicon thin film 54 located on the insulating substrate 49 (51) is made to serve as the active regions 59a and 59b taken as an example, the present invention is not limited to this, and the reverse stagger structure or another structure may be adopted.

By using the aforementioned polysilicon thin-film transistor as an active element, a scanning signal line drive circuit GD and a data signal line drive circuit SD having a practical driving power can be constructed through roughly identical fabricating processes on the same substrate SUB as that of the pixel array ARY shown in FIG. 34.

Furthermore, the aforementioned polysilicon thin-film transistor has a driving power that is one or two orders of magnitude smaller than the monocrystal silicon transistor (MOS (Metal Oxide Semiconductor) transistor). Therefore, when executing a high-speed operation as in the case of data signal line drive circuit SD, the gate width is required to be large in order to gain the driving power. Then, the gate capacity is increased in accordance with the arrangement, and this may incur an increase is consumption of power because the clock signal line itself or the like, which is connected to the gates of several hundreds of transistors, operates as a heavy load. However, according to the present embodiment, the shift registers 11 and 21 that use the clock signals ck and /ck of a small amplitude as shown in FIG. 1 or FIG. 25 are used for the data signal line drive circuit SD. Therefore, the load of the clock signal lines CLK and /CLK can be reduced to allow the consumption of power to be reduced.

Furthermore, in the case where the level shifter circuit LS as shown in FIG. 30 or FIG. 33 is constructed of the aforementioned polysilicon thin-film transistors, there occurs an increased variation in duty ratio of the pulse due to the small driving power, as compared with the case where the level shifter circuit LS is constructed of monocrystal transistors. However, according to the present embodiment, since the shift registers 11 and 21 as shown in FIG. 1 or FIG. 10 are employed. With this arrangement, the pulse width of the sampling signal can be uniformed to prevent the occurrence of overlap of adjacent sampling signals in terms of time. Therefore, the deterioration in display quality can be suppressed.

Although several embodiments of the present invention have been described above, the present invention is not limited to them and is able to be similarly applied to another construction (image display devices or the like other than the liquid crystal display device) such as a combination of the aforementioned embodiments.

FIRST EMBODIMENT

Figure 51:
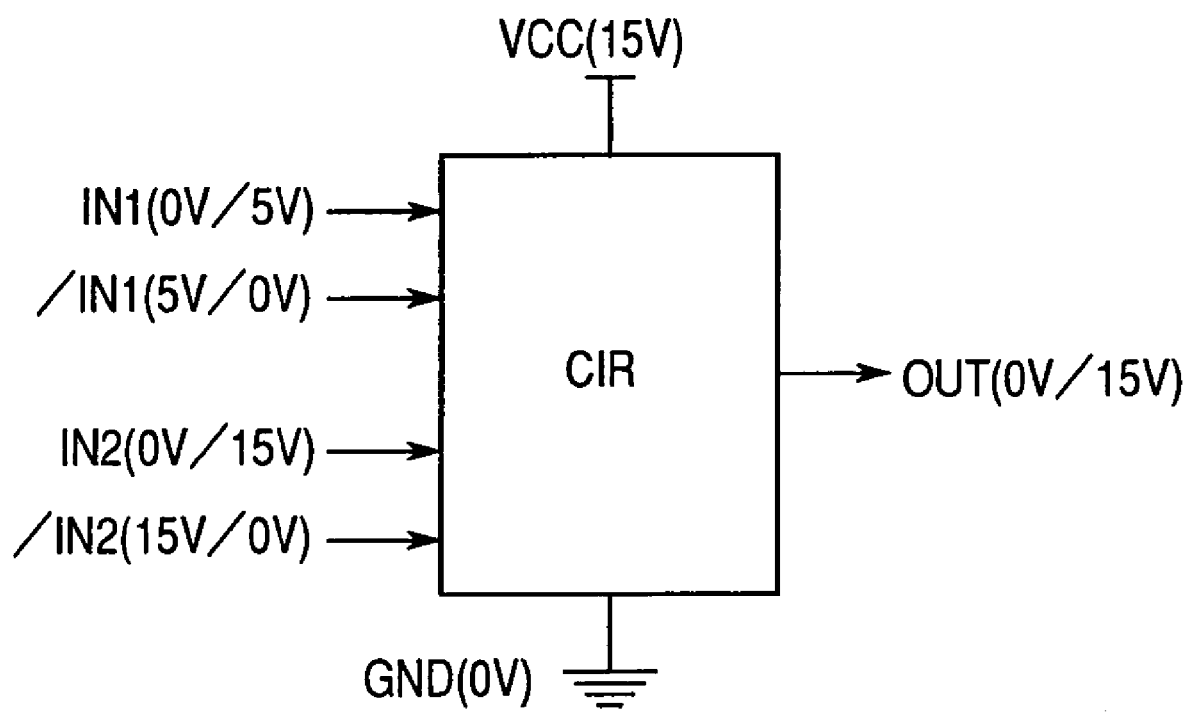
FIG. 51 is a block diagram showing the construction of the logical circuit of the present invention.

A first embodiment of the logical circuit of the present invention will be described below with reference to drawings. FIG. 51 is a block diagram showing an example of the construction of the logical circuit according to the present invention. In FIG. 51, the drive voltage of the logical circuit is 15 V, and the amplitude of each of input signals IN2 and /IN2 is 15 V, whereas the amplitude of each of input signals IN1 and /IN1 is 5 V.

In the logical circuit of the present invention, by inputting the input signal having a lower voltage than the drive voltage to the logical circuit, it is possible to reduce the power consumption of an input signal line.

Referring to FIG. 51, the amplitude of each of the input signals IN2 and /IN2 is different from that of each of the input signals IN1 and /IN1. However, there is no problem when the amplitude of each of the input signals IN2 and /IN2 and that of each of the input signals IN1 and /IN1 are equally 5 V. This applies to the embodiments that will be described later.

It is to be noted that it is necessary to show inverted signals for some signals in the drawings which will be shown below. However, in some drawings, the inverted signals are not shown.

Figure 52:
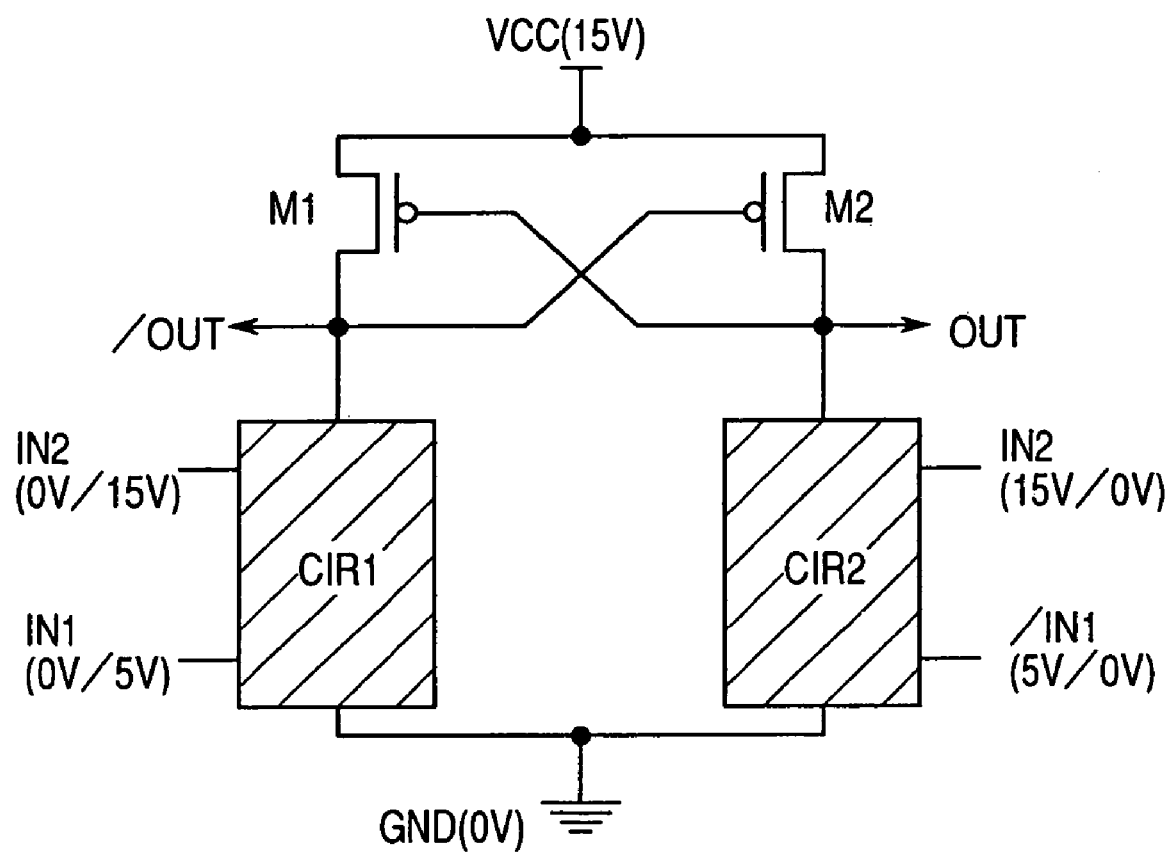
FIG. 52 is a block diagram showing an example of the construction of the logical circuit of the present invention.
Figure 53:
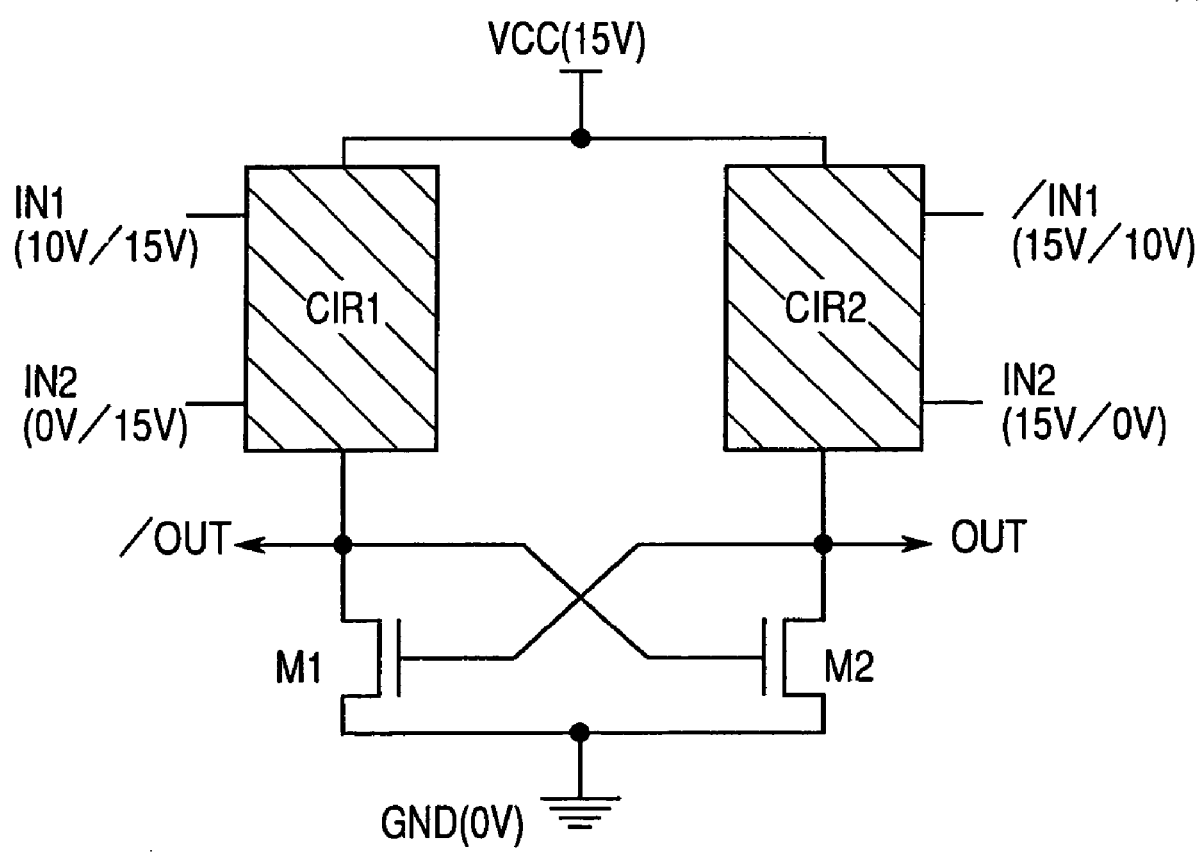
FIG. 53 is a block diagram showing another example of the construction of the logical circuit of the present invention.

FIGS. 52 and 53 show the basic construction of the logical circuit of the present invention. In FIG. 52, the supply voltage of the logical circuit is 15 V and the amplitude of each of the input signals IN2 and /IN2 is also 15 V, whereas that of each of the input signals IN1 and /IN1 is 5 V.

The gate electrode of a p-type transistor M1 is connected with the drain electrode of a p-type transistor M2, and the drain electrode of the p-type transistor M1 is connected with the gate electrode of the p-type transistor M2 to form a latch circuit. The input signals IN1, IN2 and the input signals /IN1, /IN2 are inputted to sections CIR1 and CIR2, respectively consisting of an n-type transistor, respectively. The construction of each of the sections CIR1 and CIR2 is similar to that of a conventional CMOS logical circuit. That is, the section CIR1 has the same construction as that of a circuit consisting of n-type transistors of the conventional CMOS logical circuit outputting a logical operation result similar to that of the logical circuit of the first embodiment. The section CIR2 has the same construction as that of a circuit consisting of a p-type transistors of the conventional CMOS logical circuit outputting a logical operation result similar to that of the logical circuit of the first embodiment. It is to be noted that the input signal to the section CIR2 is inverse to the input signal to the section consisting of the p-type transistors of the conventional CMOS logical circuit.

FIG. 53 shows an example of the case in which the channel type of the transistors of FIG. 52 is inverted. In FIG. 53, the supply voltage of the logical circuit is 15 V and the amplitude of each of the input signals IN2 and /IN2 is also 15 V, whereas that of each of the input signals IN1 and /IN1 is 5 V. It is to be noted that the absolute value of each of the input signals IN1 and /IN1 is different from that of each thereof shown in FIG. 52.

The gate electrode of an n-type transistor M1 is connected with the drain electrode of an n-type transistor M2, and the drain electrode of the n-type transistor M1 is connected with the gate electrode of the n-type transistor M2 to form a latch circuit. The input signals IN1, IN2 and the input signals /IN1, /IN2 are inputted to the sections CIR1 and CIR2, respectively consisting of, n-type transistors, respectively. The construction of each of the sections CIR1 and CIR2 is similar to that of the conventional CMOS logical circuit in their connection relations. That is, the section CIR1 has the same construction as that of the circuit consisting of the p-type transistors of the conventional CMOS logical circuit outputting a logical operation result similar to that of the logical circuit of the first embodiment. The section CIR2 has also the same construction as that of the circuit consisting of n-type transistors of the conventional CMOS logical circuit outputting a logical operation result similar to that of the logical circuit of the first embodiment.

Figure 54:
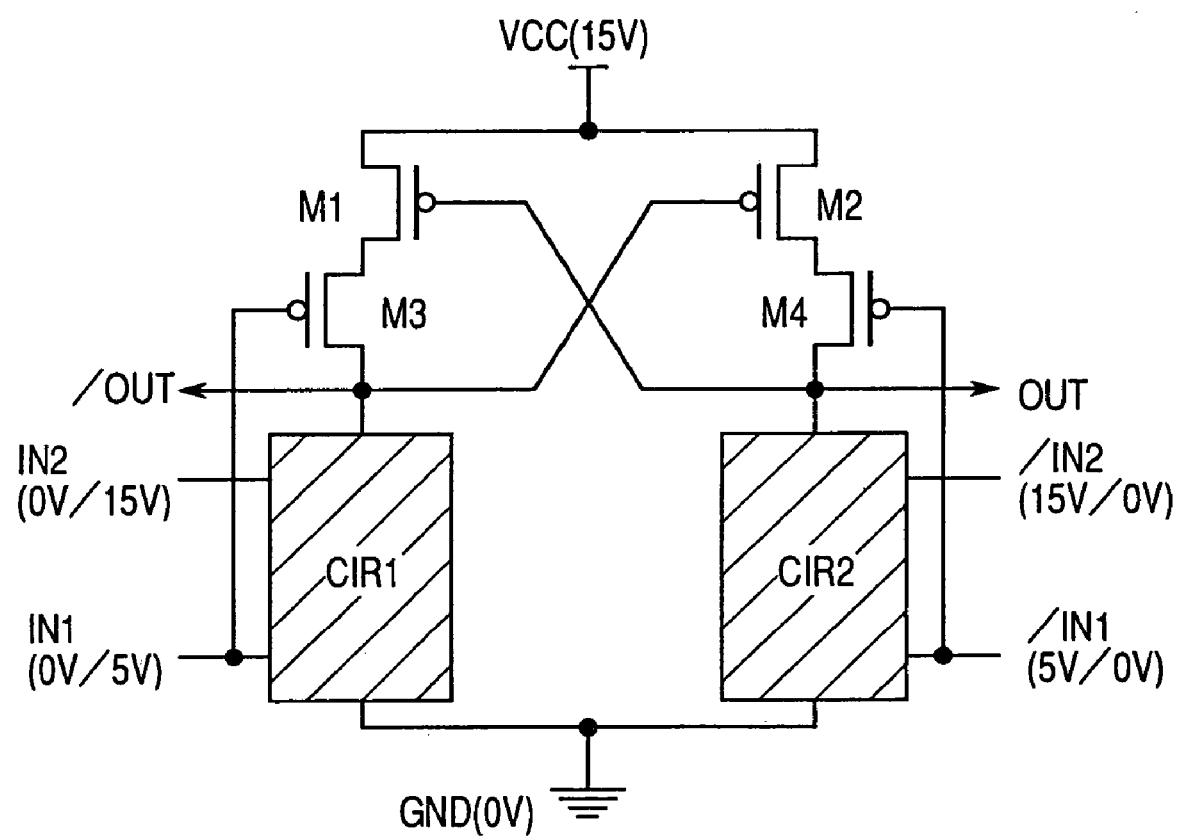
FIG. 54 is a block diagram showing another example of the construction of the logical circuit of the present invention.
Figure 55:
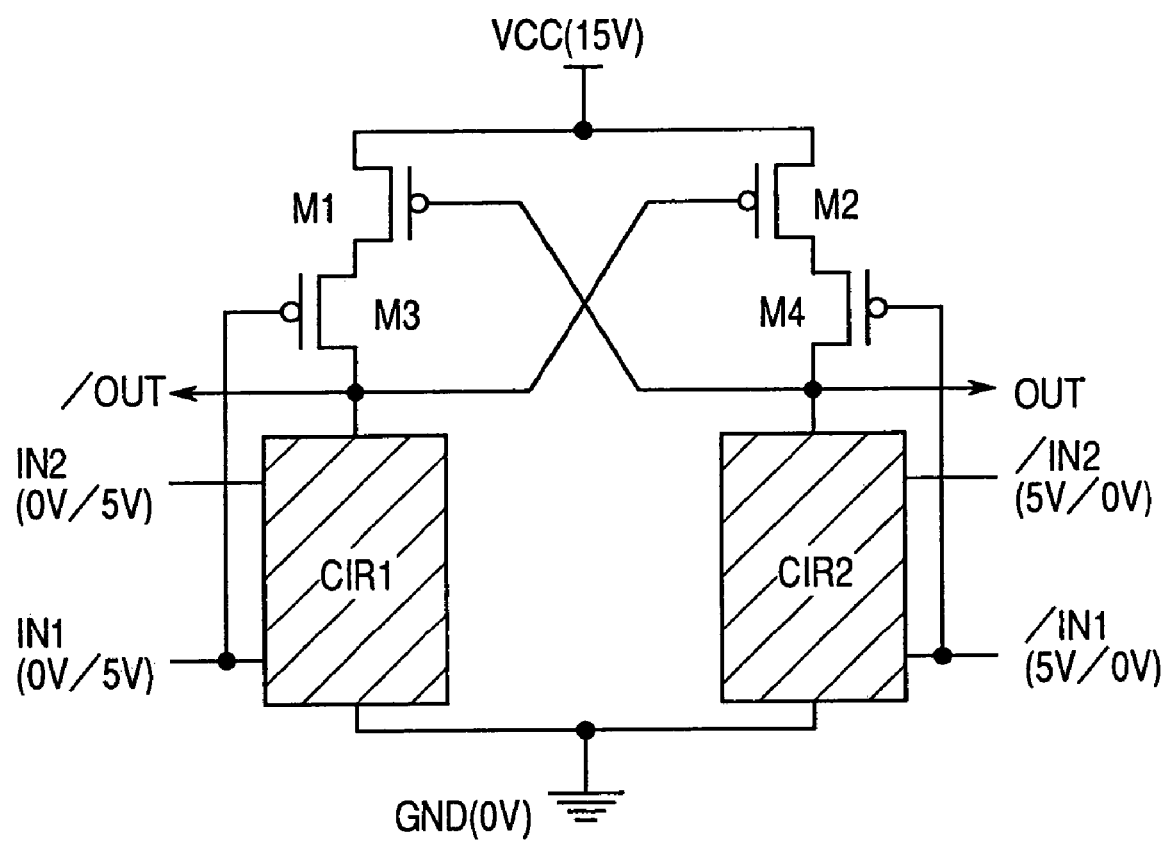
FIG. 55 is a block diagram showing another example of the construction of the logical circuit of the present invention.

FIGS. 54 and 55 show another construction of the logical circuit of the present invention. A transistor M3 is connected between the drain electrode of the p-type transistor M1 and an output terminal of one current path. Similarly, a transistor M4 is connected between the drain electrode of the p-type transistor M2 and an output terminal of the other current path. The gate electrode of each of the transistors M3 and M4 is connected with each input terminal.

The input signals IN1, IN2 and the input signals /IN1, /IN2 are inputted to the sections CIR1 and CIR2, respectively consisting of the n-type transistors, respectively. The construction of each of the sections CIR1 and CIR2 is similar to that of the conventional CMOS logical circuit. That is, the section CIR1 has the same construction as that of the circuit consisting of n-type transistors of the conventional CMOS logical circuit outputting a logical operation result similar to that of the logical circuit of the first embodiment. The section CIR2 has the same construction as that of the circuit consisting of p-type transistors of the conventional CMOS logical circuit outputting a logical operation result similar to that of the logical circuit of the first embodiment.

Figure 56:
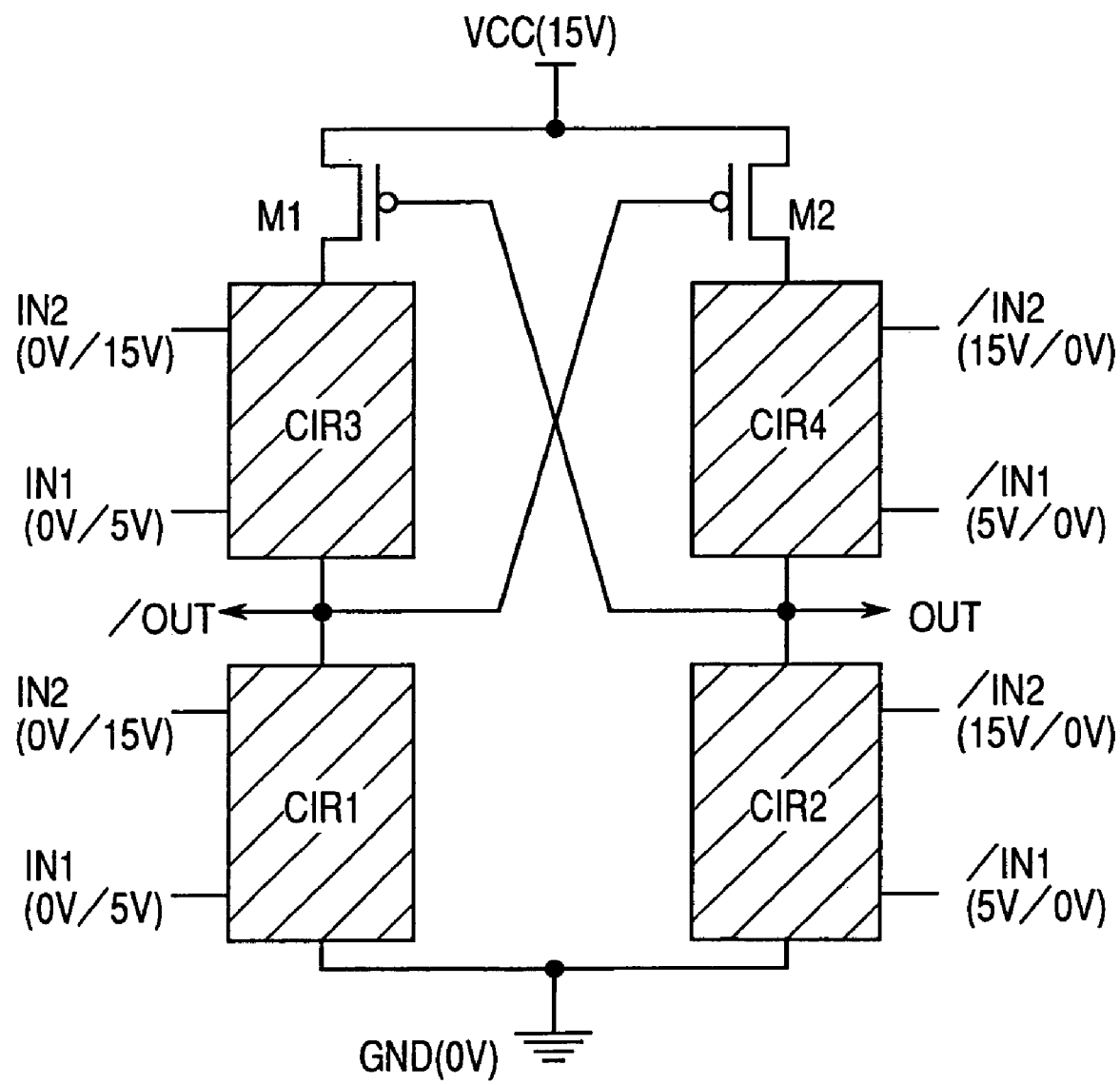
FIG. 56 is a block diagram showing another example of the construction of the logical circuit of the present invention.
Figure 57:
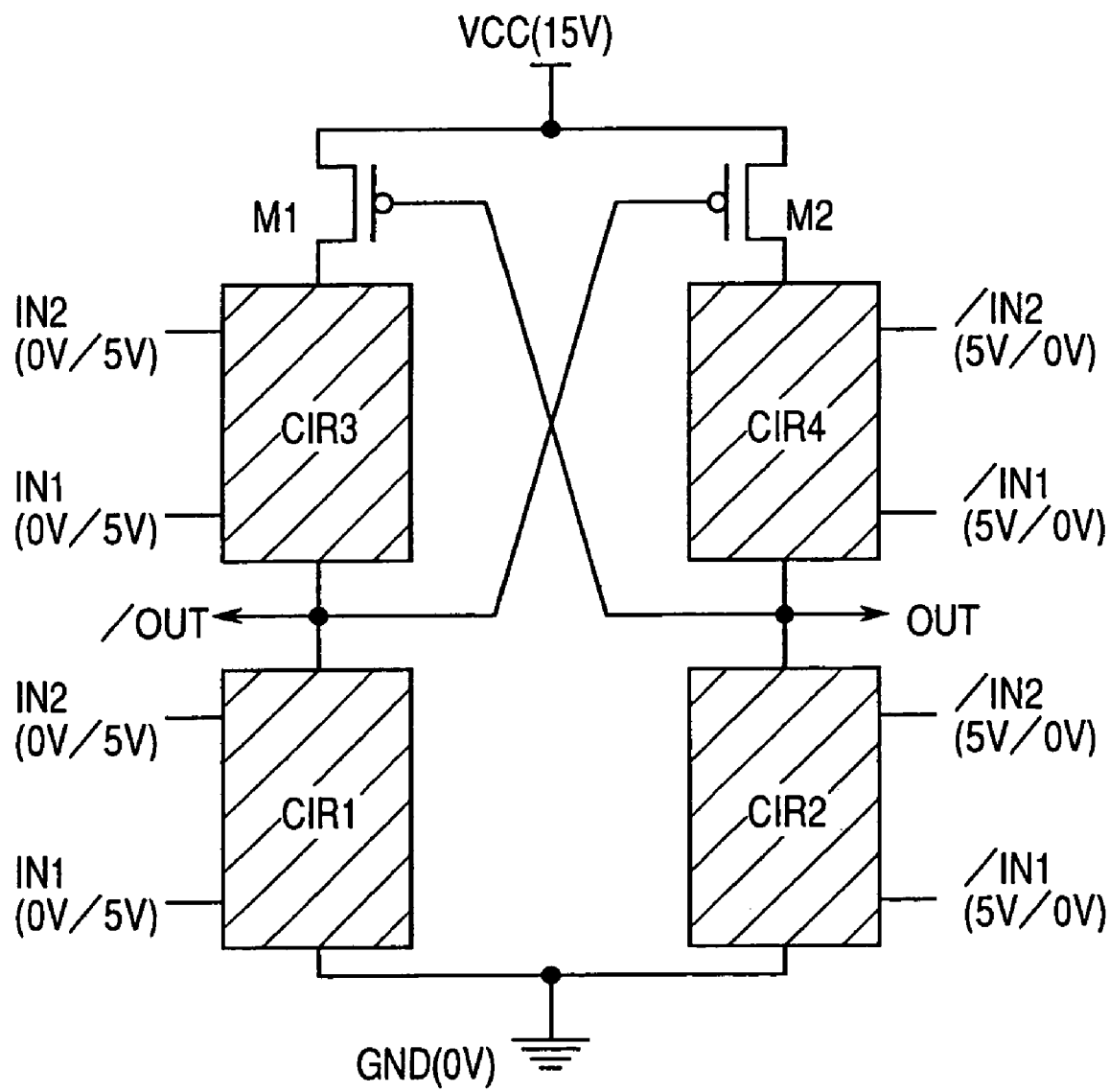
FIG. 57 is a block diagram showing another example of the construction of the logical circuit of the present invention.

FIGS. 56 and 57 show another construction of the logical circuit of the present invention. The sections CIR1 and CIR2 are constructed of n-type transistors, respectively, whereas sections CIR3 and CIR4 are constructed of p-type transistors, respectively. The construction of each of the sections CIR1, CIR2, CIR3, and CIR4 is similar to that of the conventional CMOS logical circuit. That is, each of the sections CIR1 and CIR2 has the same construction as that of the circuit having the n-type transistor of the conventional CMOS logical circuit outputting a logical operation result similar to that of the logical circuit of the first embodiment. Each of the sections CIR3 and CIR4 has the same construction as that of the circuit consisting of p-type transistors of the conventional CMOS logical circuit outputting a logical operation result similar to that of the logical circuit of the first embodiment.

The p-type transistors M1 and M2 are provided at the power source side of their respective current path. The gate electrode of the p-type transistor M1 is connected with an output terminal of the current path of the p-type transistor M2.

The gate electrode of the p-type transistor M2 is connected an output terminal of the current path of the p-type transistor M1.

In the description of the following embodiments, circuit diagrams corresponding to the basic construction shown in FIG. 52 are mainly shown. But needless to say, the circuits of the following embodiments may have channel type-inverted transistors.

SECOND EMBODIMENT

A second embodiment of the logical circuit of the present invention will be described below with reference to drawings.

Figure 58:
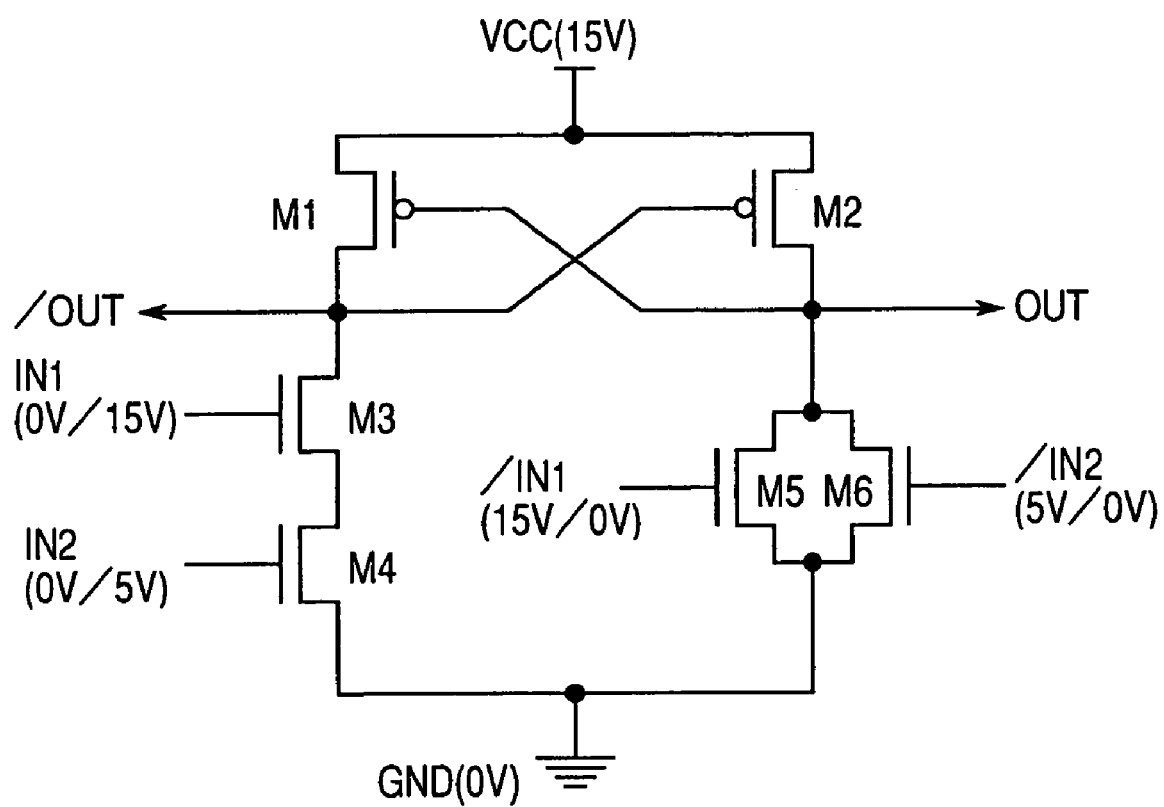
FIG. 58 is a circuit diagram showing a concrete example of the logical circuit of the present invention.

FIG. 58 is a circuit diagram showing an example of the construction of the logical circuit according to the present invention. The circuit has the function of a non-conjunction (NAND) circuit. But depending on a signal selection manner of input and out put, the circuit can serve as any of a non-disjunction (NOR) circuit, logical product (AND) circuit, and a logical sum (OR) circuit. That is, supposing that input signals to the logical circuit are IN1 and IN2 and that an output signal there from is /OUT, the logical circuit functions as the non-conjunction circuit. Supposing that the input signals thereto are /IN1 and /IN2 and that the output signal there from is OUT, the logical circuit functions as the non-disjunction circuit. Further, supposing that the input signals thereto are IN1 and IN2 and that the output signal there from is OUT, the logical circuit functions as the logical product circuit. Supposing that the input signals thereto are /IN1 and /IN2 and that the output signal there from is /OUT, the logical circuit functions as the logical sum circuit.

In the construction shown in FIG. 58, the gate electrode of the p-type transistor M1 is connected with the drain electrode of the p-type transistor M2, and the drain electrode of the p-type transistor M1 is connected with the gate electrode of the p-type transistor M2 to form a latch circuit. The input signals IN1, /IN1, IN2, and /IN2 are inputted to n-type transistors, respectively. More specifically, the input portion of each of the input signals IN1 and IN2 has the same construction as that of the circuit consisting of n-type transistors of the conventional NAND circuit shown in FIG. 79 (or the circuit consisting of p-type transistors of the conventional NOR circuit shown in FIG. 80). The input portion of each of the input signals /IN1 and /IN2 has the same construction as that of the circuit consisting of p-type transistors of the conventional NAND circuit shown in FIG. 79 (or the circuit consisting of n-type transistors of the conventional NOR circuit shown in FIG. 80).

In the construction shown in FIG. 58, the input signal IN2 having a smaller amplitude than the input signal IN1 is inputted to a transistor M4 nearer to a ground power source GND than a transistor M3. However, the input signal IN2 is not necessarily inputted to the nearer transistor to the ground power source. Even though the input signal IN2 is inputted to the far-side transistor M3, the logical circuit operates correctly. This applies to the constructions of the other embodiments. However, there is a case in which the electric potential of the connection point between the transistors M3 and M4 is higher than a ground potential by a value corresponding to the resistance of the transistor M4. In this case, a voltage to be applied substantially to the gate of the transistor M3 drops and thus its drive force drops. Thus, it is preferable that the input signal having the smaller amplitude is inputted to nearer transistor to the ground potential side to increase the operating margin.

In the second embodiment, the number of the input signals is two (not including inverted signal), however, the second embodiment has a similar construction if three or more input signals are used.

THIRD EMBODIMENT

Figure 59:
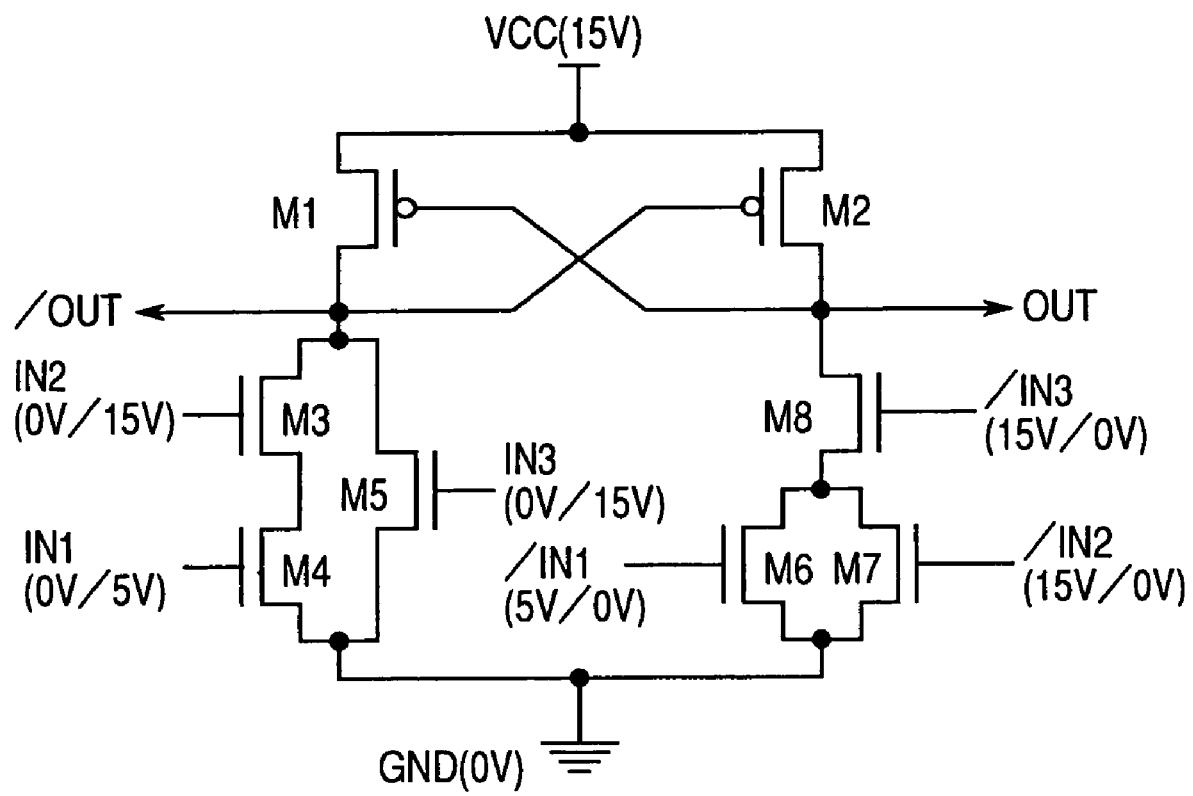
FIG. 59 is a circuit diagram showing another concrete example of the logical circuit of the present invention.
Figure 60:
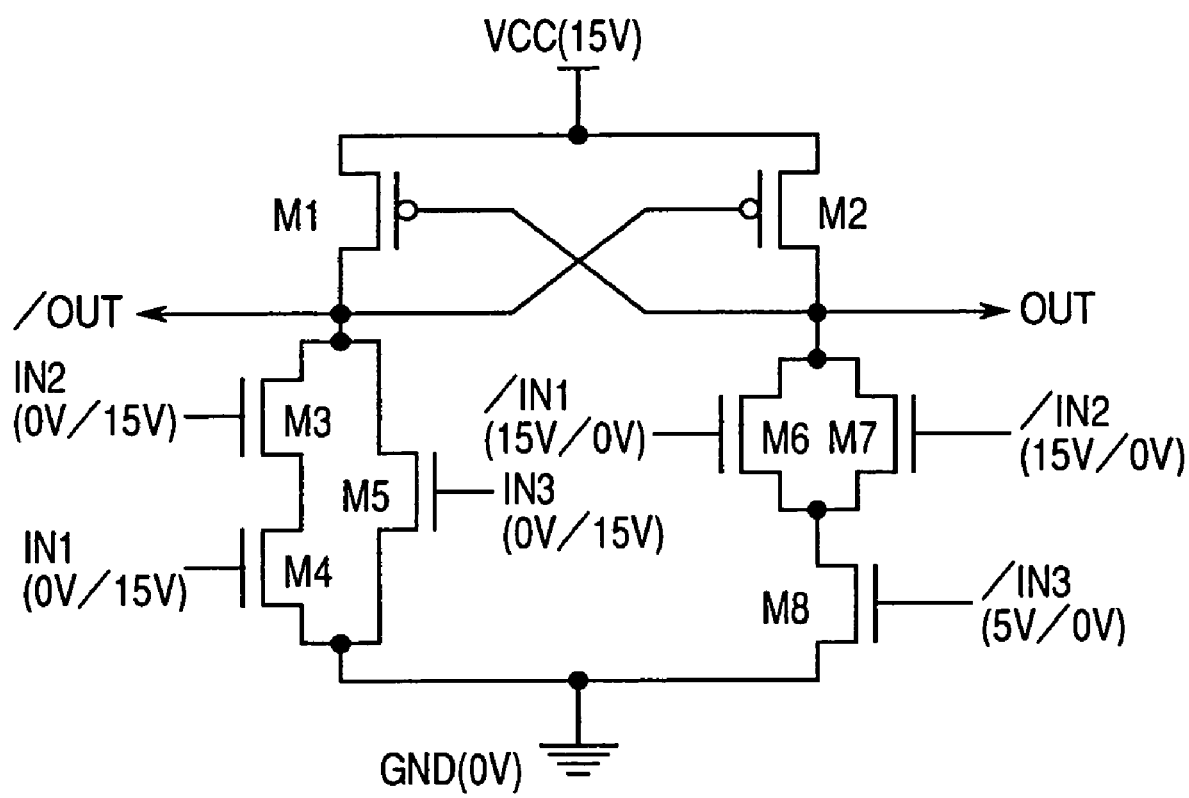
FIG. 60 is a circuit diagram showing another concrete example of the logical circuit of the present invention.

Another embodiment of the logical circuit of the present invention will be described below with reference to drawings. FIGS. 59 and 60 are circuit diagrams showing another example of the construction of the logical circuit of the present invention.

The circuit has the function of a logical product and non-disjunction (AND-NOR) circuit. But depending on a signal selection manner of input and output, the circuit can serve as any of a logical sum and non-conjunction (OR-NAND) circuit, a logical product-logical sum (AND-OR) circuit, a logical sum-logical product (OR-AND) circuit. That is, supposing that input signals to the logical circuit are IN1, IN2, and IN3 and that an output signal there from is /OUT, the logical circuit functions as the logical product and non-disjunction circuit. Supposing that the input signals thereto are /IN1, /IN2, and /IN3 and that the output signal there from is OUT, the logical circuit functions as the logical sum and non-conjunction circuit. Further, supposing that the input signals thereto are IN1, IN2, and IN3 and that the output signal there from is OUT, the logical circuit functions as the logical product-logical sum circuit. Supposing that the input signals thereto are /IN1, /IN2, and /IN3 and that the output signal there from is /OUT, the logical circuit functions as the logical sum-logical product circuit.

In the construction shown in FIGS. 59 and 60, the gate electrode of the p-type transistor M1 is connected with the drain electrode of the p-type transistor M2, and the drain electrode of the p-type transistor M1 is connected with the gate electrode of the p-type transistor M2 to form a latch circuit. The input signals IN1, /IN1, IN2, /IN2, IN3, and /IN3 are inputted to respective n-type transistors. More specifically, the input portion of each of the input signals IN1, IN2, and IN3 has the same construction as that of the circuit consisting of n-type transistors of the conventional AND-NOR circuit shown in FIG. 81 (or the circuit consisting of p-type transistors of the conventional OR-NAND circuit shown in FIG. 82). The input portion of each of the input signals /IN1, /IN2, and /IN3 has the same construction as that of the circuit consisting of p-type transistors of the conventional AND-NOR circuit shown in FIG. 81 (or the circuit consisting of n-type transistors of the conventional OR-NAND circuit shown in FIG. 82).

In the construction shown in FIG. 59, the input signals IN1 and /IN1 are inputted to the respective transistors near the ground potential. The construction is suitable for the case where the amplitude of each of the input signals IN1 and /IN1 is small. In the construction shown in FIG. 60, the input signal /IN3 is inputted to the transistor M8 near the ground potential. This construction is suitable for the case where the amplitude of the input signal /IN3 is small.

FOURTH EMBODIMENT

Figure 61:
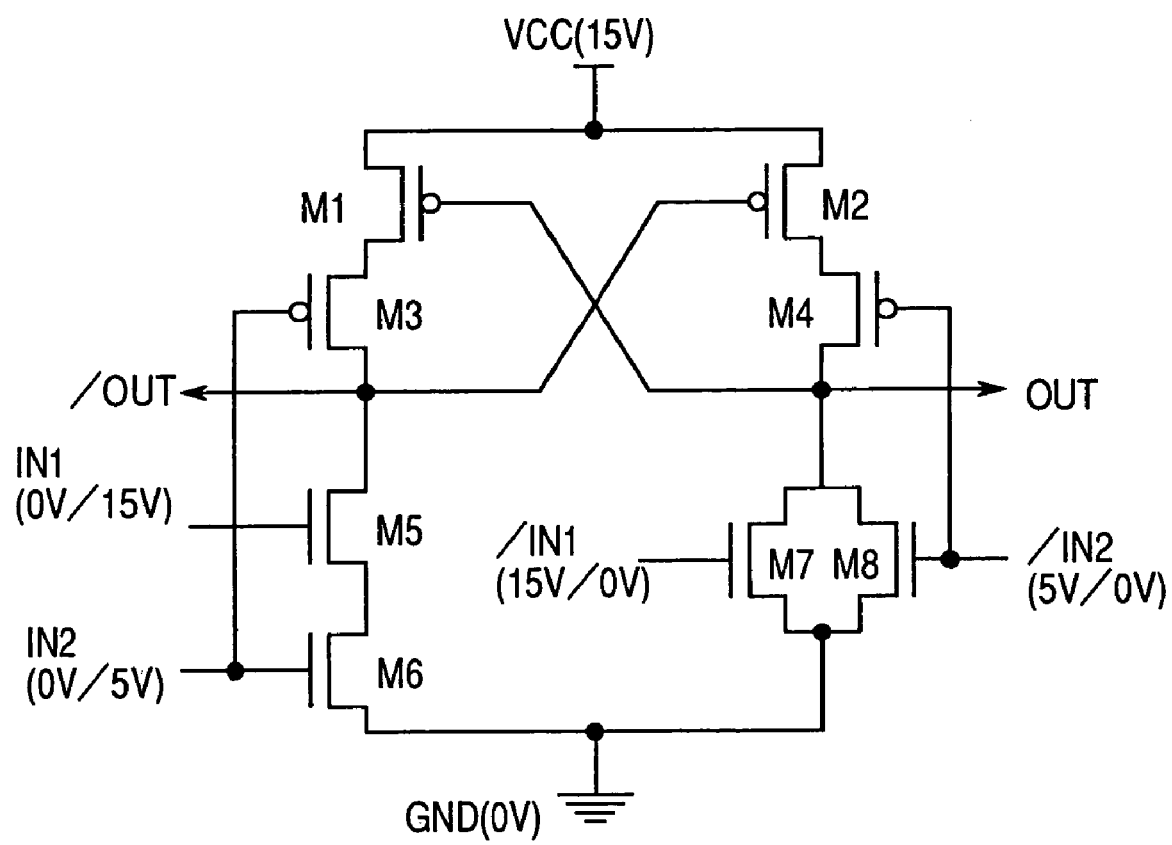
FIG. 61 is a circuit diagram showing another concrete example of the logical circuit of the present invention.
Figure 62:
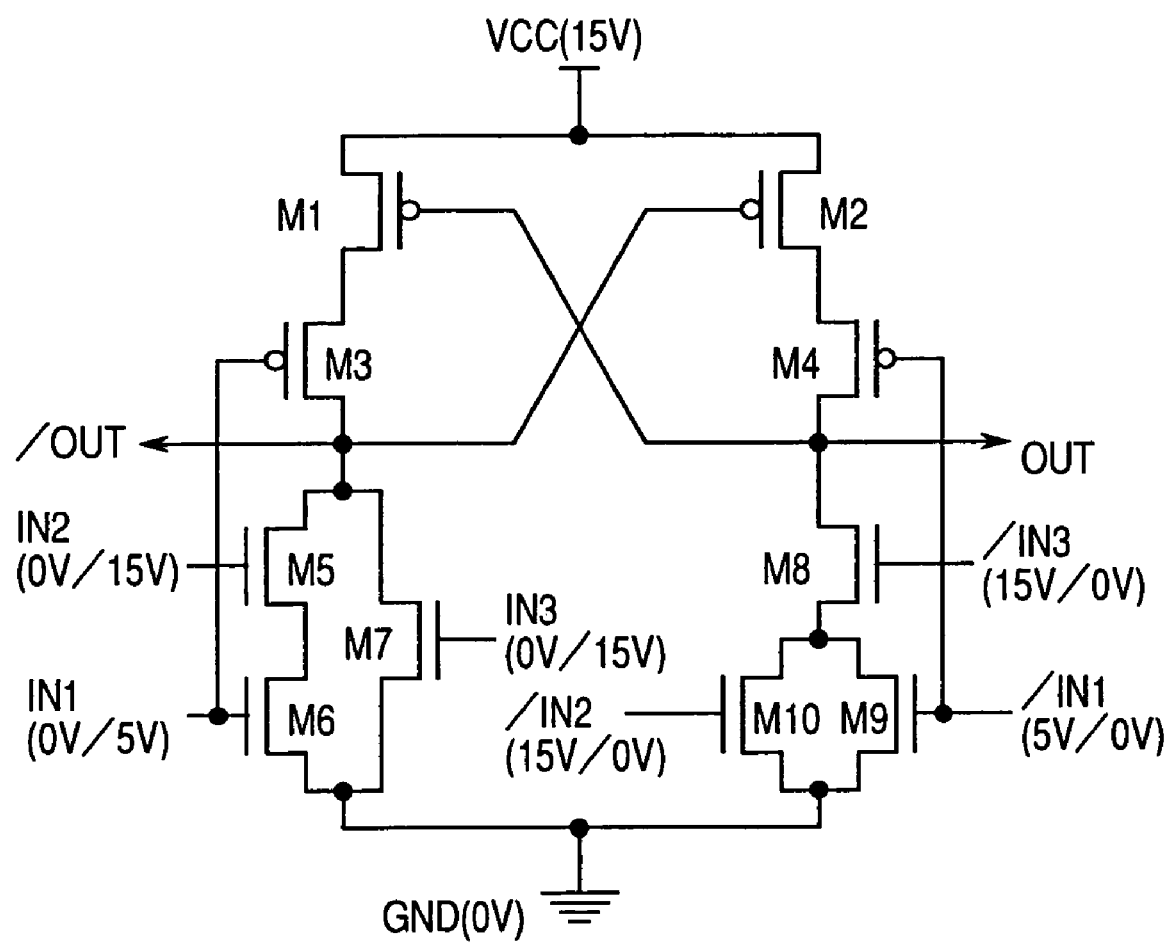
FIG. 62 is a circuit diagram showing another concrete example of the logical circuit of the present invention.
Figure 63:
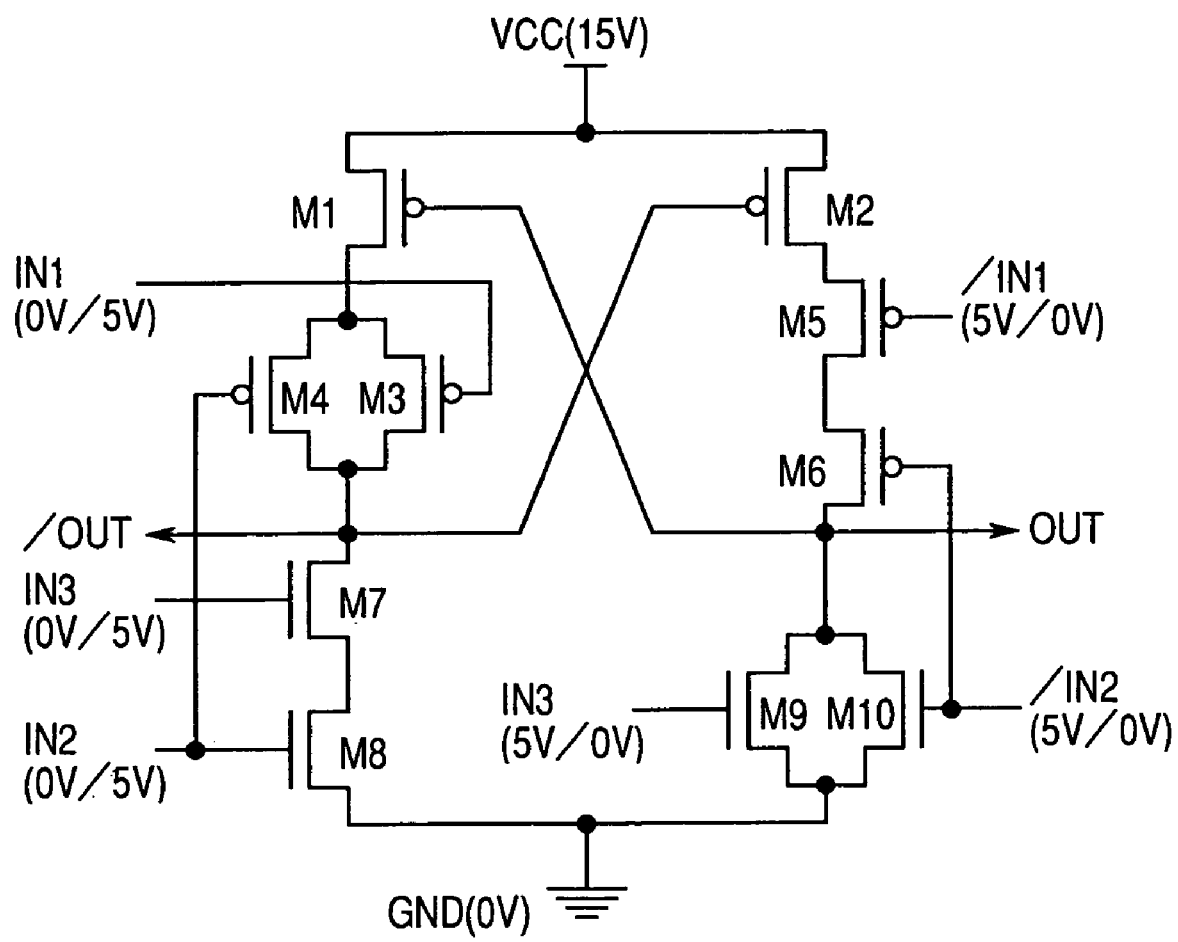
FIG. 63 is a circuit diagram showing another concrete example of the logical circuit of the present invention.

Another embodiment of the logical circuit of the present invention will be described below with reference to drawings. FIGS. 61, 62, and 63 are circuit diagrams showing another example of the construction of the logical circuit according to the present invention. In the construction shown in FIG. 61, the circuit has the function of the non-conjunction (NAND) circuit. But depending on a signal selection manner of input and output, the circuit can serve as any of the non-disjunction (NOR) circuit, the logical product (AND) circuit, and the logical sum (OR) circuit. That is, supposing that input signals to the logical circuit are IN1 and IN2 and that an output signal there from is /OUT, the logical circuit functions as the non-conjunction circuit. Supposing that the input signals thereto are /IN1 and /IN2 and that the output signal there from is OUT, the logical circuit functions as the non-disjunction circuit. Further, supposing that the input signals thereto are IN1 and IN2 and that the output signal there from is OUT, the logical circuit functions as the logical product circuit. Supposing that the input signals thereto are /IN1 and /IN2 and that the output signal there from is /OUT, the logical circuit functions as the logical sum circuit.

In the construction shown in FIG. 61, the p-type transistor M3 is connected between the drain electrode of the p-type transistor M1 and the output terminal of the current path of the same transistor M1. Similarly, the p-type transistor M4 is connected between the drain electrode of the p-type transistor M2 and the output terminal of the current path of the same transistor M2. The gate electrode of the p-type transistor M3 and that of the p-type transistor M4 are connected with the input signals IN2 and /IN2, respectively.

The input signals IN1, /IN1, IN2, and /IN2 are inputted to respective n-type transistors. More specifically, the input portion of each of the input signals IN1 and IN2 has the same construction as that of the circuit consisting of n-type transistors of the conventional NAND circuit shown in FIG. 79 (or the circuit consisting of p-type transistors of the conventional NOR circuit shown in FIG. 80). The input portion of each of the input signals /IN1 and /IN2 has the same construction as that of the circuit consisting of p-type transistors of the conventional NAND circuit shown in FIG. 79 (or the circuit consisting of n-type transistors of the conventional NOR circuit shown in FIG. 80).

The circuit shown in FIG. 62 has the function of a logical product and non-disjunction (AND-NOR) circuit. But depending on a signal selection manner of input and output, the circuit can serve as any of the logical sum and non-conjunction (OR-NAND) circuit, the logical product-logical sum (AND-OR) circuit, the logical sum and logical product (OR-AND) circuit. That is, supposing that input signals to the logical circuit are IN1, IN2, and IN3 and that an output signal there from is /OUT, the logical circuit functions as the logical product and non-disjunction circuit. Supposing that the input signals thereto are /IN1, /IN2, and /IN3 and that the output signal there from is OUT, the logical circuit functions as the logical sum and non-conjunction circuit. Further, supposing that the input signals thereto are IN1, IN2, and IN3 and that the output signal there from is OUT, the logical circuit functions as the logical product-logical sum circuit. Supposing that the input signals are /IN1, /IN2, and /IN3 and that the output signal thereto is /OUT, the logical circuit functions as the logical sum-logical product circuit.

In the construction shown in FIG. 62, the p-type transistor M3 is connected between the drain electrode of the p-type transistor M1 and the output terminal of the current path of the same transistor M1. Similarly, the p-type transistor M4 is connected between the drain electrode of the p-type transistor M2 and the output terminal of the current path of the same transistor M2. The gate electrode of the p-type transistor M3 and that of the p-type transistor M4 are connected with the input signals IN1 and /IN1, respectively.

The input signals IN1, /IN1, IN2, /IN2, IN3, and /IN3 are inputted to respective n-type transistors. More specifically, the input portion of each of the input signals IN1, IN2, and IN3 has the same construction as that of the circuit consisting of n-type transistors of the conventional AND-NOR circuit shown in FIG. 81 (or the circuit consisting of p-type transistors of the conventional OR-NAND circuit shown in FIG. 82). The input portion of each of the input signals /IN1, /IN2, and /IN3 has the same construction as that of the circuit consisting of p-type transistors of the conventional AND-NOR circuit shown in FIG. 81 (or the circuit consisting of n-type transistors of the conventional OR-NAND circuit shown in FIG. 82).

In the construction shown in FIG. 62, the input signals IN1 and /IN1 are inputted to the respective transistors near the ground potential. The construction is suitable for the case where the amplitude of each of the input signals IN1 and /IN1 is small.

In the construction shown in FIG. 63, the p-type transistors M3 and M4 are connected between the drain electrode of the p-type transistor M1 and the output terminal of the current path of the same transistor M1. Similarly, p-type transistors M5 and M6 are connected between the drain electrode of the p-type transistor M2 and the output terminal of the current path of the same transistor M2. The gate electrode of the p-type transistor M3 and that of the p-type transistor M4 are connected with the input signals IN1 and IN2, respectively. The gate the p-type transistor M5 and that of the p-type transistor M6 are connected with the input signals /IN1 and /IN2, respectively.

Figure 79:
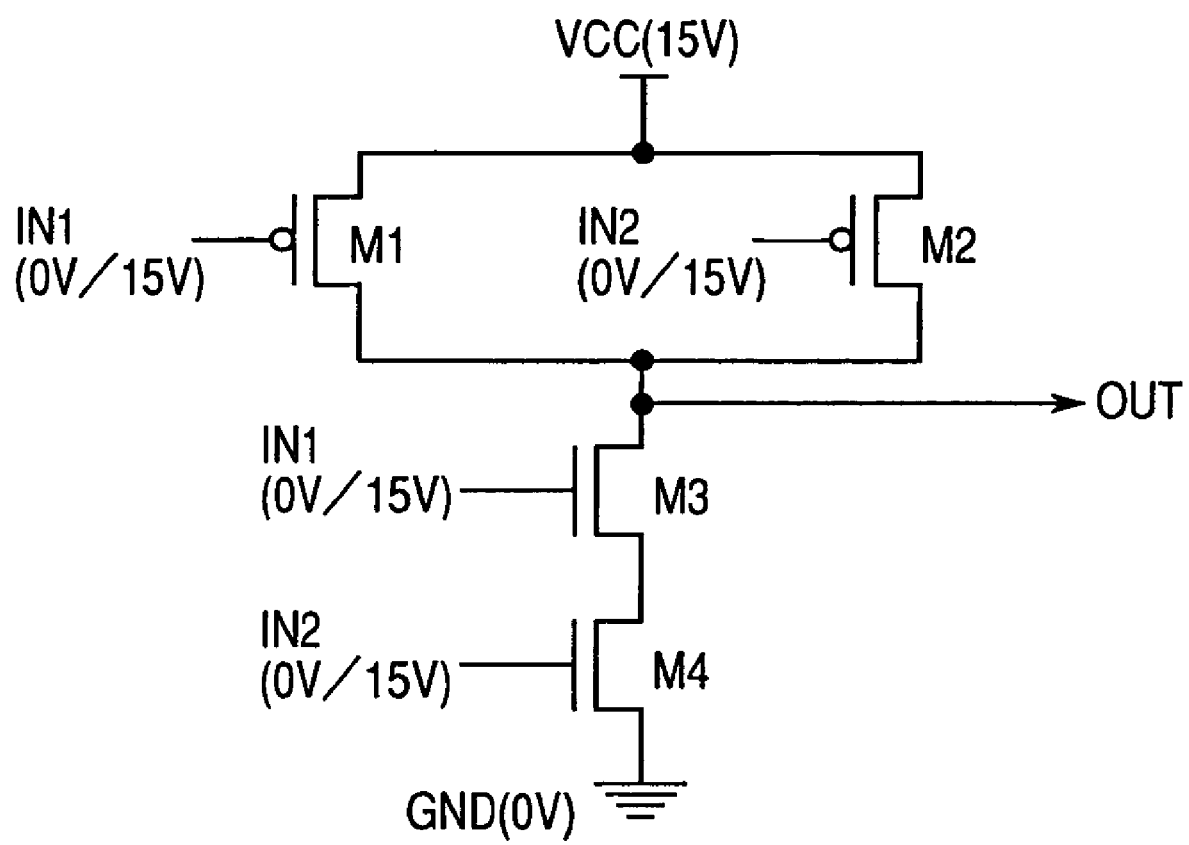
FIG. 79 is a circuit diagram showing the construction of a non-conjunction circuit of a conventional CMOS circuit.
Figure 80:
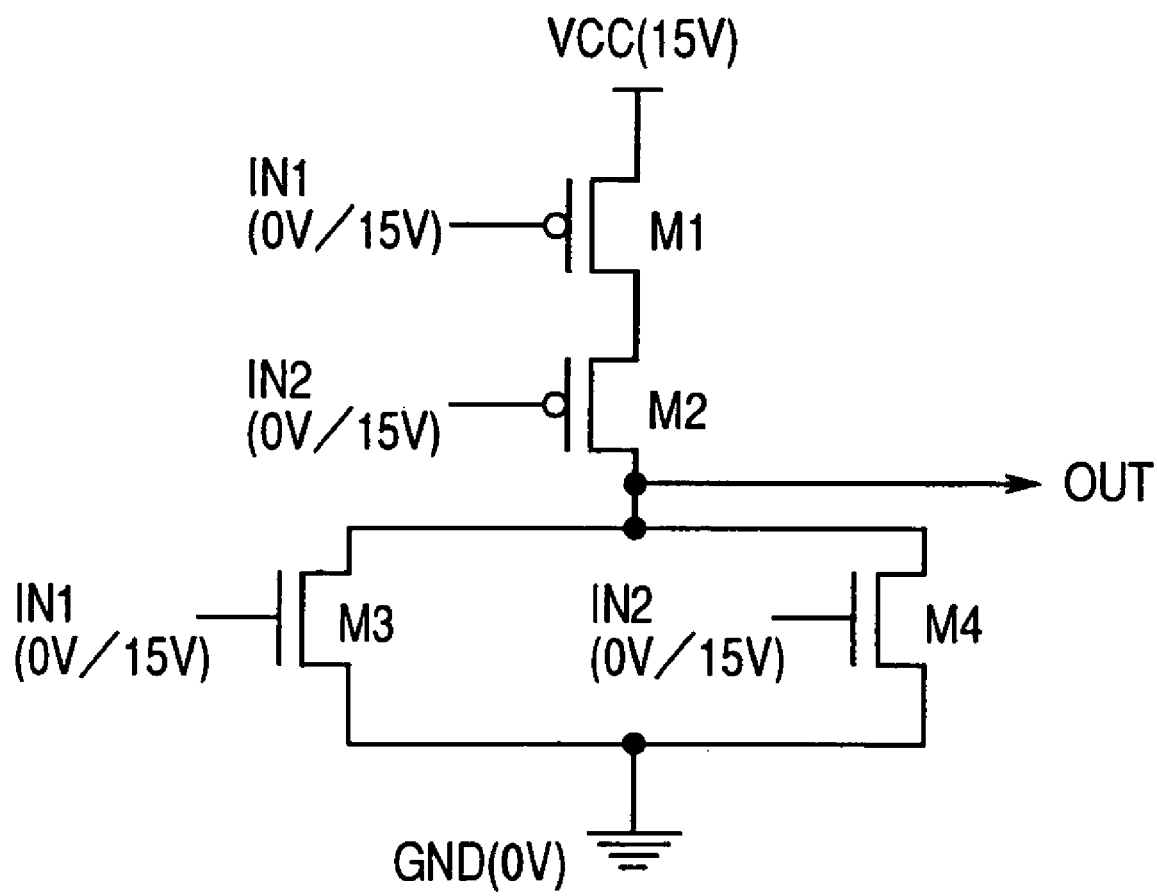
FIG. 80 is a circuit diagram showing the construction of a non-disjunction circuit of the conventional CMOS circuit.

The section consisting of the transistors M5, M6, M7, and M8 has the same construction as that of the section consisting of n-type transistors of the conventional NAND circuit shown in FIG. 79 (or the section consisting of p-type transistors of the conventional NOR circuit shown in FIG. 80). The section consisting of the transistors M3, M4, M9, and M10 has the same construction as that of the section consisting of p-type transistors of the conventional NAND circuit shown in FIG. 79 (or the section consisting of n-type transistors of the conventional NOR circuit shown in FIG. 80).

FIFTH EMBODIMENT

Figure 64:
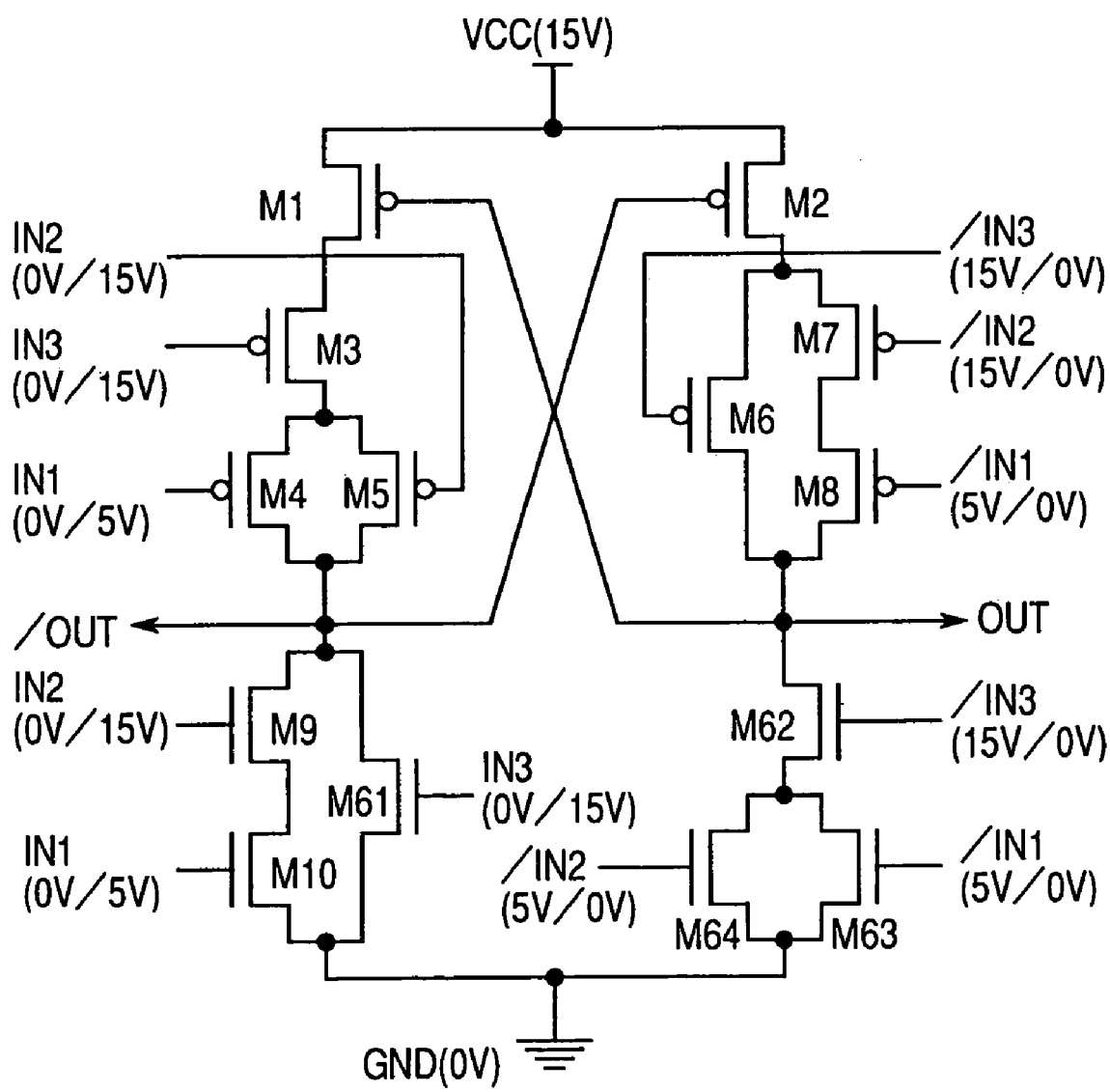
FIG. 64 is a circuit diagram showing another concrete example of the logical circuit of the present invention.

Another embodiment of the logical circuit of the present invention will be described below with reference to drawings. FIG. 64 is a circuit diagram showing another example of the construction of the logical circuit according to the present invention.

In the construction shown in FIG. 64, the p-type transistors M3, M4, and M5 are connected between the drain electrode of the p-type transistor M1 and the output terminal of the current path of the same transistor M1. Similarly, transistors M6, M7, and M8 are connected between the drain electrode of the p-type transistor M2 and the output terminal of the current path of the same transistor M2. The gate electrode of the p-type transistor M3, M4 and M5 are connected with the input signals IN3, IN1, and IN2, respectively. The gate electrode of the p-type transistor M6, M7, and M8 are connected with the input signals /IN3, /IN2, and /IN1, respectively.

Figure 81:
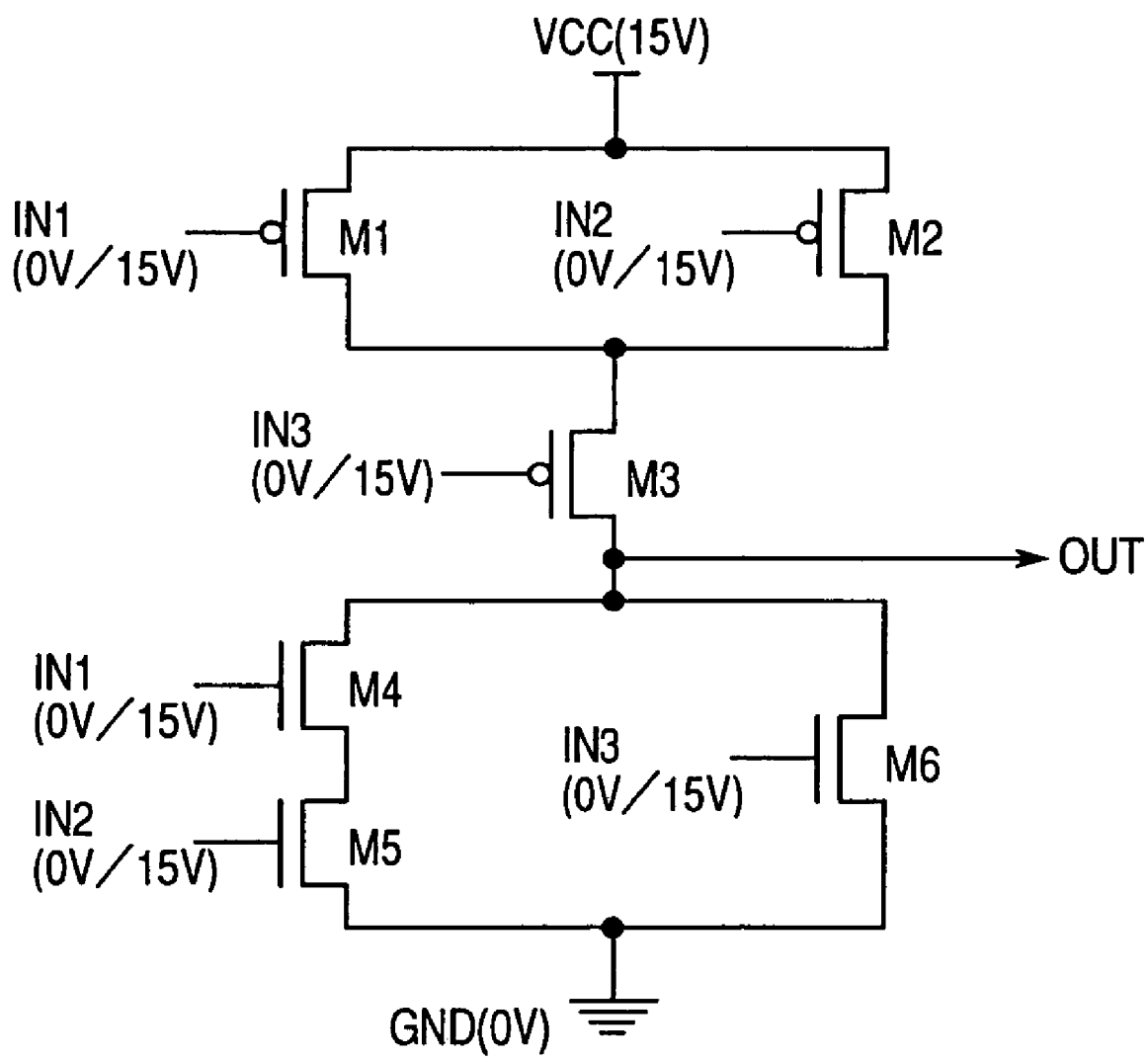
FIG. 81 is a circuit diagram showing the construction of a logical product and non-disjunction circuit of the conventional CMOS circuit.
Figure 82:
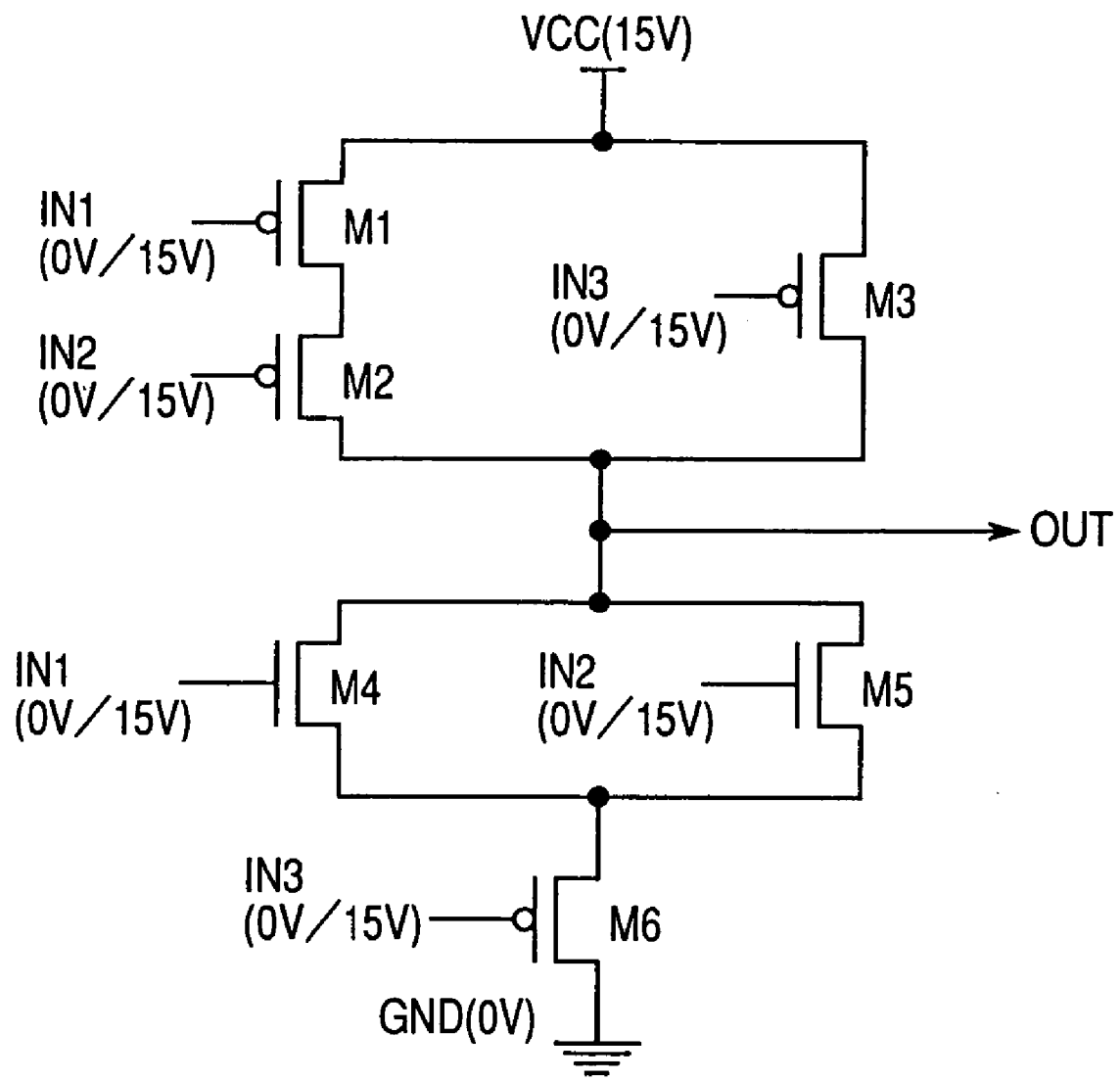
FIG. 82 is a circuit diagram showing the construction of a logical sum and non-conjunction circuit of the conventional CMOS circuit.

The section consisting of the transistors M6, M7, M8, M9, M10, and M61 has the same construction as that of the section consisting of n-type transistors of the conventional AND-NOR circuit shown in FIG. 81 (or the section consisting of p-type transistors of the conventional OR-NAND circuit shown in FIG. 82). The section consisting of the transistors M3, M4, M5, M62, M63, and M64 has the same construction as that of the section consisting of p-type transistors of the conventional AND-NOR circuit shown in FIG. 81 (or the section consisting of n-type transistors of the conventional OR-NAND circuit shown in FIG. 82).

SIXTH EMBODIMENT

Another embodiment of the logical circuit of the present invention will be described below with reference to drawings. FIGS. 65, 66, 67, and 68 are circuit diagrams showing modifications of the NAND circuit shown in FIG. 58. FIGS. 69, 70, 71, and 72 are circuit diagrams showing modifications of the NAND circuit shown in FIG. 61.

Figure 65:
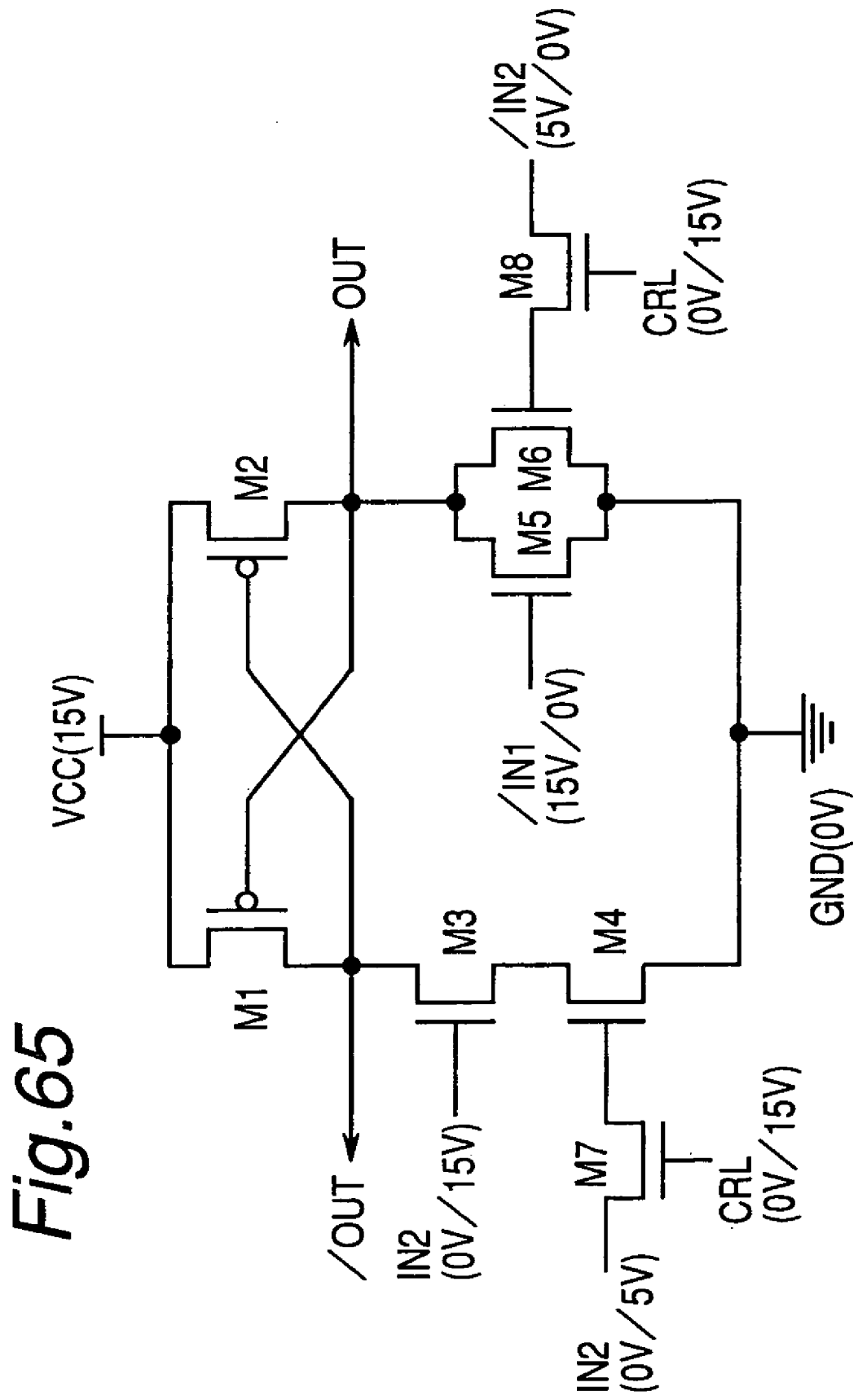
FIG. 65 is a circuit diagram showing an example of a modification of the logical circuit of the present invention.

The circuit of FIG. 65 is so constructed that the input signals IN2 and /IN2 shown in FIG. 58 are inputted to the transistors M4 and M6 through transfer transistors M7 and M8, respectively.

A control signal CRL is inputted to the gate electrode of each of the transfer transistors M7 and M8. A load to be applied to a signal line of each of the input signals IN2 and /IN2 can be reduced by turning on (connecting) the transfer transistors in a necessary time period (time period in which output may be switched). For example, in the case where the pulse width of the input signal IN2 is smaller than that of the input signal IN1 (the case where the pulse of the input signal IN2 is included in the pulse of the input signal IN1), the input signal IN1 can be used as the control signal CRL. This applies to the construction of each of FIGS. 66 and 67.

Figure 66:
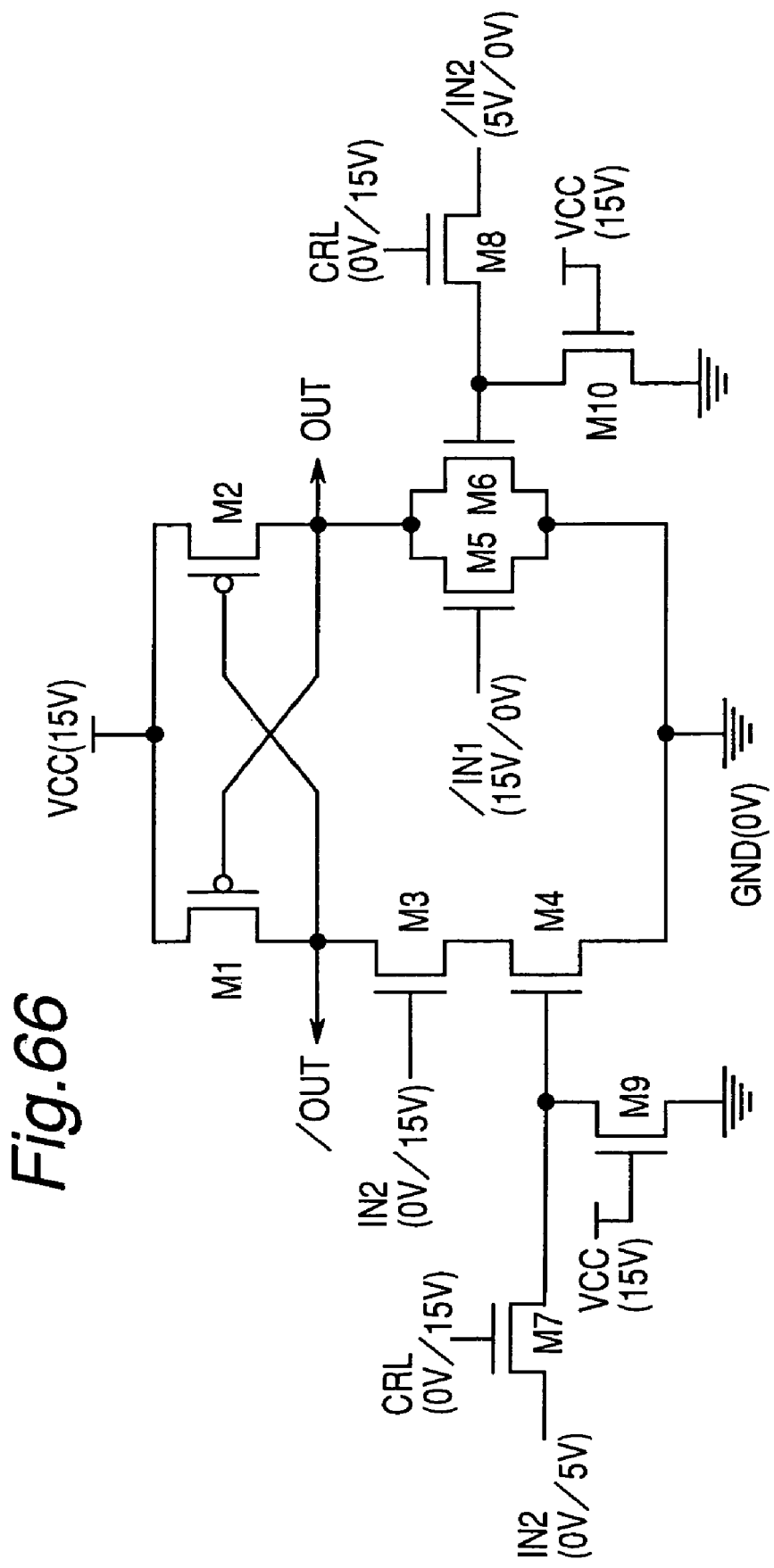
FIG. 66 is a circuit diagram showing another example of a modification of the logical circuit of the present invention.

Referring to FIG. 66, in addition to the construction of FIG. 65, a grounding transistor M9 is provided between the transistor M4 to which the input signal IN2 is inputted and the transfer transistor M7, and a grounding transistor M10 is provided between the transistor M6 to which the input signal /IN2 is inputted and the transfer transistor M8.

The grounding transistors M9 and M10 serve as a malfunction prevention means for preventing the transfer transistors M7 and M8 from malfunctioning in an electric floating state when the transfer transistors M7 and M8 are placed in a disconnection state. The grounding transistors M9 and M10 are always in connection with the ground potential. Thus, it is necessary to set the drive force of the grounding transistors M9 and M10 low to allow the input signals IN2 and /IN2 to have preference over the control signal CRL when the control signal CRL is active. In the construction shown in FIG. 66, the grounding transistors M9 and M10 serving as a malfunction prevention means may be replaced with a resistance.

Figure 67:
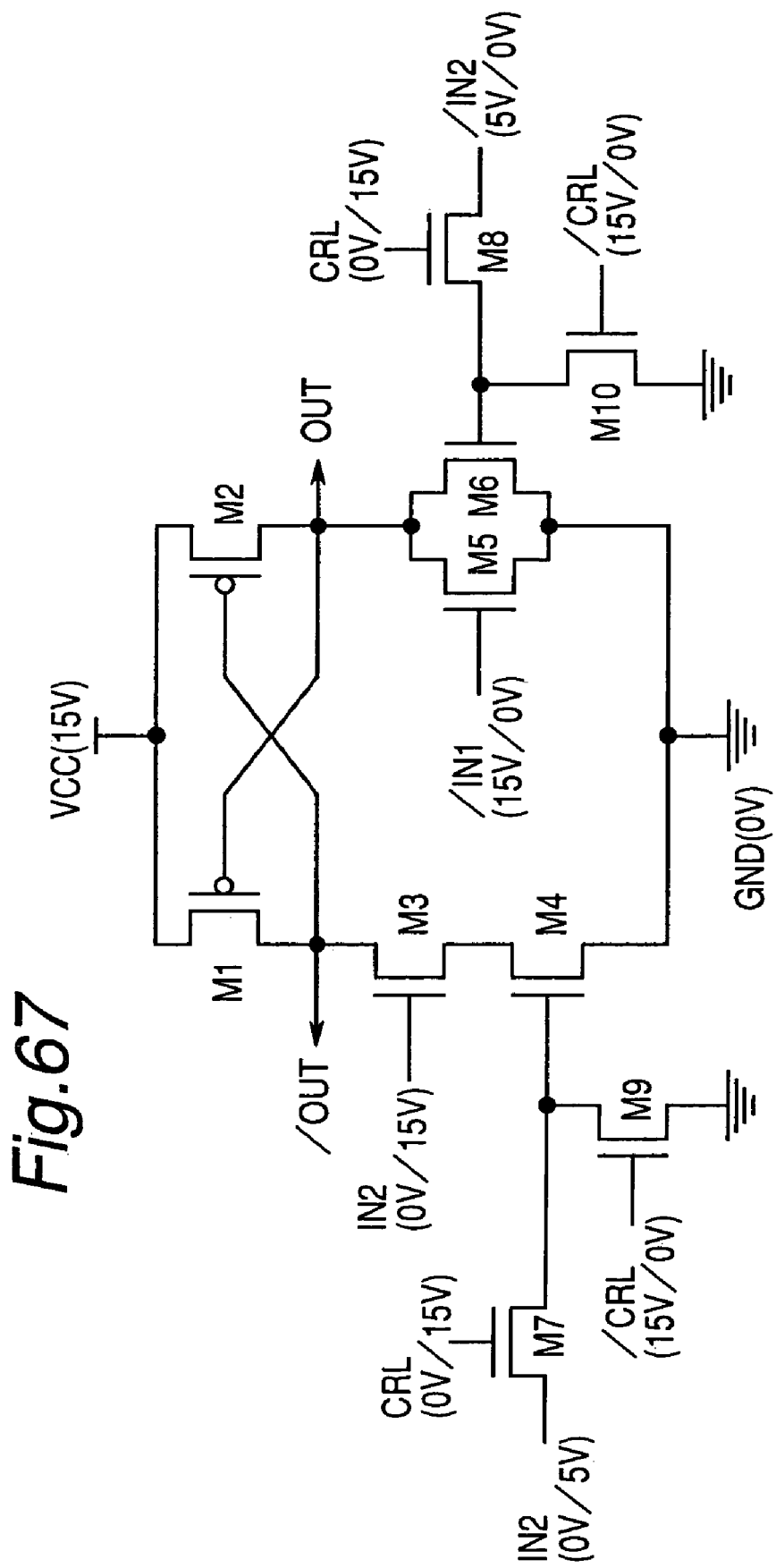
FIG. 67 is a circuit diagram showing another example of a modification of the logical circuit of the present invention.

Referring to FIG. 67, in addition to the construction of FIG. 65, the grounding transistor M9 is provided between the transistor M4 to which the input signal IN2 is inputted and the transfer transistor M7, and the grounding transistor M10 is provided between the transistor M6 to which the input signal /IN2 is inputted and the transfer transistor M8. A signal /CRL inverse to the control signal to be inputted to the transfer transistor is inputted to the gate electrode of each of the grounding transistors M9 and M10.

As in the case of construction of FIG. 66, the grounding transistors M9 and M10 serve as a malfunction prevention means for preventing the transfer transistors M7 and M8 from malfunctioning in an electric floating state when the transfer transistors M7 and M8 are placed in a disconnection state. At this time, the grounding transistors M9 and M10 are connected to the ground potential only when the transfer transistors M7 and M8 are placed in a disconnection state. Thus, the grounding transistors M9 and M10 do not cause the electric potential of the signal-input portion to drop, irrespective of the magnitude of the drive force of the grounding transistors M9 and M10.

Figure 68:
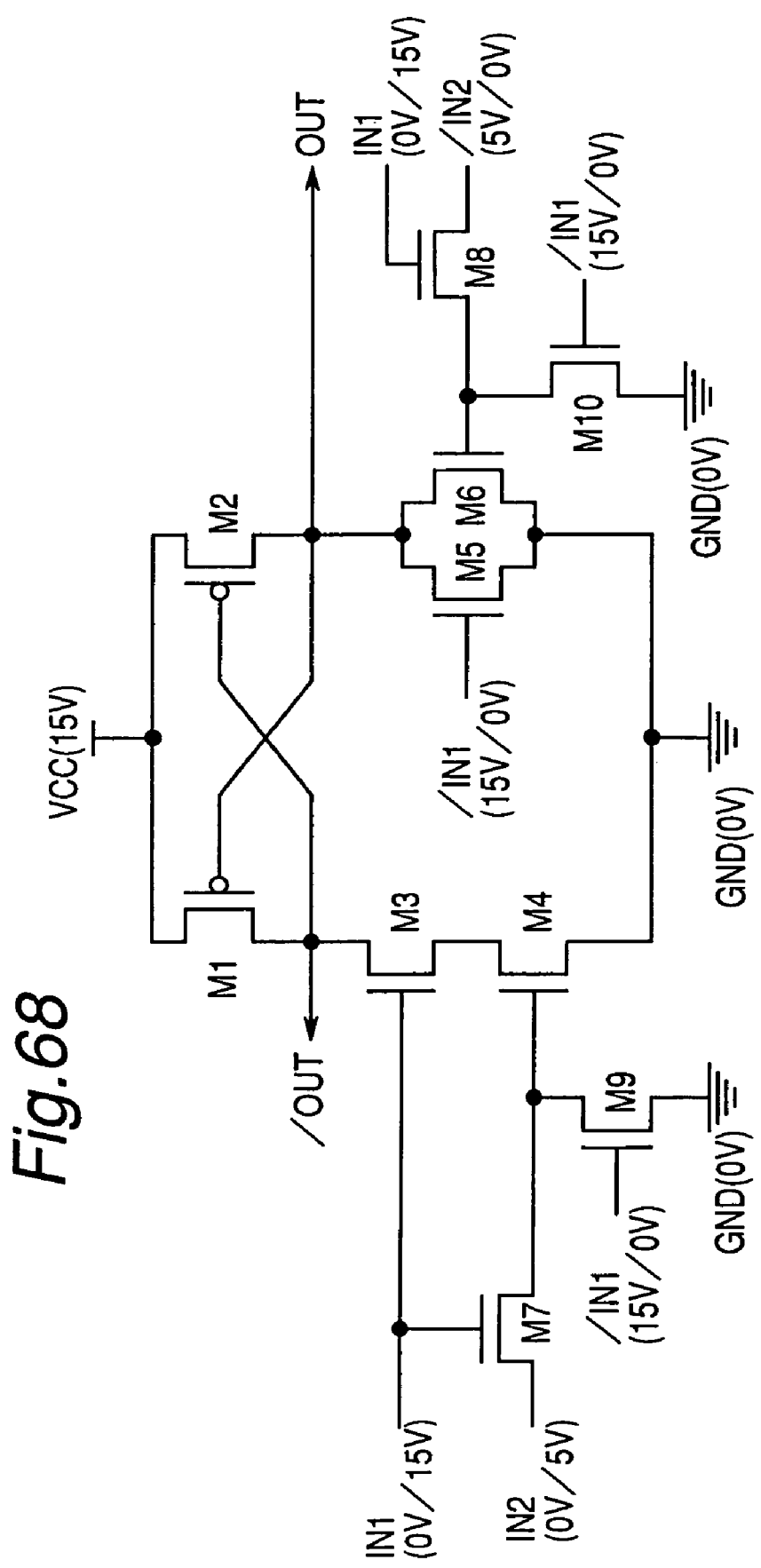
FIG. 68 is a circuit diagram showing another example of a modification of the logical circuit of the present invention.
Figure 69:
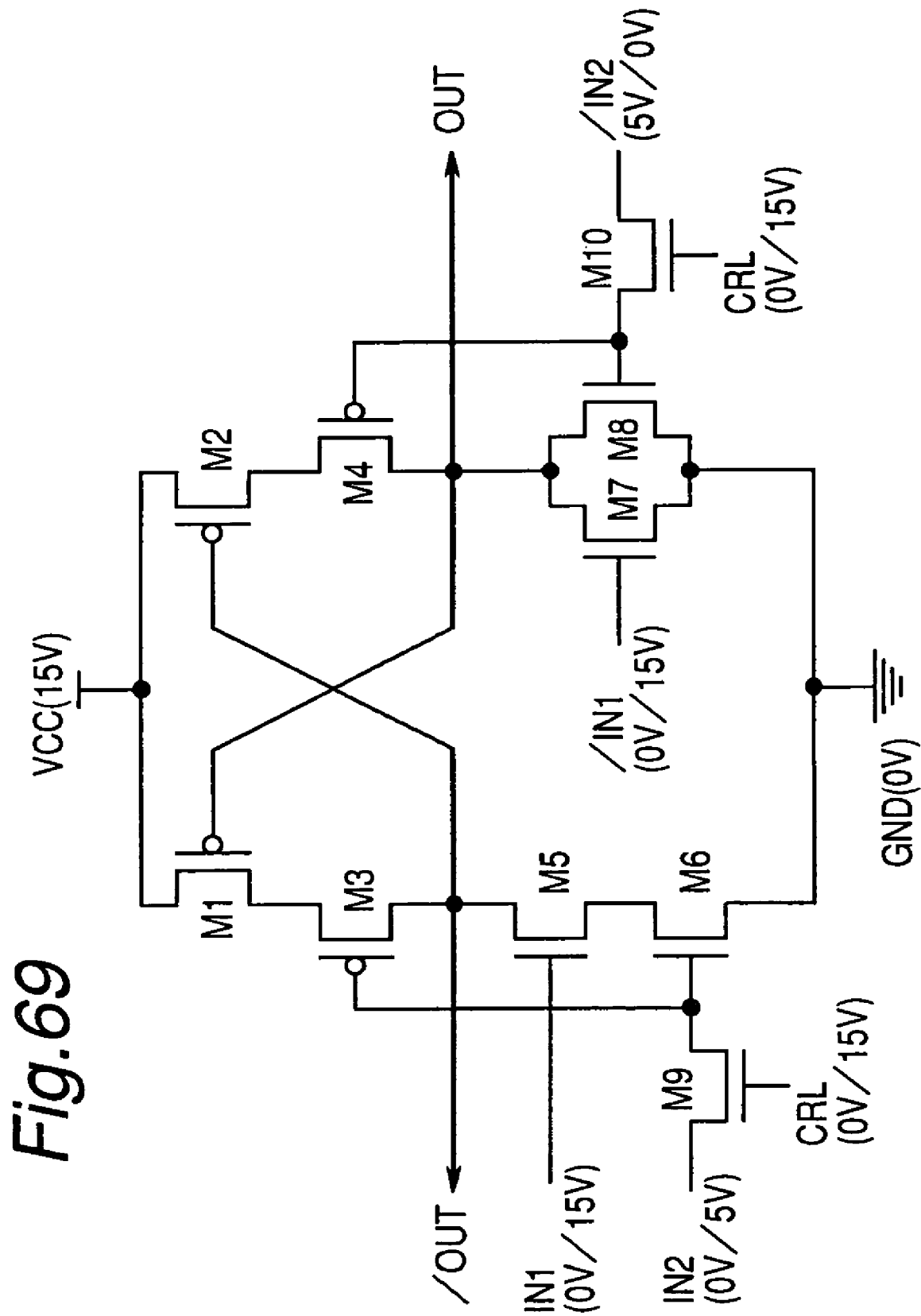
FIG. 69 is a circuit diagram showing another example of a modification of the logical circuit of the present invention.
Figure 70:
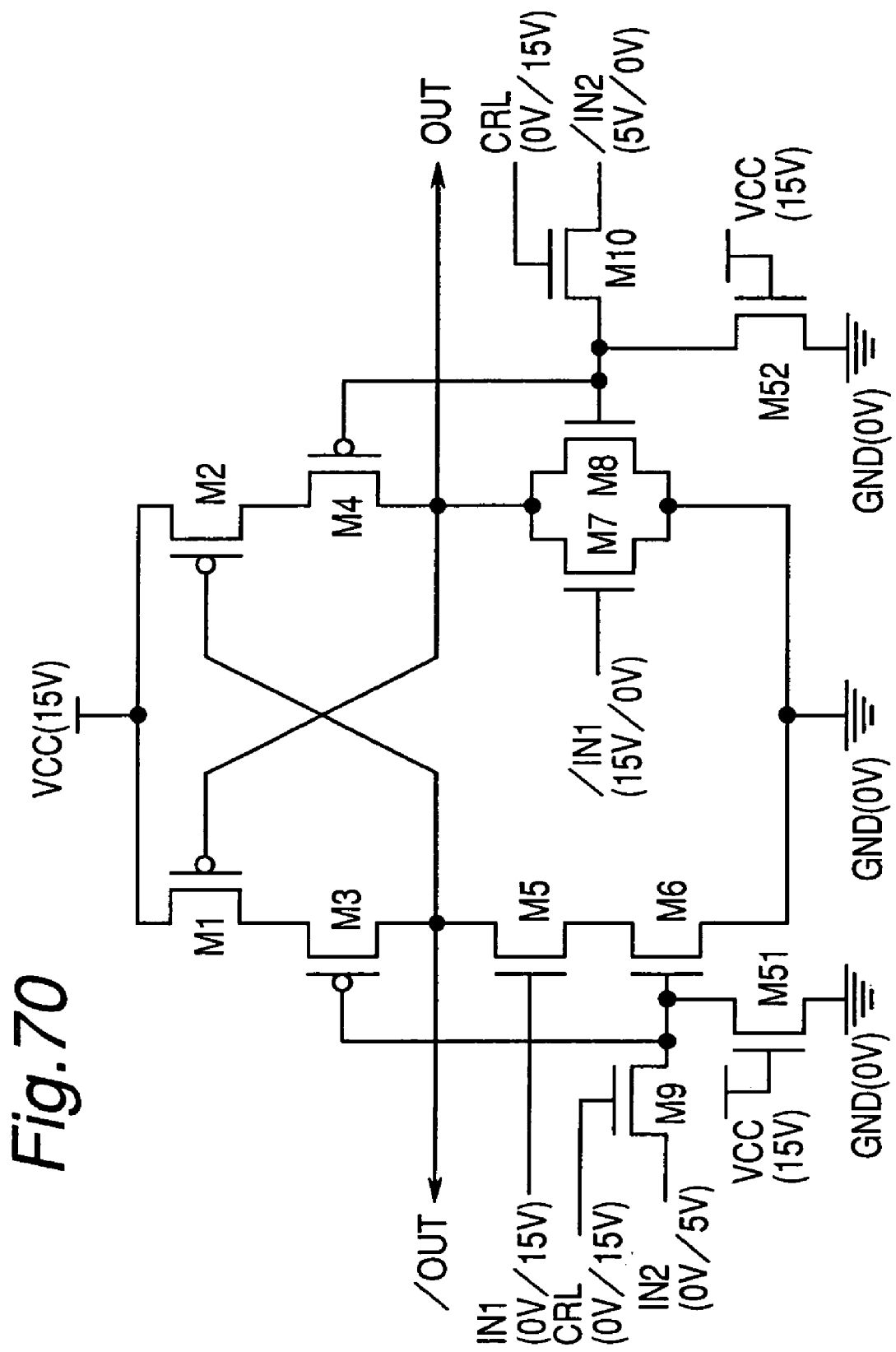
FIG. 70 is a circuit diagram showing another example of a modification of the logical circuit of the present invention.
Figure 71:
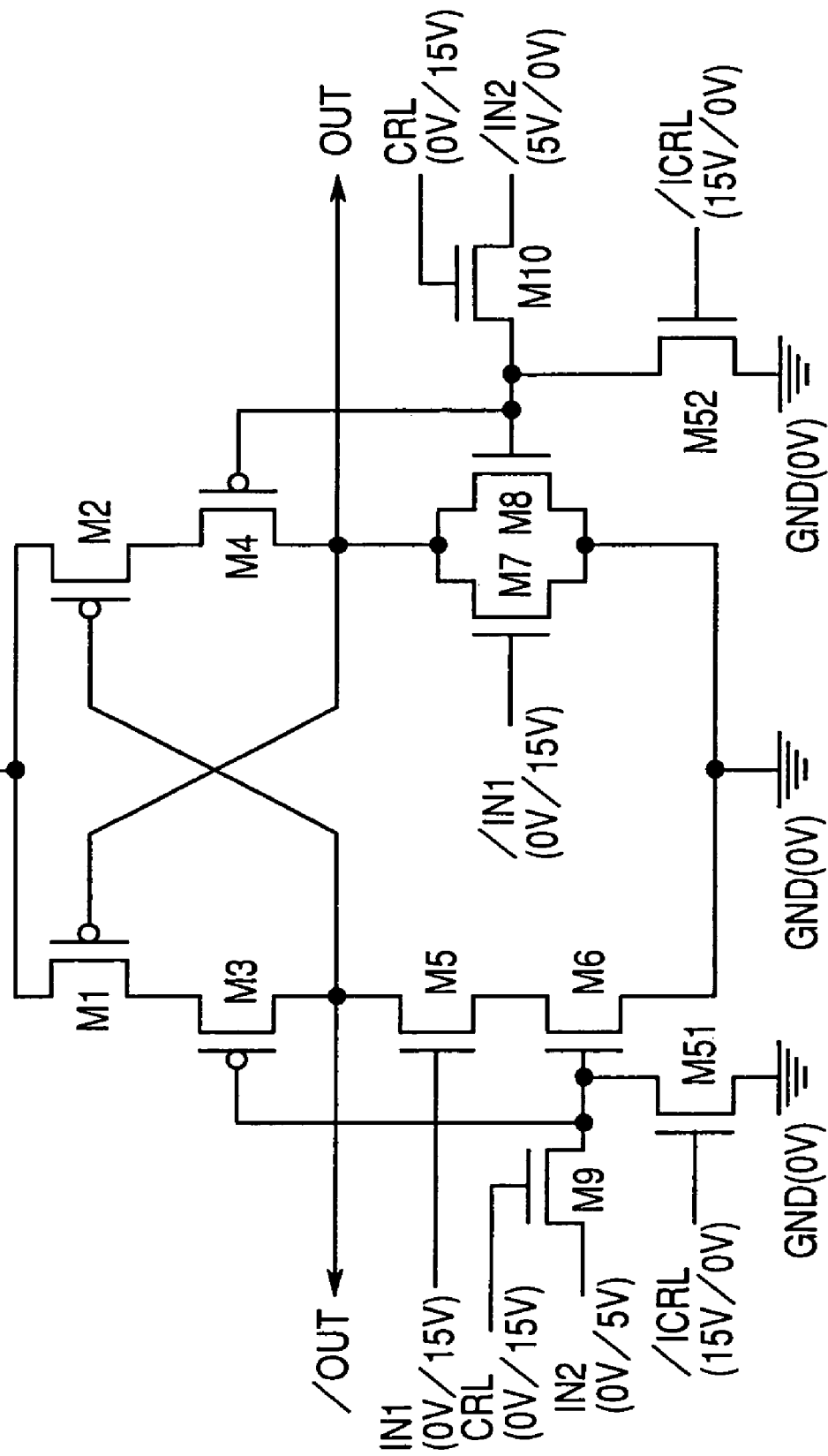
FIG. 71 is a circuit diagram showing another example of a modification of the logical circuit of the present invention.
Figure 72:
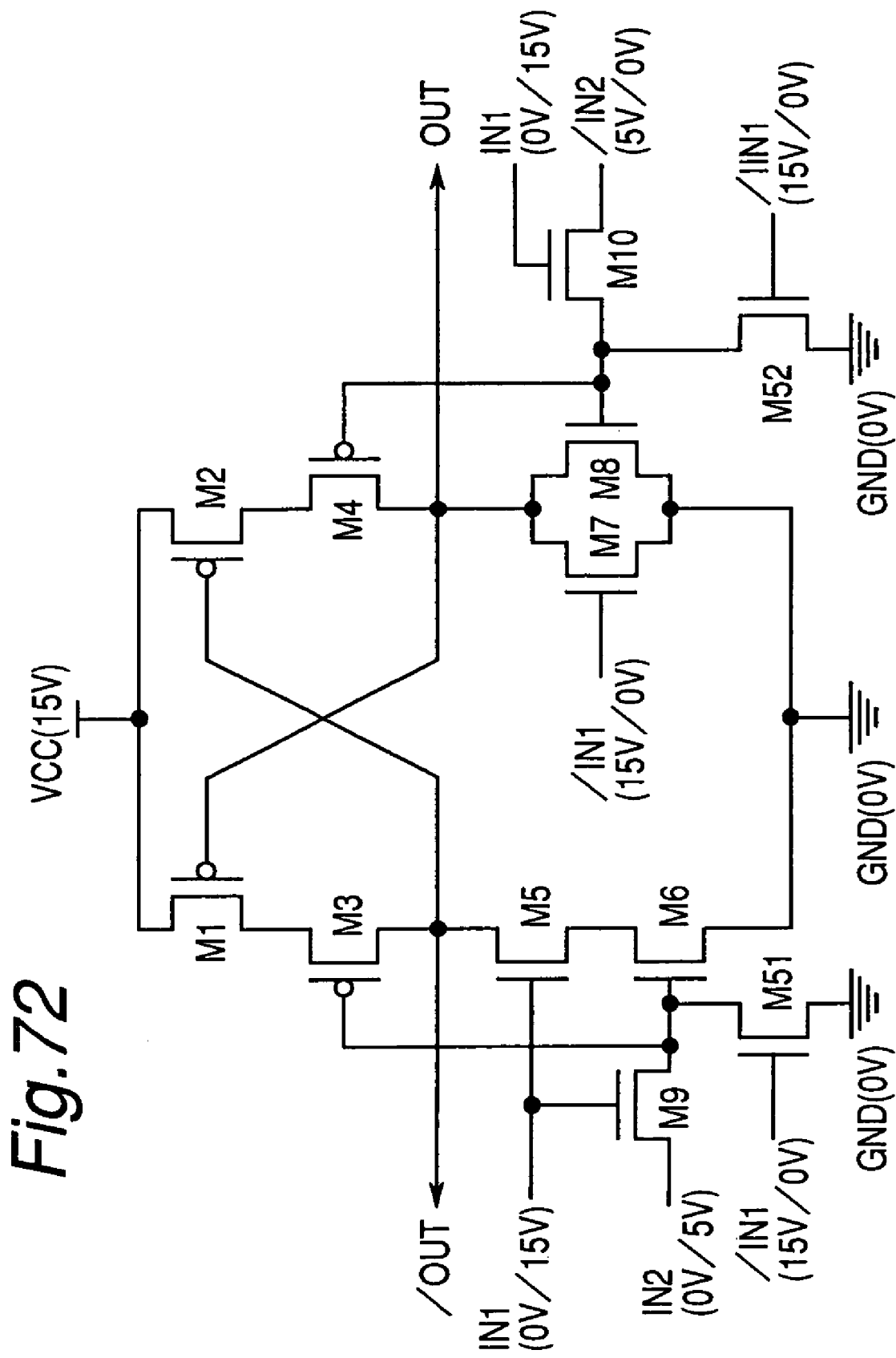
FIG. 72 is a circuit diagram showing another example of a modification of the logical circuit of the present invention.

In the construction of FIG. 68, the signal IN1 to be inputted to the transistor M3 shown in FIG. 67 is inputted to the gate electrode of the transfer transistor M7.

The number of terminals can be reduced by using one of the input signals as the control signal of the transfer transistor.

In the description-omitted constructions which are shown in FIGS. 69, 70, 71, and 72, the transfer transistors are denoted by M9 and M10, and the grounding transistors are denoted by M51 and M52. The constructions shown in FIGS. 69, 70, 71, and 72 have operations and effects similar to those of the constructions shown in FIGS. 65, 66, 67, and 68.

SEVENTH EMBODIMENT

Figure 73:
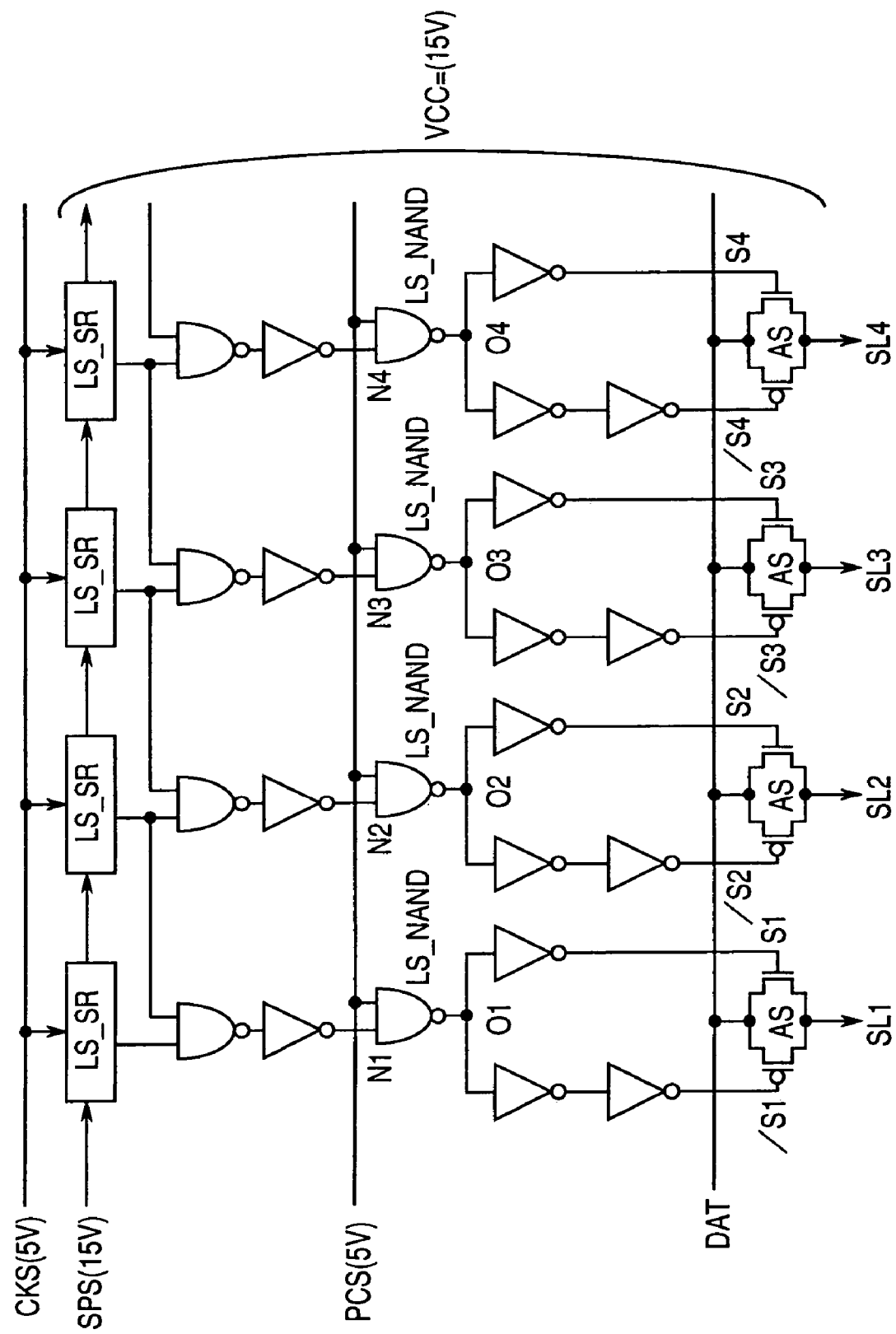
FIG. 73 shows an example of the construction of a data signal line drive circuit of the image display device of the present invention.
Figure 74:
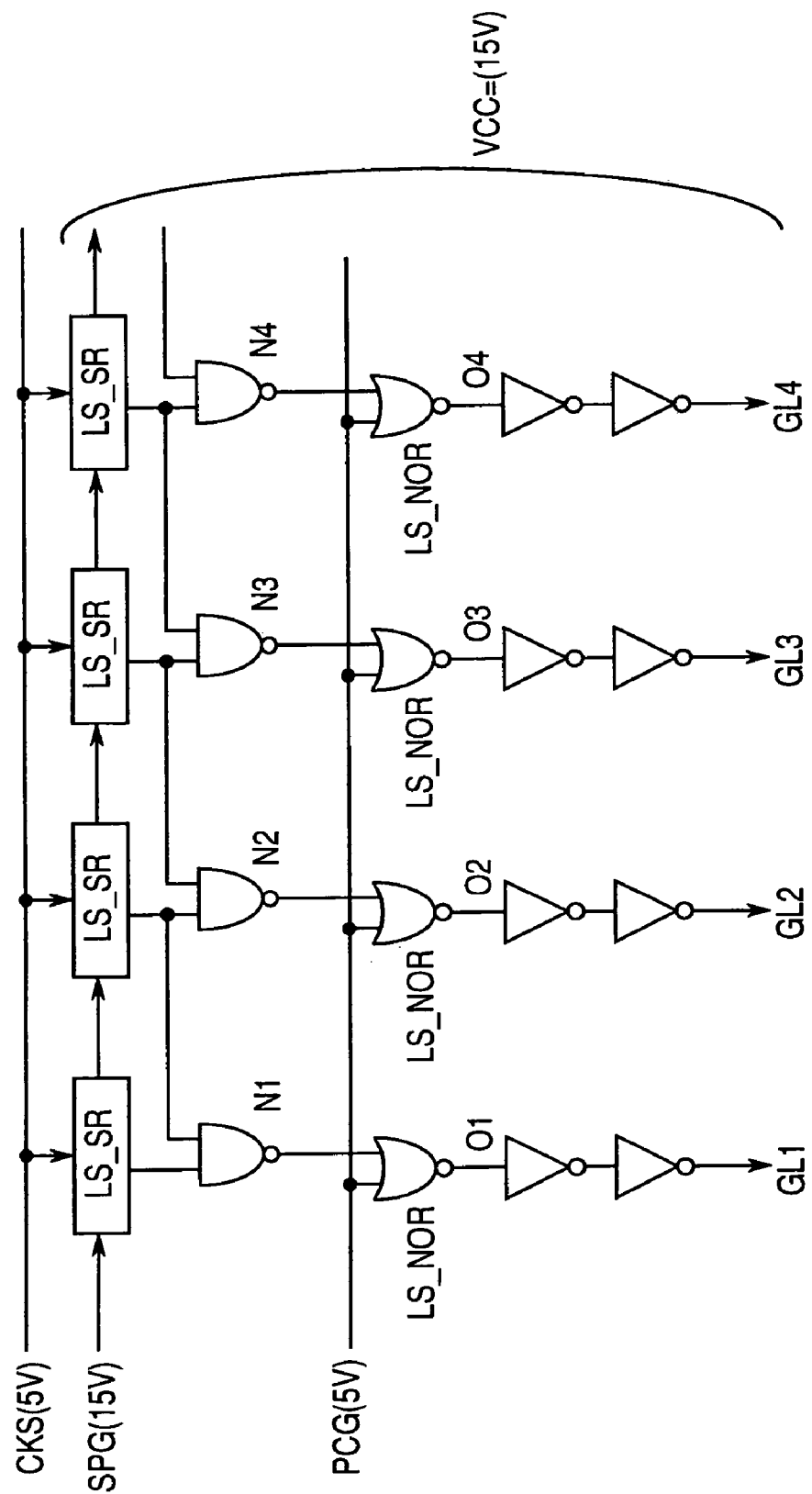
FIG. 74 shows an example of the construction of a scanning signal line drive circuit of the image display device of the present invention.

An embodiment of the image display device of the present invention will be described below with reference to drawings. FIGS. 73 and 74 show an example of the construction of the image display device according to the present invention.

Figure 38:
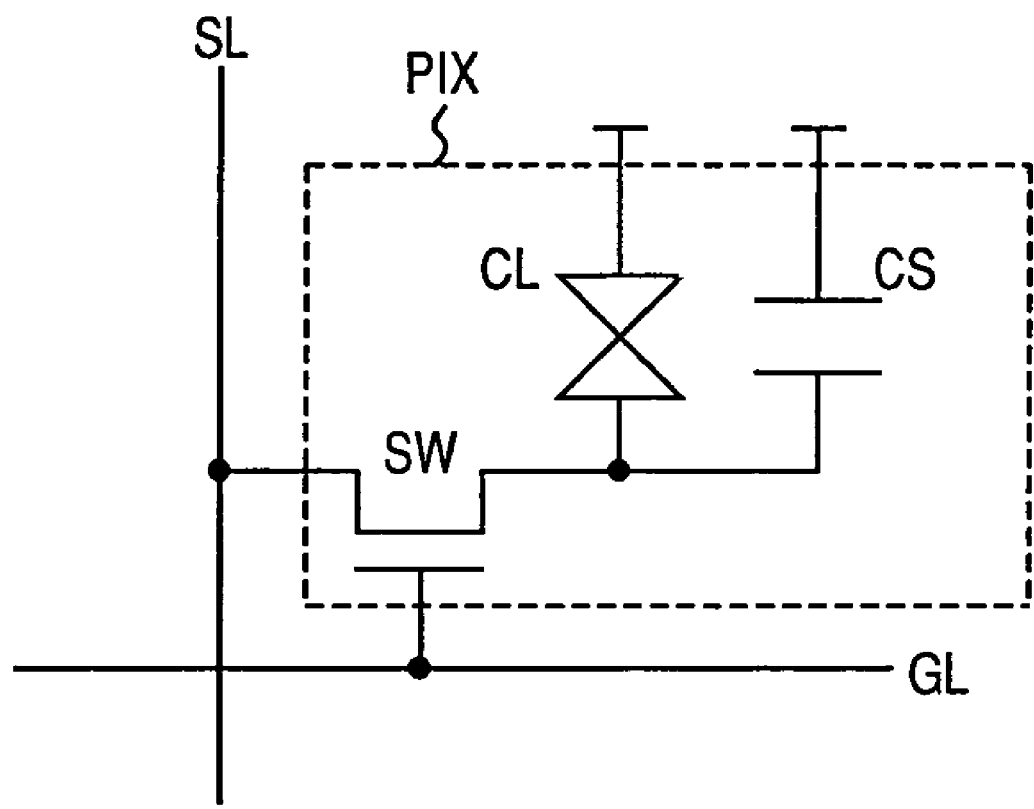
FIG. 38 is a diagram showing the detail of the pixel of FIG. 37.

The construction shown in FIG. 73 is the same as that of the conventional image display device. The image display device is an active matrix type liquid crystal display device having a pixel array ARY consisting of pixels PIX arranged in the shape of a matrix, a scanning signal line drive circuit (gate driver) GD, and a data signal line drive circuit (data driver) SD. The scanning signal line drive circuit (gate driver) GD and/or the data signal line drive circuit (data driver) SD has the logical circuit described above. An example of the construction of the pixel PIX is as shown in FIG. 38.

In the liquid crystal image display device, a comparatively high drive voltage of 10-20 V is necessary to drive a liquid crystal element. Therefore, normally, the drive circuit is driven by a voltage of 10-20 V, whereas a signal to be inputted to the image display device is normally 3.3-5 V because it is generated by an IC. Accordingly, a voltage conversion circuit (level shift circuit) should be provided between the liquid crystal display device and the drive circuit. According to the present invention, as described above, the logical circuit provided in the drive circuit has a level shift function. Thus, it is possible to achieve a preferable image display without providing the liquid crystal display device with the level shift circuit.

Figure 75:
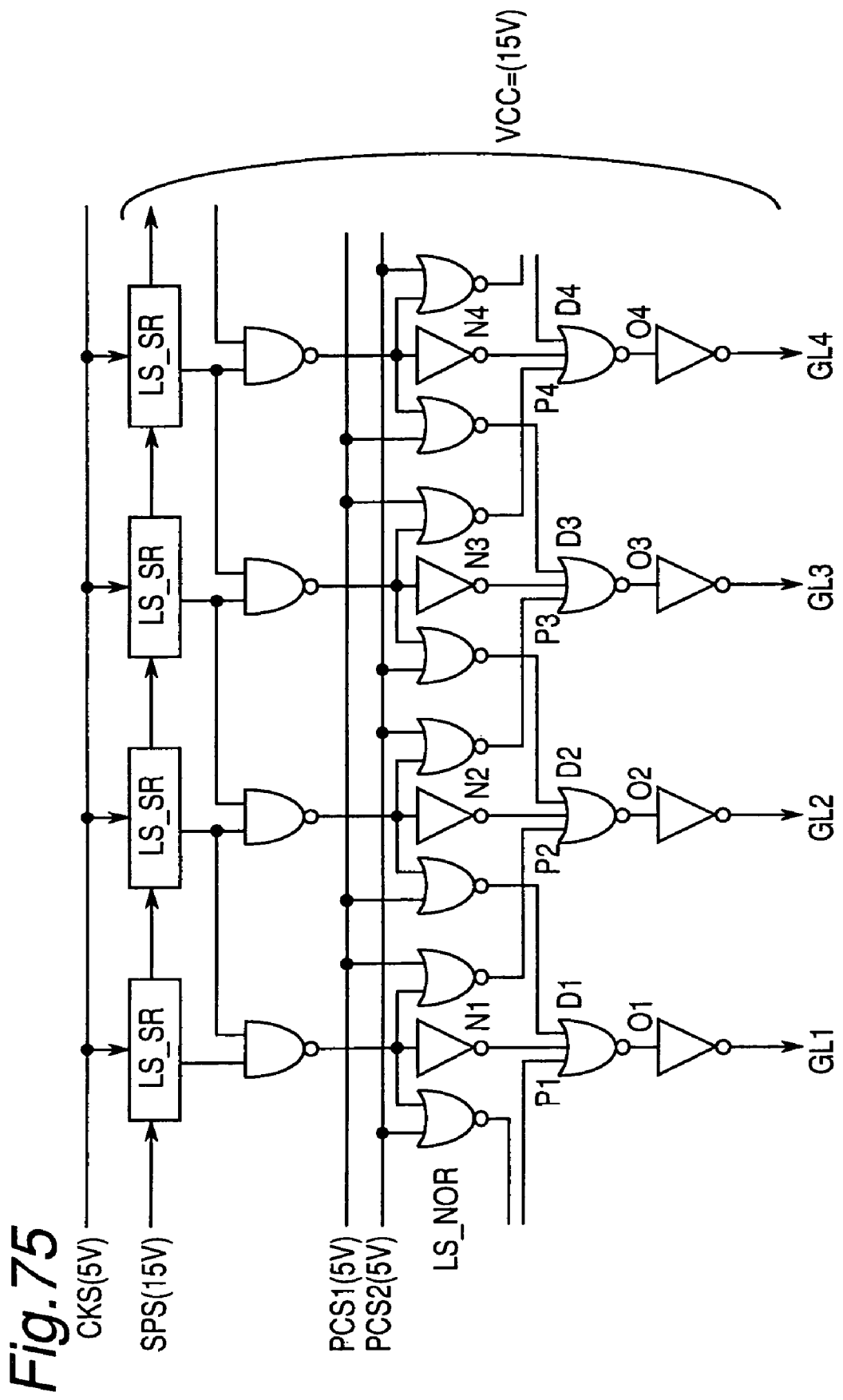
FIG. 75 shows another example of the construction of the scanning signal line drive circuit of the image display device of the present invention.

FIG. 73 is a circuit diagram showing the data signal line drive circuit for use in the image display device of the present invention. FIGS. 74 and 75 are circuit diagrams showing the scanning signal line drive circuit for use in the image display device of the present invention.

In the construction of the data signal line drive circuit shown in FIG. 73, the data signal line drive circuit is driven by a supply voltage of 15 V, however, the amplitude of an input signal PCS is 5 V. This can be achieved by using the logical circuit of the present invention for a non-conjunction circuit LS_NAND to which the input signal PCS is inputted.

Figure 76:
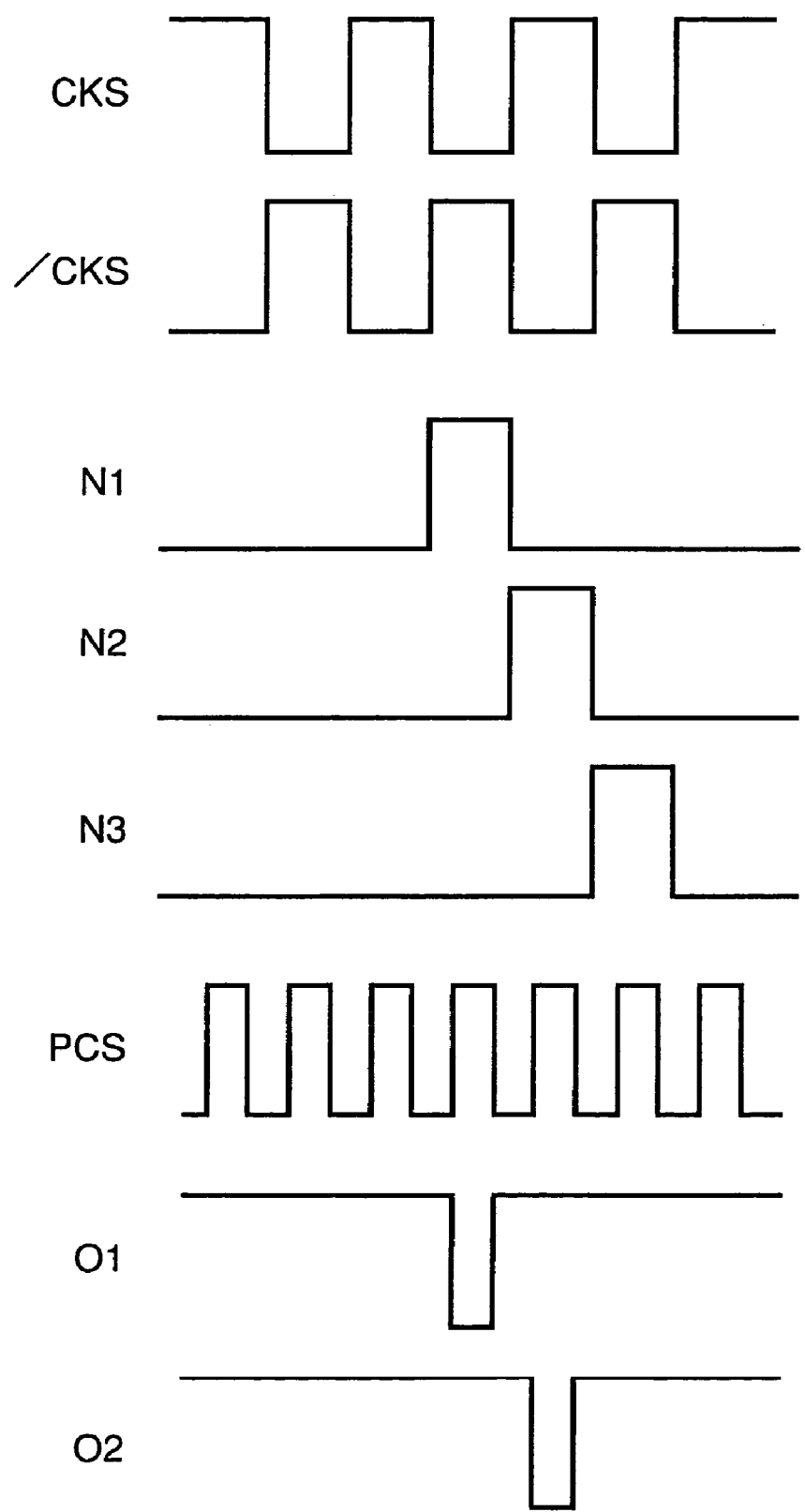
FIG. 76 shows an example of the signal waveform of the data signal line drive circuit of the image display device of the present invention.

FIG. 76 shows waveforms of signals of the data signal line drive circuit. Owing to the operation of the data signal line drive circuit, it is possible to generate a signal O having a pulse width smaller than that of an output signal N of a shift register circuit.

The amplitude of a clock signal CKS is also 5 V, which can be achieved by using a shift register circuit constructed of a latch circuit shown in FIG. 5. The amplitude of a start signal SPS is 15 V that can be raised from 5 V by using the conventional level shifter circuit shown in FIGS. 48 and 49. In combination of these circuits, it is possible to allow all input signals to the data signal line drive circuit that is driven by a voltage of 15V to have an amplitude of 5 V.

In the construction of the scanning signal line drive circuit shown in FIG. 74, the scanning signal line drive circuit is driven by a supply voltage of 15 V, and the amplitude of an input signal PCG is 5 V. This can be achieved by using the logical circuit of the present invention for a non-disjunction circuit LS_NOR to which the input signal PCG is inputted.

Figure 77:
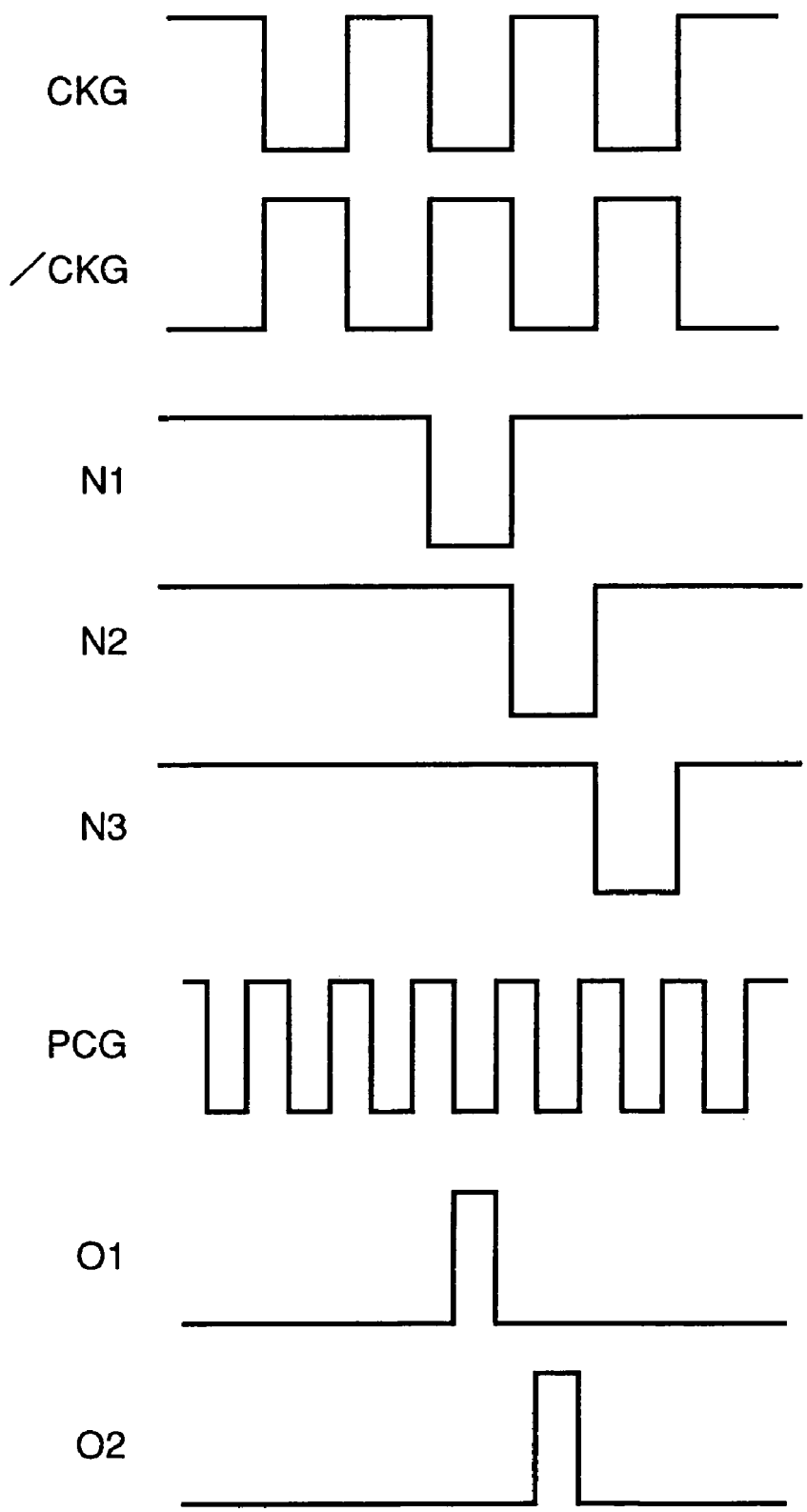
FIG. 77 shows an example of the signal waveform of the scanning signal line drive circuit of the image display device of the present invention.

FIG. 77 shows waveforms of signals of the scanning signal line drive circuit. Owing to the operation of the scanning signal line drive circuit, it is possible to generate a signal O having a pulse width smaller than that of an output signal N of the shift register circuit.

The amplitude of a clock signal CKG is 5 V, which can be achieved by using the shift register circuit constructed of the latch circuit shown in FIG. 5. The amplitude of a start signal SPG is 15 V that can be raised from 5 V by using the conventional level shifter circuit shown in FIGS. 48 and 49. In combination of these circuits, it is possible to allow all input signals to the scanning signal line drive circuit that is driven by a voltage of 15V to have an amplitude of 5 V.

In the construction of the scanning signal line drive circuit shown in FIG. 75, the scanning signal line drive circuit is driven by a supply voltage of 15 V, and the amplitude of each of input signals FR1 and FR2 is 5 V. This can be achieved by using the logical circuit of the present invention for a non-disjunction circuit LS_NOR to which the input signals FR1 and FR2 are inputted.

Figure 78:
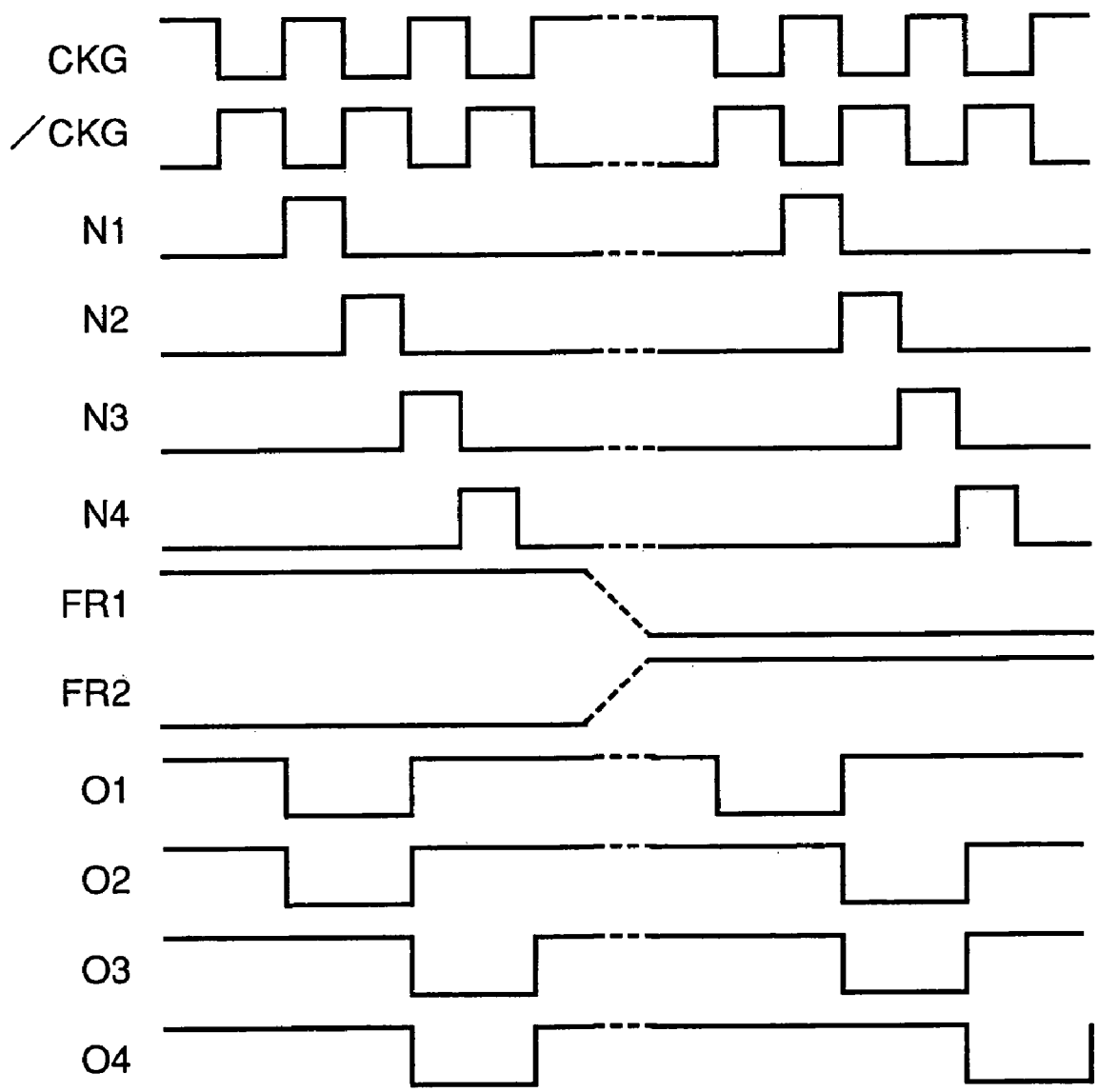
FIG. 78 shows another example of the signal waveform of the scanning signal line drive circuit of the image display device of the present invention.

FIG. 78 shows waveforms of signals of the scanning signal line drive circuit. As shown in FIG. 78, depending on the level of the input signals FR1 and FR2, it is possible to vary the combination of output signals. Therefore, it is possible to achieve a combination-varied scanning of two horizontal lines.

The amplitude of a clock signal CKG is 5 V, which can be achieved by using the shift register circuit constructed of the latch circuit shown in FIG. 5. The amplitude of a start signal SPG is 15 V that can be raised from 5 V by using the conventional level shifter circuit shown in FIGS. 48 and 49. In combination of these circuits, it is possible to allow all input signals to the scanning signal line drive circuit that is driven by a voltage of 15V to have an amplitude of 5 V.

As examples of the logical circuit and the image display device of the present invention, a liquid crystal display device and a logical operation circuit constituting the data signal line drive circuit and the scanning signal line drive circuit are described below. But the present invention is not limited thereto and also effective for other types of image display devices and other types of logical operation circuits.

EIGHTH EMBODIMENT

An embodiment of the image display device of the present invention has already been will be described with reference to FIGS. 34-36K. Therefore, the description about the embodiment is omitted here.

Description has been made on the embodiments of the logical circuit of the present invention and the image display device to which the logical circuit is applied. The logical circuit of the present invention can hold in the case where the polarity of each of the transistor, the power source, and the signal constituting the logical circuit is inverted in all the embodiments. Thus, it is possible to obtain effects similar to those shown in the embodiments. Further, there is no limitation in the number of input signals to the logical circuit. Needless to say, the present invention is not limited to the embodiments and can be varied unless variations depart from the gist of the present invention and the operation and effect thereof are not lost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A CMOS logical circuit for use in a liquid crystal display device, the CMOS logical circuit synchronizing a pulse signal for latching image data with a clock signal, the CMOS logical circuit comprising:
    a first input terminal into which the pulse signal is inputted, the pulse signal being inputted from the first input terminal to a gate electrode of a first transistor;
    a second input terminal into which the clock signal is inputted, the clock signal being inputted from the second input terminal to a gate electrode of a second transistor; and
    an output terminal from which a synchronized pulse signal is outputted, wherein the clock signal has an amplitude smaller than an amplitude of the synchronized pulse signal of the CMOS logical circuit to reduce power consumption.

2. A logical circuit as claimed in claim 1 comprising two electric current paths each of which has a circuit consisting of at least one n-type transistor and a circuit consisting of at least one p-type transistor, wherein
    the one electric current path is provided with a circuit having the same construction as that of a circuit having an n-type transistor of a CMOS logical circuit outputting a logical operation result similar to that of the logical circuit, and
    the other electric current path is provided with a circuit having the same construction as that of a circuit having a p-type transistor of the CMOS logical circuit outputting the logical operation result similar to that of the logical circuit, and
    a gate electrode of the transistor provided on the one electric current path and that of the transistor provided on the other electric current path are connected to drain electrodes of the counterparts.

3. A logical circuit as claimed in claim 1 comprising two electric current paths each of which has a circuit consisting of at least one n-type transistor and a circuit consisting of at least one p-type transistor, wherein
    the one electric current path is provided with a circuit having the same construction as that of a circuit having an n-type transistor of a CMOS logical circuit outputting a logical operation result similar to that of the logical circuit, and
    the other electric current path is provided with a circuit having the same construction as that of a circuit having a p-type transistor of the CMOS logical circuit outputting the logical operation result similar to that of the logical circuit, and
    each of the two electric current paths is provided with a transistor to which at least one of the input signals is inputted to a gate electrode and a transistor at a power source side of each thereof such that a gate electrode of the transistor provided on the one electric current path is connected to an output portion of the other electric current path, and a gate electrode of the transistor provided on the other electric current path is connected to an output portion of the one electric current path.

4. A logical circuit as claimed in claim 3, wherein in the n-type circuit or the p-type circuit, a signal having a smaller amplitude than a plurality of the signals is inputted to one transistor positioned farther from the output portion than the other transistor that is connected in series with the one transistor.

5. A logical circuit as claimed in claim 1 comprising two electric current paths each of which has a circuit consisting of at least one n-type transistor and a circuit consisting of at least one p-type transistor, wherein the one electric current path is provided with a circuit having the same construction as that of a circuit having an n-type transistor of a CMOS logical circuit outputting a logical operation result similar to that of the logical circuit, and the other electric current path is provided with a circuit having the same construction as that of a circuit having a p-type transistor of the CMOS logical circuit outputting the logical operation result similar to that of the logical circuit, and the one electric current path is provided with the circuit having the same construction as that of the circuit having the p-type transistor of the CMOS logical circuit outputting the logical operation result similar to that of the logical circuit, the other electric current path is provided with the circuit having the same construction as that of the circuit having the n-type transistor of the CMOS logical circuit outputting the logical operation result similar to that of the logical circuit, each of the two electric current paths is provided with a transistor at a power source side thereof such that a gate electrode of the transistor provided on the one electric current path is connected to an output portion of the other electric current path, and a gate electrode of the transistor provided on the other electric current path is connected to an output portion of the one electric current path.

6. A logical circuit as claimed in claim 1 comprising:

first and second transistors having source electrodes connected to a first electrode potential and gate electrodes connected to drain electrodes of the counterparts and connected to a first output terminal and a second output terminal, respectively, a third transistor having a gate electrode connected to a first input terminal and a drain electrode connected to the second output terminal;

a fourth transistor having a gate electrode connected to a second input terminal, a drain electrode connected to a source electrode of the third transistor, and a source electrode connected to a second supply potential;

a fifth transistor having a gate electrode connected to a third input terminal, a drain electrode connected to the first output terminal, and a source electrode connected to the second supply potential; and a sixth transistor having a gate electrode connected to a fourth input terminal, a drain electrode connected to the first output terminal, and a source electrode connected to the second supply potential;

wherein signals to be inputted to the first and third input terminals are inverse to each other in phase, and signals to be inputted to the second and fourth input terminals are inverse to each other in phase, and the first and second transistors are of a channel type different from that of the other transistors.

7. A logical circuit as claimed in claim 1 comprising:

first and second transistors having source electrodes connected to a first electrode potential and gate electrodes connected to drain electrodes of the counterparts and connected to a first output terminal and a second output terminal, respectively, a third transistor having a gate electrode connected to a first input terminal and a drain electrode connected to the second output terminal;

a fourth transistor having a gate electrode connected to a second input terminal, a drain electrode connected to a source electrode of the third transistor, and a source electrode connected to a second supply potential;

a fifth transistor having a gate electrode connected to a third input terminal, a drain electrode connected to the second output terminal, and a source electrode connected to the second supply potential;

a sixth transistor having a gate electrode connected to a fourth input terminal and a source electrode connected to the second supply potential;

a seventh transistor having a gate electrode connected to a fifth input terminal and a source electrode connected to the second supply potential; and an eighth transistor having a gate electrode connected to a sixth input terminal, a drain electrode connected to the first output terminal, and a source electrode connected to the drain electrode of the sixth transistor and that of the seventh transistor, wherein signals to be inputted to the first and fourth input terminals are inverse to each other in phase, signals to be inputted to the second and fifth input terminals are inverse to each other in phase, and signals to be inputted to the third and sixth input terminals are inverse to each other in phase, and the first and second transistors are of a channel type different from that of the other transistors.

8. A logical circuit as claimed in claim 1 comprising:

first and second transistors having source electrodes connected to a first electrode potential and gate electrodes connected to drain electrodes of the counterparts and connected to a first output terminal and a second output terminal, respectively, a third transistor having a gate electrode connected to a first input terminal and a drain electrode connected to the second output terminal;

a fourth transistor having a gate electrode connected to a second input terminal, a drain electrode connected to a source electrode of the third transistor, and a source electrode connected to a second supply potential;

a fifth transistor having a gate electrode connected to a third input terminal, a drain electrode connected to the second output terminal, and a source electrode connected to the second supply potential; and a sixth transistor having a gate electrode connected to a fourth input terminal and a drain electrode connected to the first output terminal;

a seventh transistor having a gate electrode connected to a fifth input terminal and a drain electrode connected to the first output terminal; and an eighth transistor having a gate electrode connected to a sixth input terminal, a drain electrode connected to a source electrode of the sixth transistor and that of the seventh transistor, and a source electrode connected to the second supply potential, wherein signals to be inputted to the first and fifth input terminals are inverse to each other in phase, signals to be inputted to the second and fourth input terminals are inverse to each other in phase, and signals to be inputted to the third and sixth input terminals are inverse to each other in phase, and the first and second transistors are of a channel type different from that of the other transistors.

9. A logical circuit as claimed in claim 1 comprising:

first and second transistors having source electrodes connected to a first electrode potential and gate electrodes connected to a first output terminal and a second output terminal, respectively, a third transistor having a gate electrode connected to a first input terminal, a source electrode connected to a drain electrode of the first transistor, and a drain electrode connected to the second output terminal;

a fourth transistor having a gate electrode connected to a second input terminal, a source electrode connected to the drain electrode of a second transistor, and a drain electrode connected to the first output terminal;

a fifth transistor having a gate electrode connected to a third input terminal and a drain electrode connected to the second output terminal;

a sixth transistor having a gate electrode connected to the first input terminal, a source electrode connected to the second supply potential, and a drain electrode connected to a source electrode of the fifth transistor;

a seventh transistor having a gate electrode connected to a fourth input terminal, a source electrode connected to the second supply potential, and a drain electrode connected to the first output terminal; and an eighth transistor having a gate electrode connected to the second input terminal, a source electrode connected to the second supply potential, and a drain electrode connected to the first output terminal, wherein signals to be inputted to the first and second input terminals are inverse to each other in phase, signals to be inputted to the third and fourth input terminals are inverse to each other in phase, and the first through fourth transistors are of a channel type different from that of the other transistors.

10. A logical circuit as claimed in claim 1 comprising:

first and second transistors having source electrodes connected to a first electrode potential and gate electrodes connected to a first output terminal and a second output terminal, respectively, a third transistor having a gate electrode connected to a first input terminal, a source electrode connected to a drain electrode of the first transistor, and a drain electrode connected to the second output terminal;

a fourth transistor having a gate electrode connected to a second input terminal, a source electrode connected to the drain electrode of a first transistor, and a drain electrode connected to the second output terminal;

a fifth transistor having a gate electrode connected to a third input terminal, and a source electrode connected to a drain electrode of the second transistor;

a sixth transistor having a gate electrode connected to a fourth input terminal, a source electrode connected to a drain electrode of the fifth transistor, and a drain electrode connected to the first output terminal;

a seventh transistor having a gate electrode connected to a fifth input terminal and a drain electrode connected to the second output terminal;

an eighth transistor having a gate electrode connected to the second input terminal, a source electrode connected to the second supply potential, and a drain electrode connected to a source electrode of the seventh transistor, a ninth transistor having a gate electrode connected to a sixth input terminal, a source electrode connected to the second supply potential, and a drain electrode connected to the first output terminal, and a 10th transistor having a gate electrode connected to the fourth input terminal, a source electrode connected to the second supply potential, and a drain electrode connected to the first output terminal, wherein signals to be inputted to the first and third input terminals are inverse to each other in phase, and signals to be inputted to the second and fourth input terminals are inverse to each other in phase, and the first through sixth transistors are of a channel type different from that of the other transistors.

11. A logical circuit as claimed in claim 1 comprising:

first and second transistors having source electrodes connected to a first electrode potential and gate electrodes connected to a first output terminal and a second output terminal, respectively, a third transistor having a gate electrode connected to a first input terminal, a source electrode connected to a drain electrode of the first transistor, and a drain electrode connected to the second output terminal;

a fourth transistor having a gate electrode connected to a second input terminal, a source electrode connected to a drain electrode of the second transistor, and a drain electrode connected to the first output terminal;

a fifth transistor having a gate electrode connected to a third input terminal, and a drain electrode connected to the second output terminal;

a sixth transistor having a gate electrode connected to the first input terminal, a source electrode connected to a second supply potential, and a drain electrode connected to a source electrode of the fifth transistor;

a seventh transistor having a gate electrode connected to a fourth input terminal, a source electrode connected to the second supply potential, and a drain electrode connected to the second output terminal;

an eighth transistor having a gate electrode connected to a fifth input terminal, and a drain electrode connected to the first output terminal, a ninth transistor having a gate electrode connected to the second input terminal, and a source electrode connected to the second supply potential, and a drain electrode connected to a source electrode of the eighth transistor, and a 10th transistor having a gate electrode connected to a sixth input terminal, a source electrode connected to the second supply potential, and a drain electrode connected to a source electrode of the eighth transistor, wherein signals to be inputted to the first and second input terminals are inverse to each other in phase, signals to be inputted to the third and sixth input terminals are inverse to each other in phase, and signals to be inputted to the fourth and fifth input terminals are inverse to each other in phase, and the first through fourth transistors are of a channel type different from that of the other transistors.

12. A logical circuit as claimed in claim 1 comprising:

first and second transistors having source electrodes connected to a first electrode potential and gate electrodes connected to a first output terminal and a second output terminal, respectively, a third transistor having a gate electrode connected to a first input terminal and a source electrode connected to a drain electrode of the first transistor;

a fourth transistor having a gate electrode connected to a second input terminal, a source electrode connected to a drain electrode of the third transistor, and a drain electrode connected to the second output terminal;

a fifth transistor having a gate electrode connected to a third input terminal, a source electrode connected to a drain electrode of the third transistor, and a drain electrode connected to the second output terminal;

a sixth transistor having a gate electrode connected to a fourth input terminal, a source electrode connected to a drain electrode of the second transistor, and a drain electrode connected to the first output terminal;

a seventh transistor having a gate electrode connected to a fifth input terminal and a source electrode connected to the drain electrode of the second transistor;

an eighth transistor having a gate electrode connected to a sixth input terminal, a source electrode connected to a drain electrode of the seventh transistor, and a drain electrode connected to the first output terminal;

a ninth transistor having a gate electrode connected to a seventh input terminal and a drain electrode connected to the second output terminal;

a 10th transistor having a gate electrode connected to an eighth input terminal, a source electrode connected to the second supply potential, and a drain electrode connected to a source electrode of the ninth transistor, an 11th transistor having a gate electrode connected to a ninth input terminal, a source electrode connected to the second supply potential, and a drain electrode connected to the second output terminal, a 12th transistor having a gate electrode connected to a 10th input terminal and a drain electrode connected to the first output terminal;

a 13th transistor having a gate electrode connected to an 11th input terminal, a source electrode connected to the second supply potential, and a drain electrode connected to a source electrode of the 12th transistor, and a 14th transistor having a gate electrode connected to a 12th input terminal, a source electrode connected to the second supply potential, and a drain electrode connected to the source electrode of the 12th transistor, wherein signals to be inputted to the first and fourth input terminals are inverse to each other in phase, signals to be inputted to the second and sixth input terminals are inverse to each other in phase, and signals to be inputted to the third and fifth input terminals are inverse to each other in phase, and the first through eighth transistors are of a channel type different from that of the other transistors.

13. A logical circuit as claimed in claim 1, wherein at least one of the input signals is inputted through a transfer transistor for controlling an input of the signals.

14. A logical circuit as claimed in claim 13, wherein a malfunction prevention transistor is connectedly provided between a specified supply potential and a gate electrode of a transistor to which a signal controlled by the transfer transistor is inputted, and the gate electrode of the malfunction prevention transistor is connected to a supply potential different from the special supply potential.

15. A logical circuit as claimed in claim 13, wherein a malfunction prevention transistor is connectedly provided between a specified supply potential and a gate electrode of a transistor to which a signal controlled by a transfer transistor is inputted, and a signal having a phase inverse to that of a signal to be inputted to the transfer transistor is inputted to a gate electrode of the malfunction prevention transistor.

16. A logical circuit as claimed in claim 13, wherein any one of the input signals is inputted to a gate electrode of a transfer transistor.

\* \* \* \* \*